United States Patent
Nishi et al.

[11] Patent Number: 6,002,467
[45] Date of Patent: Dec. 14, 1999

[54] EXPOSURE APPARATUS AND METHOD

[75] Inventors: Kenji Nishi; Takuzo Kashima, both of Kanagawa-ken; Toshihiko Tsuji, Chiba-ken, all of Japan

[73] Assignee: Nikon Corporation, Tokyo, Japan

[21] Appl. No.: 08/616,647

[22] Filed: Mar. 15, 1996

[30] Foreign Application Priority Data

| Mar. 16, 1995 | [JP] | Japan | 7-057358 |
| Mar. 16, 1995 | [JP] | Japan | 7-057359 |
| Mar. 16, 1995 | [JP] | Japan | 7-057360 |
| Mar. 16, 1995 | [JP] | Japan | 7-057361 |
| May 24, 1995 | [JP] | Japan | 7-124625 |

[51] Int. Cl.$^6$ .......................... G03B 27/54; G02B 27/00
[52] U.S. Cl. .......................... 355/61; 362/268
[58] Field of Search .................. 355/53, 67, 71; 362/268; 250/492.23

[56] References Cited

U.S. PATENT DOCUMENTS

| 5,237,367 | 8/1993 | Kudo . | |
| 5,253,110 | 10/1993 | Ichibara et al. | 359/619 |
| 5,392,094 | 2/1995 | Kudo . | |
| 5,594,526 | 1/1997 | Mori et al. . | |
| 5,636,003 | 6/1997 | Tanitsu et al. | 355/67 |
| 5,659,429 | 8/1997 | Kudo . | |

*Primary Examiner*—Safet Metjahic
*Assistant Examiner*—Michael Dalakis
*Attorney, Agent, or Firm*—Armstrong, Westerman, Hattori, McLeland & Naughton

[57] ABSTRACT

An exposure apparatus for transferring a pattern on a mask onto a photosensitized substrate by exposure, having an illumination optical system, a mask stage for moving the mask and a substrate stage for moving the substrate. An attenuator is disposed between the light source and the photosensitized substrate for attenuating the illumination beam with a variable attenuator rate. A controller controls the output power of the light source and attenuator of the illumination beam such that the exposure energy approaches a predetermined desired value. A stage controller controls the velocities at which the mask stage and the substrate stage are moved for scanning according to the difference between the exposure energy measured by the sensing system and the predetermined desired value.

9 Claims, 22 Drawing Sheets

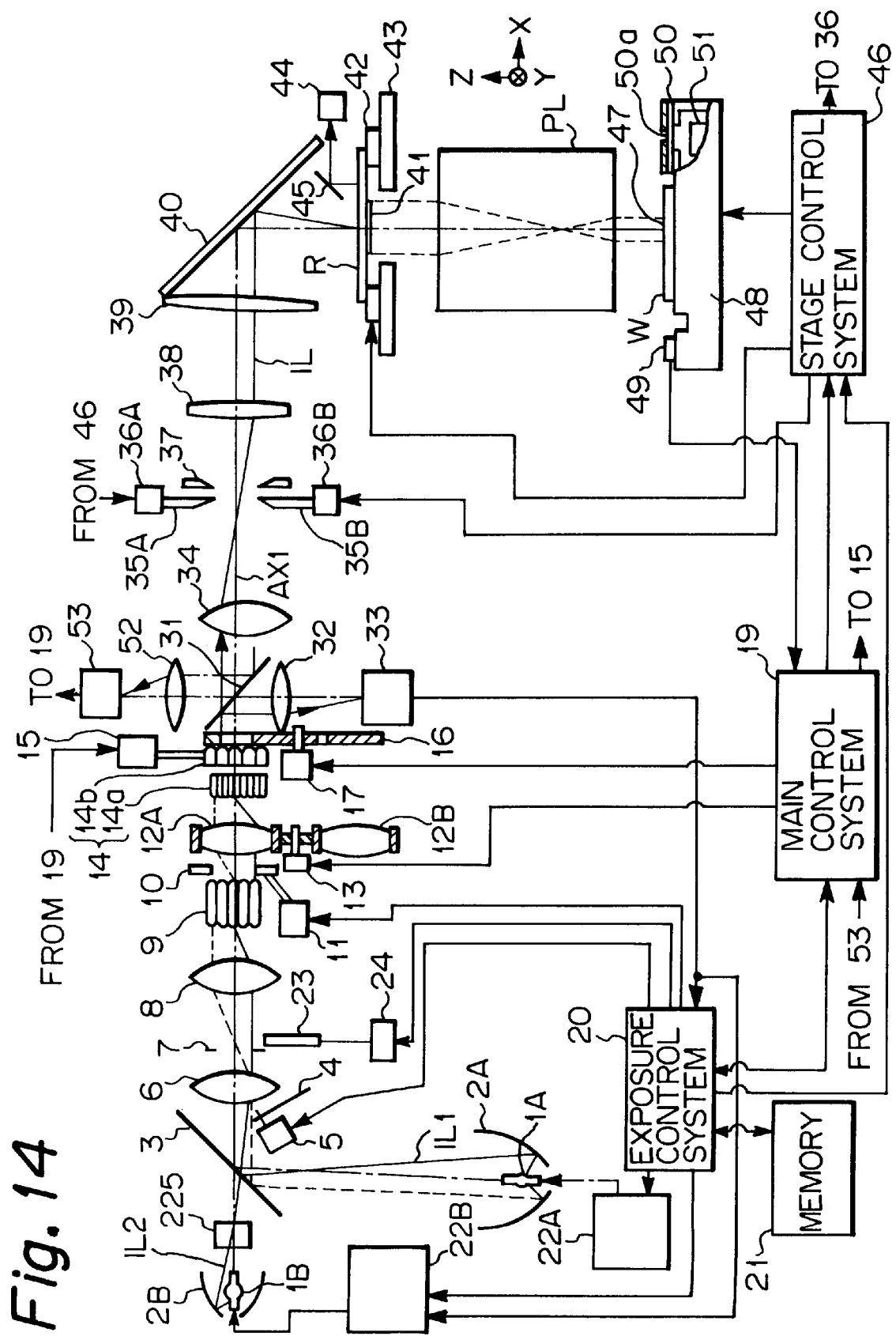

EXPOSURE APPARATUS AND METHOD

BACKGROUND OF THE INVENTION

1. Field of the Invention

The present invention relates to an exposure apparatus for use in a photolithographic process for fabricating semiconductor devices, liquid crystal displays or others.

2. Description of the Related Art

Among various types of exposure apparatuses used for fabricating semiconductor devices and the like, exposure apparatuses, in which a pattern on a reticle (or mask) is transferred onto each of shot areas on a photoresist-coated wafer (or glass plate, etc.) by exposure, are generally provided with an illuminance control mechanism for ensuring that the exposure on each shot area will fall into an acceptable exposure range. The illuminance control mechanism used in such an exposure apparatus is primarily composed of two parts. One is an illuminance distribution control mechanism for suppressing unevenness in the illuminance distribution in an illumination area on the reticle. The other is an exposure control mechanism for maintaining the accumulated exposure in each shot area on the wafer at an appropriate exposure level.

In this regard, one of the most commonly used types of exposure apparatuses is the one-shot exposure type of projection exposure apparatus using the step-and-repeat technique (such as a stepper). In the one-shot exposure type of exposure apparatus, shot areas on the wafer are sequentially positioned at the exposure location, and the pattern on the reticle is transferred through a projection optical system onto the shot area positioned at the exposure location, by performing the one-shot exposure operation, when both the reticle and the wafer is held stationary. For the one-shot exposure type of projection exposure apparatus, the illuminance distribution control may be performed by intermingling a large number of light beams from the corresponding number of light source images by using an optical integrator (such as a fly-eye lens) disposed in the illumination optical system. Further, in a typical one-shot exposure type of projection exposure apparatus, since the exposure is performed on each shot area when the wafer is held stationary, the accumulated exposure in each shot area may be determined by a procedure comprising the steps of: branching out a part of the exposure illumination beam to obtain a monitor beam; continuously receiving the monitor beam during the actual exposure time so as to generate an electrical signal converted from the received beam; integrating the electrical signal to derive an integrated value; and scaling the integrated value by an experimentally determined scale factor.

Thus, the exposure control mechanism for the one-shot exposure type of projection exposure apparatus may be easily constructed. As an example, it may comprise: a photodetector (integrator sensor) for receiving the monitor beam; integrator means for integrating the detection signal produced from the integrator sensor; and control means for controlling either the intensity of the illumination beam or the exposure time such that the difference between the integrated value obtained from the integrator means and the desired value may be reduced.

In this relation, note that there have been proposed and used various sophisticated illumination methods in order to improve resolution and focal depth of the projection exposure apparatus, in particular for a very fine periodical pattern. Those methods include "modified light source method" which uses an illumination-system-aperture-stop comprising a number of openings arranged eccentrically to the optical axis of the illumination system (such as disclosed in U.S. patent application Ser. No. 791,138 filed on Nov. 11, 1991) and "annular illumination method" which uses an illumination-system-aperture-stop having an annular shape. Even when an illumination-system-aperture-stop is replaced with another having a different shape, the actual illuminance on the surface of the wafer may be monitored with precision if the photosensitive surface of the integrator sensor is positioned in a detection plane which is substantially conjugate to the surface of the wafer. Therefore, by controlling an appropriate parameter, such as the exposure time, in such a manner that the integrated value obtained through the integration of the detection signal from the integrator sensor may be converged to a predetermined desired value, the accumulated exposure on each shot area on the wafer can be made to fall into an acceptable range with ease.

More recently, as larger and larger patterns are used for the chips of semiconductor devices, it has become desirable to develop a projection exposure apparatus which is capable of projecting a much larger pattern onto a wafer with a higher efficiency. In order to satisfy this desire, one requirement is to ensure that the distortion will be kept below an acceptable limit over the entire region of an exposure area. Thus, engineer's attention has been drawn to the so-called step-and-scan type of projection exposure apparatus because it is highly effective for suppressing distortion over the entire region of a large exposure area. In the step-and-scan type of projection exposure apparatus, the wafer is stepped to sequentially position the shot areas on the wafer to the scanning start location, and the reticle and the wafer are moved in synchronism with each other and relative to the projection optical system for scanning, so as to serially transfer the pattern on the reticle onto each shot area on the wafer. The step-and-scan type of projection exposure apparatus is a development of the so-called slit-scan type of projection exposure apparatus (such as an aligner), in which a conventional 1:1 projection optical system is used and the reticle and the wafer are moved in synchronism with each other for scanning so as to serially transfer the pattern on the reticle onto the entire region on the surface of the wafer.

A typical illuminance distribution control mechanism (forming a part of illuminance control mechanism) for use in the slit-scan type or the step-and-scan type of projection exposure apparatus may comprise an optical integrator as with the one-shot exposure type of projection exposure apparatus. Where such an optical integrator comprises fly-eye lenses, the entrance surface of each lens element of the final-stage fly-eye lens is positioned in a plane optically conjugate to the plane of the pattern bearing surface of the reticle. Also, the illumination area on the reticle for the scanning exposure has an elongate rectangular shape or an elongate arc shape (this illumination area is referred to as the "slit-like illumination area" hereinafter), so that it is preferable for obtaining a higher illumination efficiency that each lens element of the final-stage fly-eye lens has a cross section of an elongate rectangular shape similar to that of the slit-like illumination area.

On the other hand, a typical exposure control mechanism for use in the scanning exposure type of projection exposure apparatus differs from those for use in the one-shot exposure type of projection exposure apparatus. In the scanning exposure type of projection exposure apparatus, each shot area on the wafer is scanned by the slit-like exposure field having its width (size in the scanning direction) smaller than the length (size in the scanning direction) of the shot area. Therefore, the control of the accumulated exposure in each shot area has to be performed such that the accumulated exposure in the slit-like exposure field may be kept at a constant level at all points on the wafer. If accumulated exposures at different points on the wafer have different values, it means that there is unevenness in the accumulated exposure in each shot area, which provides the same error as the unevenness in the illuminance within the illumination area experienced in the one-shot exposure type of projection exposure apparatus.

For the one-shot exposure type of projection exposure apparatus, one method of controlling the accumulated exposure is to operate the shutter to control the exposure time. For the scanning exposure type of projection exposure apparatus, however, the accumulated exposure at a particular point on the wafer can not be controlled by the operation of the shutter because each shot area is serially exposed by scanning. Therefore, for the scanning exposure technique, the accumulated exposure is controlled by, for example, scanning the reticle and the wafer at controlled, constant velocities. However, any method based on the control of the scanning velocities is not capable of fine adjustment of the accumulated exposure by means of time adjustment. Thus, for the scanning exposure technique, it is required to perform continuous illuminance control during the exposure operation on each shot area, so as to obtain illuminance stability with time. In relation to the illuminance control for the one-shot exposure technique, as one of the known methods for keeping illuminance at a constant level, continuous monitoring of the intensity of the illumination beam and feedback the monitored results to the power supply for the exposure light source is often performed so as to control the input power supplied to the exposure light source from the power supply. This technique is called the "constant-illuminance-control" technique.

Further, there have been proposed other methods of adjusting the quantity of light of the illumination beam by using neutral density filters, or using a mechanism including a pair of shading gratings disposed one on the other wherein the overlaps between the lines of these gratings are adjustable (U.S. Pat. No. 5,191,374).

Moreover, in recent years, there has been developed a technique for enhancing focal depth for a given pattern by reducing the numerical aperture (N.A.) of the illumination optical system and hence the ratio of the numerical aperture of the illumination optical system to that of the projection optical system (i.e., the coherence factor ($\sigma$-value)).

When constant-illuminance-control technique mentioned above is used to perform the control for keeping the illuminance at a constant level, the following relation must be fulfilled in order to obtain an acceptable exposure:

$$P=E(L/V), \text{ or } PV=EL$$

where:
E stands for the illuminance on the wafer established by the illumination beam (or the energy incident on unit area on the wafer per unit time);
V stands for the scanning velocity of the wafer;
L stands for the width of the slit-like exposure field on the wafer measured in the scanning direction; and
P stands for the sensitivity (or the exposure energy per unit area) of the photoresist on the wafer.

It is assumed that the width of the slit-like exposure field L is fixed and the sensitivity P of the photoresist may be of any given value. In such a case, acceptable exposures for, photoresists of different sensitivities may be achieved if either the scanning velocity V of the wafer or the illuminance E of the illumination beam is adjustable.

Therefore, as one method, the control of the accumulated exposure may be performed by adjusting the illuminance E of the exposure illumination beam. In such a case, it is required to measure the illuminance on the wafer with a short measuring time and precisely by means of an illuminance unevenness sensor (such as a photodetector), and control the output power of the light source for the illumination beam, or the attenuation of the illumination beam established by the attenuation unit disposed on the path of the illumination beam path, or other appropriate factors.

FIGS. 28(a) and 28(b) show photosensitive areas of two different conventional illuminance unevenness sensors provided on the wafer stages. FIG. 28(a) shows an example in which an illuminance unevenness sensor has a slit-like photosensitive area. In FIG. 28(a), there is shown an exposure field 402 having an elongate rectangular shape, extending in the non-scanning direction (the Y-direction) and substantially inscribed in a circular shaped effective exposure field 401 of a projection optical system. The slit-like photosensitive area 403 of the illuminance unevenness sensor has an elongate rectangular shape and extends in the scanning direction. The photosensitive area 403 is moved in the non-scanning direction along a solid line arrow in the figure to scan the exposure field 402, so as to detect any illuminance unevenness in the non-scanning direction. The length DA of the photosensitive area 403 is greater than the width LA of the exposure field 402 in order to complete the exposure measurement in the exposure field 402 with a single pass scan. FIG. 28(b) shows an example in which an illuminance unevenness sensor has a pinhole-like photosensitive area. In FIG. 28(b), the pinhole-like photosensitive area 404 is moved two-dimensionally as shown by the scan lines 405 in the figure to scan the exposure field 402, so as to measure the exposure distribution over the entire exposure field 402.

Unfortunately, it is not always possible to cause the accumulated exposure at each point on the wafer to fall into an acceptable range in a scanning exposure type of projection exposure apparatus, by using a constant-illuminance-control technique commonly used in the one-shot exposure type of projection exposure apparatus. More particularly, exposure light sources include electric-discharge lamps (such as a mercury-vapor lamp) and laser sources (such as excimer lasers and harmonic generators of YAG lasers). All of these types of light sources require considerably high input power, resulting in a drawback that it is difficult to adjust the illuminance of the illumination beam with high resolution and with high response speed by controlling only the input power supplied to the exposure light source.

This may not be a problem in the one-shot exposure type of exposure apparatus, in which even when the illuminance of the illumination beam from the exposure light source produces a stepwise variation, the accumulated exposure can be made to fall into an acceptable range with ease by merely controlling the shutter to adjust the exposure time in response to the variation. However, in the scanning exposure type of exposure apparatus, it is difficult to adjust the accumulated exposure by controlling the shutter because the exposure operation is continuously performed.

In view of the foregoing, it is a first object of the present invention to provide an exposure apparatus of the scanning exposure type in which even when the setting resolution in the input power supplied to an exposure light source is relatively low, the accumulated exposure on a photosensitized substrate can be made to fall into an acceptable range.

It is a second object of the present invention to provide an exposure apparatus of the scanning exposure type in which even when the setting resolution in the input power supplied to an exposure light source is relatively low, the illuminance of the illumination beam may follow the desired value with high response speed and with precision, with the result that the accumulated exposure on a photosensitized substrate can be made to fall into an acceptable range with ease.

With regard to a third object of the present invention, in the case where the exposure light source comprises an electric-discharge lamp utilizing an arc-discharge, such as a mercury-vapor lamp, there may occur variations in the illuminance of the illumination beam due to power supply noises, as well as there may occur such variations in the illuminance of the illumination beam known as "arc fluctuations" depending on the conditions of the convection of the gas filled in the tube of the electric-discharge lamp. These illuminance variations (fluctuations) are relatively small in amplitude. However, if such variations include high frequency components, a constant-illuminance-control technique for controlling the input power to the electric-discharge lamp may not follow the variation.

Therefore, when illuminance variations having high frequencies occur due to power supply noise during the scanning exposure operation of one shot area, the accumulated exposures at some points on that shot area may not fall into an acceptable range. This constitutes one of the factors in a reduced yield of the final products of semiconductor devices and the like. Even when a laser source such as an excimer laser (krypton-fluorine excimer laser, argon-fluorine excimer laser, etc.) or a harmonic generator of YAG laser is used as the exposure light source, the output of the light source may produce variations having high frequencies for some reason, so that the accumulated exposures at some points in each shot area may not fall into an acceptable range. Therefore, even when a laser source is used as the exposure light source, some kind of mechanism for suppressing illuminance fluctuations is required.

In the case where the quantity of light of the illumination beam is adjusted using neutral density filters, the adjustment can be made only in a stepwise manner by changing the filters. Further, the technique using a pair of shading gratings described above has a drawback that the dynamic range for continuously adjusting the quantity of light is narrow.

Further, in the case where the quantity of light of the illumination beam is adjusted by controlling the numerical aperture (N.A.), there has been a drawback that the illuminances on the reticle and on the wafer established by the illumination beam are lowered when the numerical aperture is reduced.

In view of the foregoing, it is a third object of the present invention to provide an exposure apparatus of the scanning exposure type in which even when an illumination beam outputted from an exposure light source produces illuminance variations which are smaller than a predetermined proportion of the normal illuminance and of high frequencies, the accumulated exposure on a photosensitized substrate can be made to fall into an acceptable range with ease.

In relation to the third object above, the present invention provides an exposure apparatus which is capable of highly suppressing the illuminance unevenness of the illumination beam (i.e., the unevenness in the accumulated exposure in each shot area), as well as capable of continuously adjusting accumulated exposure on the photosensitized substrate with a wide dynamic range for adjustment.

Also, in relation to the third object above, the present invention provides an exposure apparatus which is capable of preventing any reduction in the illuminances on the reticle and on the wafer established by the illumination beam, even when the numerical aperture of the illumination optical system is reduced, i.e., the ratio of the numerical aperture of the illumination optical system to that of the projection optical system, or the coherence factor (σ-value), is reduced.

With regard to a fourth object of the present invention, arc fluctuations described above may appear as illumination variations at frequencies of about 30 Hz, for example. When arc fluctuations start appearing, the previous relationship between the input power supplied to the electric-discharge lamp and the illuminance of the illumination beam is no longer maintained, so that an ordinary constant-illuminance-control operation, in which the input power supplied to the electric-discharge lamp is controlled based on the actually measured illuminance, can not ensure that the accumulated exposure on a wafer will fall into an acceptable range.

Therefore, if arc fluctuations start appearing during the scanning exposure operation of a shot area, the accumulated exposures at some points in that shot area may no longer fall into an acceptable range. This constitutes another of the factors in a reduced yield of the final products of semiconductor devices and the like.

In view of the foregoing, it is a fourth object of the present invention to provide an exposure apparatus of the scanning exposure type in which even when the illumination beam outputted from the exposure light source produces fluctuations in its illuminance, the accumulated exposure on a photosensitized substrate can be made to fall into an acceptable range.

Further, where a sensor having an elongate, slit-like photosensitive area 403 which is longer than the width of the exposure field 402 in the scanning direction (FIG. 28(*a*)) is used for measuring the illuminance within the exposure field, a high processing speed may be obtained but a large space for the sensor is required on the wafer stage, which is an inconvenient drawback. In addition, the use of such elongate, slit-like photosensitive area has another drawback that the measurement may be made only with low accuracy because the long photosensitive area tends to result in high unevenness in the sensitivity of the sensor. On the other hand, where a sensor having a pinhole-like photosensitive area 404 (FIG. 28(*b*)) is used for this purpose, only a small space for the sensor is required on the wafer stage but a low processing speed results because the number of the measurement points must be large.

In view of the foregoing, it is a fifth object of the present invention to provide an exposure apparatus of the scanning exposure type, having an illuminance unevenness measurement means which provides rapid measurement and requires only a small space.

SUMMARY OF THE INVENTION

In accordance with a first aspect of the present invention, there is provided an exposure apparatus of the scanning exposure type for transferring a pattern on a mask onto a photosensitized substrate by exposure, comprising: a light source for generating an illumination beam for exposure; an illumination optical system for illuminating a predetermined area on the mask with the illumination beam, the predetermined area having the pattern formed thereon; a mask stage for moving the mask, for scanning, in a predetermined direction with respect to the predetermined area; a substrate stage for moving the substrate, for scanning, in synchronism with the movement of the mask and in a direction corresponding to the predetermined direction; an attenuator disposed between the light source and the photosensitized substrate for attenuating the illumination beam with a variable attenuation rate; a sensing system for measuring the exposure energy of the illumination beam; a controller for controlling the output power of the light source and the attenuation of the illumination beam established by the attenuator such that the exposure energy measured by the sensing system may approach a predetermined desired value; and a stage controller for controlling the velocities at which the mask stage and the substrate stage are moved for scanning, in accordance with the difference between the exposure energy measured by the sensing system and the predetermined desired value.

In this arrangement, the controller controls the input power supplied to the exposure light source such that the illuminance of the illumination beam illuminating the mask may approach the predetermined desired value. For this purpose, if the desired value is lower than the level of the illuminance of the illumination beam at which the exposure light source operates with stability, the attenuator is operated so as to attenuate the illuminance of the illumination beam to a level near the desired value.

However, in the case where the setting resolution in the input power supplied to the exposure light source is low (coarse) and where the resolution in the attenuation rate established by the attenuator is also low (coarse), the above operation of the attenuator may be insufficient to ensure that the illuminance of the illumination beam will fall into an acceptable range about the desired value. Further, exposure time T at each point on the photosensitized substrate is equal to $D/V_{W0}$ where $V_{W0}$ stands for the velocity at which the substrate stage is moved for scanning when the illuminance is at a desired value, and D stands for the width of the exposure area on the photosensitized substrate measured in the scanning direction. Then, the appropriate accumulated exposure $\Sigma E_0$ is expressed as:

$$\Sigma E_0 = e_0 * D/V_{W0}$$

where:
$e_0$ stands for the desired value of the illuminance.

It is assumed here that the illuminance has varied from the desired value by $\Delta e$. Then, the appropriate accumulated exposure $\Sigma E_0$ will be achieved by adjusting the velocity of the substrate stage for scanning by $\Delta V_W$ which satisfies the relation expressed as:

$$\Sigma E_0 = (e_0 + \Delta e) * D/(V_{W0} + \Delta V_W)$$

That is, the correction amount $\Delta V_W$ in the velocity is expressed as:

$$\Delta V_W = (e_0 + \Delta e) * D/\Sigma E_0 - V_{W0}$$

As apparent, the velocity of the mask stage for scanning depends on the velocity of the substrate stage for scanning, and thus has to be adjusted in accordance with the above correction.

Therefore, when the error in the illuminance exceeds an allowable limit, the stage controller is operated to control the velocities of the mask stage and the substrate stage for scanning, so that the accumulated exposure at each point on the photosensitive substrate can be made to fall into an acceptable range.

In accordance with a second aspect of the present invention, there is provided an exposure apparatus for transferring a pattern on a mask onto a photosensitized substrate by exposure, comprising: a light source for generating an illumination beam for exposure; an illumination optical system for illuminating a predetermined area on the mask with the illumination beam, the predetermined area having the pattern formed thereon; a sensing system for measuring the exposure energy of the illumination beam; and a fine adjustment device disposed between the light source and the mask for adjusting the quantity of light passing a portion of a region through which the light of the illumination beam travels, in accordance with the exposure energy measured by the sensing system.

In another exposure apparatus in accordance with the second aspect of the present invention, the fine adjustment device comprises a shading element which is rotated within or projected into and retracted from the region through which the light of the illumination beam travels. Further, the shading element is of such a size that may provide a shading area smaller than 10% of the cross-sectional area of the region through which the light of the illumination beam travels.

A further exposure apparatus in accordance with the second aspect of the present invention is an exposure apparatus for serially transferring a pattern on a mask onto a photosensitized substrate by exposure, comprising: a light source for generating an illumination beam for exposure; an illumination optical system for illuminating the mask with the illumination beam, the mask having the pattern formed thereon; a first optical integrator; a second optical integrator receiving the illumination beam from the first optical integrator; and a quantity-of-light-adjustment element for continuously adjusting the quantity of light of the illumination beam travelling from the first optical integrator to the second optical integrator.

A still further exposure apparatus in accordance with the second aspect of the present invention is an exposure apparatus for serially transferring a pattern on a mask onto a photosensitized substrate by exposure, comprising: a light source for generating an illumination beam for exposure; an illumination optical system for illuminating the mask with the illumination beam, the mask having the pattern formed thereon; a first optical integrator; a second optical integrator receiving the illumination beam from the first optical integrator; a first adjustment mechanism for adjusting at least one of the extent and the shape of a region on an exit surface of the second optical integrator through which region the illumination beam passes; a second adjustment mechanism, operable in relation to the first adjustment mechanism, for adjusting the extent of an illumination field on an entrance surface of the second optical integrator; and the second optical integrator having the first group of lens elements defining the entrance side of the second optical integrator and the second group of lens elements defining the exit side of the second optical integrator, each of the first group of lens elements and each of the second group of lens elements having different shapes from each other.

In the first one of the above four arrangements according to the second aspect of the present invention, if the illuminance of the illumination beam produces such variations which are smaller than a predetermined proportion of the normal illuminance and of high frequencies, which may be caused by the power supply noises and other causes, during the scanning exposure operation to one of the shot areas on the photosensitive substrate, then these variations are detected from the detection signal of the sensing system. Then, the fine adjustment device is operated to adjust the quantity of light of the illumination beam so as to suppress the variations in the illuminance, so that the illuminance of the illumination beam may be maintained at a desired value with a high response speed and the accumulated exposure may be kept within an acceptable range.

In the second one of the above four arrangements according to the second aspect of the present invention, where the fine adjustment comprises a shading element which is rotated within or projected into and retracted from the region through which the light of the illumination beam travels, and where the shading element is of such a size that may provide a shading area smaller than 10% of the cross-sectional area of the region though which the light of the illumination beam travels, the illuminance of the illumination beam may be advantageously controlled at a high speed over a control range of about 10% of the normal illuminance.

In the third one of the above four arrangements according to the second aspect of the present invention, a first optical integrator and a second optical integrator receiving the illumination beam from the first optical integrator are used, and a portion of the illumination beam is shaded by a quantity-of-light-adjustment element which may be disposed on the exit surface or the entrance surface of the first optical integrator or in any plane conjugate to the plane of either surface so as to adjust the quantity of light of the illumination beam, so that the accumulated exposure on the photosensitized substrate may be adjusted on a continuous adjustment basis, in a wide dynamic range, and with reduced unevenness in the illuminance of the illumination beam (hence reduced unevenness in the accumulated exposure in each shot area).

In the fourth one of the above four arrangements according to the second aspect of the present invention, a second optical integrator receiving the illumination beam from a first optical integrator is used, and there are provided a first adjustment mechanism for adjusting the extent of that area on the exit surface of the second optical integrator through which the illumination beam passes (i.e., the N.A. of the illumination optical system) and a second adjustment mechanism, operable in relation to the first adjustment mechanism, for adjusting the extent of the illumination field on the entrance surface of the second optical integrator, so that even when the N.A. of the illumination optical system is reduced, the illuminance of the illumination beam on the mask and that on the photosensitized substrate are advantageously maintained at substantially constant levels by reducing the extent of the illumination field on the entrance surface of the second optical integrator so as to increase the illuminance of the illumination beam at the second optical integrator.

In accordance with a third aspect of the present invention, there is provided an exposure apparatus of the scanning exposure type for serially transferring a pattern on a mask onto a photosensitized substrate by exposure, in which the mask is moved for scanning in a predetermined direction with respect to a predetermined area, and in which the substrate is moved for scanning in synchronism with the movement of the mask and in a direction corresponding to the predetermine direction, the exposure apparatus comprising: an illumination optical system for illuminating a predetermined area on the mask with an illumination beam for exposure, the predetermined area having the pattern formed thereon; the illumination optical system comprising: a plurality of light sources for generating respective light beams for exposure; and a light beam combining optical system for combining the light beams from the plurality of light sources into the illumination beam; and a quantity-of-light-control device for controlling the quantity of light of the light beam from at least one of the plurality of light sources in accordance with the quantity of light of the illumination beam combined by the light beam combining optical system.

In this arrangement, the plurality of light sources may preferably comprise: a first light source; and a second light source whose output power level is lower than that of the first light source; and the quantity-of-light-control device may be so arranged as to control the quantity of light of the light beam from the second light source.

Further, this exposure apparatus may preferably comprise: a sensing system for continuously measuring the exposure energy of the illumination beam combined by the light beam combining optical system; and the quantity-of-light-control device being so arranged as to control the quantity of light of at least one of the light beams from the plurality of light sources such that the exposure energy measured by the sensing system may be maintained at a predetermined desired value.

Another exposure apparatus in accordance with the third aspect of the present invention is an exposure apparatus of the scanning exposure type for serially transferring a pattern on a mask onto a photosensitized substrate by exposure, in which the mask is moved for scanning in a predetermined direction with respect to a predetermined area, and in which the substrate is moved for scanning in synchronism with the movement of the mask and in a direction corresponding to the predetermine direction, the exposure apparatus comprising: an illumination optical system for illuminating a predetermined area on the mask with an illumination beam for exposure, the predetermined area having the pattern formed thereon; the illumination optical system comprising: a light source for generating a light beam for exposure; a light beam splitting optical system for splitting the light beam from the light source into a plurality of light beams; a light beam combining optical system for combining the plurality of light beams into the illumination beam; and an attenuator for continuously attenuating the quantity of light of at least one of the plurality of light beams within a predetermined attenuation range and at a place between the light beam splitting optical system and the light beam combining optical system; and the attenuator being so arranged as to control the attenuation in accordance with the quantity of light of the illumination beam combined by the light beam combining optical system.

In the first one of the above two arrangements according to the third aspect of the present invention, the input powers supplied to the plurality of exposure light sources are initially set such that the quantity of light (illuminance) of the illumination beam may have a value near the desired value, and then input power to one (or more) of the exposure light sources is controlled in accordance with the deviation (error) of the actual illuminance from the desired value so as to maintain the illuminance nearly at the desired value. In this relation, in a conventional case where a single exposure light source is used to provide the illumination and where the setting resolution in the input power of the exposure light source is A %, then the power control will produce the maximum possible error in the illuminance which is equal to A % of the desired value.

In contrast, according to this arrangement, a plurality of exposure light sources are used. Thus, in the case where that one of the exposure light sources which makes the smallest contribution to the resulting illuminance is selected as the exposure light source whose input power is to be controlled and where the setting resolution in the input power to that light source is A %, then the maximum possible error in the resulting illuminance with respect to the desired value will be as small as about (A/a) %, where a is the real number equal to 2 (two) or more. Further, in this case, since the exposure light source having relatively low output power level is used as the controlled exposure light source, higher response speed will be achieved.

In particular, where a first exposure light source having a higher output power level and a second exposure light source having a lower output power level are used, smaller maximum possible error and higher response speed will be obtained by controlling the input power to the second exposure light source, because it has a finer (higher) setting resolution in the input power and a higher response speed than the first exposure light source.

Moreover, in the case where a sensing system for continuously measuring the exposure energy of the illumination beam combined by the light beam combining optical system is used, the illuminance can be continuously maintained at the desired value by arranging the quantity-of-light-control device so as to control the quantity of light of at least one of the light beams from the plurality of light sources such that the exposure energy measured by the sensing system may be maintained at a predetermined desired value.

In the second one of the above two arrangements according to the third aspect of the present invention, a light beam from a single exposure light source is split into a plurality of light beams which are again combined into an illumination beam, and the input power supplied to the exposure light source is fixed at a predetermined value with which the quantity of light (illuminance) of the combined illumination beam may be nearly at a desired value. Then, the resulting illuminance can be controlled with a finer (higher) resolution than the setting resolution in the input power supplied to the exposure light source, by controlling by means of the attenuator the illuminance of that one of the plurality of light beams which has the lowest illuminance, for example.

In accordance with a fourth aspect of the present invention, there is provided an exposure apparatus of the scanning exposure type for serially transferring a pattern on a mask onto a photosensitized substrate by exposure, in which the mask is moved for scanning in a predetermined direction with respect to a predetermined area, and in which the substrate is moved for scanning in synchronism with the movement of the mask and in a direction corresponding to the predetermined direction, the exposure apparatus comprising: a light source for generating an illumination beam for exposure; an illumination optical system for illuminating a predetermined area on the mask with the illumination beam, the predetermined area having the pattern formed thereon; a sensing system for continuously measuring the exposure energy of the illumination beam and producing an output signal corresponding thereto; an illumination fluctuation detection system for detecting any fluctuations in the illuminance of the illumination beam generated from the light source; an illuminance control device for controlling the output power of the light source in accordance with the output signal of the sensing system; and the illuminance control device being so arranged as to induce variations in the output power of the light source when any fluctuations in the illuminance of the illumination beam are detected by the illuminance fluctuation detection system, the variations induced by the illuminance control device having frequencies higher than a predetermined frequency.

In this arrangement, the illuminance fluctuation detection system may preferably comprise: a photodetector for detecting the quantity of light of the illumination beam and producing an output signal corresponding thereto; and a comparator for detecting the difference between the output signal of the photodetector and a signal corresponding to the electric power supplied to the light source.

Further, the illuminance fluctuation detection system may preferably comprise: a photodetector for detecting the quantity of light of the illumination beam and producing an output signal corresponding thereto; and a low-pass filter for extracting any low frequency components of the output signal of the photodetector.

Moreover, the illuminance control device may preferably comprise: a variable gain device for amplifying any variations in the output signal of the sensing system with a certain gain so as to control the output power of the light source; and the gain of the variable gain device being controlled in accordance with the fluctuations in illuminance detected by the illuminance fluctuation detection system.

In the above cases, the light source may comprise an electric-discharge lamp, and the fluctuations in the illuminance of the illumination beam may be caused by the fluctuations in the discharge of the electric-discharge lamp.

In the above arrangements in accordance with the fourth aspect of the present invention, when any fluctuations in the illuminance of the illumination beam are detected by the illuminance fluctuation detection system during the scanning exposure on a shot area on the photosensitive substrate, then high frequency variations are induced in the output power of the exposure light source (hence in the illuminance of the illumination beam) by the illuminance control device. In this case, the accumulated exposure at the point in the shot area which is then exposed will have the integrated value of the illuminance in which the high frequency variations are induced, so that the accumulated exposure obtained will fall into an acceptable range.

In the case where the illuminance fluctuation detection system comprises a photodetector for detecting the quantity of light of the illumination beam and producing an output signal corresponding thereto and a comparator for detecting the difference between the output signal of the photodetector and a signal corresponding to the input power supplied to the light source, the fact that fluctuations start appearing may be determined when the absolute value of the difference outputted from the comparator exceeds a predetermined threshold value.

Further, in the case where the illuminance fluctuation detection system comprises a photodetector for detecting the quantity of light of the illumination beam and producing an output signal corresponding thereto and a low-pass filter for extracting any low frequency components of the output signal of the photodetector, the fact that fluctuations start appearing may be determined when the value of the output from the low-pass filter exceeds a predetermined threshold value.

Moreover, in the case where the illuminance control device comprises a variable gain device for amplifying any variations in the output signal of the sensing system with a certain gain so as to control the output power of the light source, and the gain of the variable gain device being controlled in accordance with the fluctuations in illuminance detected by the illuminance fluctuation detection system, the gain of the variable gain device is increased when any fluctuations in the illuminance are detected, with the result that high frequency variations are induced in the output power of the exposure light source.

In accordance with a fifth aspect of the present invention, there is provided an exposure apparatus of the scanning exposure type for serially transferring a pattern on a mask onto a photosensitized substrate by exposure, in which the mask and the substrate are, relatively to each other, moved for scanning in synchronism with each other while an image of a portion of the pattern is projected onto the substrate, the exposure apparatus comprising: a photodetector having a slit-like photosensitive area which is elongate in the scanning direction of the substrate and has a length in the scanning direction smaller than the width of an exposure area in the scanning direction, the exposure area being defined for the pattern formed on the mask; a relative movement mechanism for generating relative movement between the photodetector and the exposure area in the direction perpendicular to the scanning direction of the substrate; and a signal processing system for receiving an electrical signal obtained by the photoelectric conversion and produced from the photodetector during the time interval in which the relative movement mechanism generates relative movement between the photodetector and the exposure area.

Further, the length of the slit-like photosensitive area of the photodetector in the scanning direction of the substrate may be preferably longer than the width of vignetting periphery of the exposure area.

In the arrangement according to the fifth aspect of the present invention, the slit-like photosensitive area of the photodetector has a length in the scanning direction smaller than the width of the exposure area, so that the photodetector requires only a smaller space than any conventional arrangements using a photodetector which has a larger photosensitive area than the exposure area.

Further, in the case where the length of the slit-like photosensitive area of the photodetector in the scanning direction of the substrate is longer than the width of vignetting periphery of the exposure area, any unevenness in the illumination in the vignetting periphery may be determined with precision by moving the photosensitive area in the non-scanning direction within the exposure area, with the photosensitive area overlapping the vignetting periphery of the exposure area.

In accordance with a sixth aspect of the present invention, there is provided a method of transferring a pattern on a mask onto a photosensitized substrate by exposure while scanning said mask and said substrate, comprising the steps of: preparing a light source for generating an illumination beam for exposure; illuminating a predetermined area on said mask with said illumination beam, said predetermined area having said pattern formed thereon; moving said mask, for scanning, in a predetermined direction with respect to said predetermined area; moving said substrate, for scanning, in synchronism with the movement of said mask and in a direction corresponding to said predetermined direction; attenuating said illumination beam with variable attenuation rate; measuring the exposure energy of said illumination beam on a continuous measurement basis; controlling the output power of said light source and the attenuation of said illumination beam attenuator such that the measured exposure energy may approach a predetermined desired value; and controlling the velocities at which said mask and said substrate are moved for scanning, in accordance with the difference between the measured exposure energy and said predetermined desired value.

In accordance with a seventh aspect of the present invention, there is provided a method of transferring a pattern on a mask onto a photosensitized substrate by exposure, comprising the steps of: preparing a light source for generating an illumination beam for exposure; illuminating a predetermined area on said mask with said illumination beam, said predetermined area having said pattern formed thereon; measuring the exposure energy of said illumination beam; and adjusting the quantity of light passing a portion of a region through which the light of said illumination beam travels, in accordance with the measured exposure energy.

In accordance with an eighth aspect of the present invention, there is provided a method of transferring a pattern on a mask onto a substrate by exposure, comprising the steps of: preparing a first optical integrator; preparing a second optical integrator; adjusting a quantity of light of an illumination beam from said first optical integrator on a continuous adjustment basis and then directing said illumination beam to said second optical integrator; and illuminating said mask with said illumination beam from said second optical integrator.

Another method in accordance with the eighth aspect of the present invention is a method of transferring a pattern on a mask onto a substrate by exposure, comprising the steps of: preparing a first optical integrator; preparing a second optical integrator receiving an illumination beam from said first optical integrator, a shape of lens elements defining the entrance side of said second optical integrator being different from that of lens elements defining the exit side of said second optical integrator; adjusting at least one of the extent and the shape of a region on an exit surface of said second optical integrator through which region said illumination beam passes; adjusting the extent of an illumination field on an entrance surface of said second optical integrator depending on at least one of the extent and the shape of said region.

In accordance with a ninth aspect of the present invention, there is provided a method of serially transferring a pattern on a mask onto a photosensitized substrate by exposure, in which said mask is moved for scanning in a predetermined direction with respect to a predetermined area, and in which said substrate is moved for scanning in synchronism with the movement of said mask and in a direction corresponding to said predetermine direction, said method comprising the steps of: illuminating a predetermined area on said mask with an illumination beams for exposure generated from a plurality of light sources, said predetermined area having said pattern formed thereon; combining the light beams from said plurality of light sources into said illumination beam; and controlling the quantity of light of the light beam from at least one of said plurality of light sources in accordance with the quantity of light of said illumination beam combined.

Another method in accordance with the ninth aspect of the present invention is a method of serially transferring a pattern on a mask onto a photosensitized substrate by exposure, in which said mask is moved for scanning in a predetermined direction with respect to a predetermined area, and in which said substrate is moved for scanning in synchronism with the movement of said mask and in a direction corresponding to said predetermine direction, said method comprising the steps of: illuminating a predetermined area on said mask with an illumination beam for exposure, said predetermined area having said pattern formed thereon; splitting a light beam for exposure into a plurality of light beams; combining said plurality of light beams into said illumination beam; attenuating the quantity of light of at least one of said plurality of light beams within a predetermined attenuation range between said light beam splitting step and said light beam combining step; and controlling the attenuation to be established in said attenuating step, in accordance with the quantity of light of said illumination beam combined.

In accordance with a tenth aspect of the present invention, there is provided a method of serially transferring a pattern on a mask onto a photosensitized substrate by exposure, in which said mask is moved for scanning in a predetermined direction with respect to a predetermined area, and in which said substrate is moved for scanning in synchronism with the movement of said mask and in a direction corresponding to said predetermine direction, said method comprising the steps of: providing a light source for generating an illumination beam for exposure; illuminating a predetermined area on said mask with said illumination beam, said predetermined area having said pattern formed thereon; measuring the exposure energy of said illumination beam on a continuous measurement basis; detecting any fluctuations in the illuminance of said illumination beam generated from said light source; controlling the output power of said light source in accordance with the measured exposure energy of said illumination beam; and inducing variations in the output power of said light source when any fluctuations in the illuminance of said illumination beam are detected, the induced variations having frequencies higher than a predetermined frequency.

In accordance with an eleventh aspect of the present invention, there is provided a method of serially transferring a pattern on a mask onto a photosensitized substrate by exposure, in which said mask and said substrate are, relatively to each other, moved for scanning in synchronism with each other while an image of a portion of said pattern is projected onto said substrate, said method comprising the steps of: providing a photodetector having a slit-like photosensitive area which is elongate in the scanning direction of said substrate and has a length in the scanning direction smaller than the width of an exposure area in the scanning direction, said exposure area being defined for said pattern formed on said mask; generating relative movement between said photodetector and said exposure area in the direction perpendicular to the scanning direction of said substrate; and receiving an electrical signal obtained by the photoelectric conversion and produced from said photodetector during the time interval in which relative movement between said photodetector and said exposure area is generated.

BRIEF DESCRIPTION OF THE DRAWINGS

The above and other objects, features and advantages of the present invention will be apparent from the following detailed description of preferred embodiments thereof, reference being made to the accompanying drawings, in which:

FIG. 14 is a schematic representation, partially broken away, showing a projection exposure apparatus of the scanning exposure type according to a third embodiment of the present invention;

DETAILED DESCRIPTION OF PREFERRED EMBODIMENTS

Referring now to the accompanying drawings, an exposure apparatus according to a first embodiment of the present invention will be described in detail. This embodiment shows an exemplified application of the present invention to a step-and-scan type of projection exposure apparatus.

Figure 1:
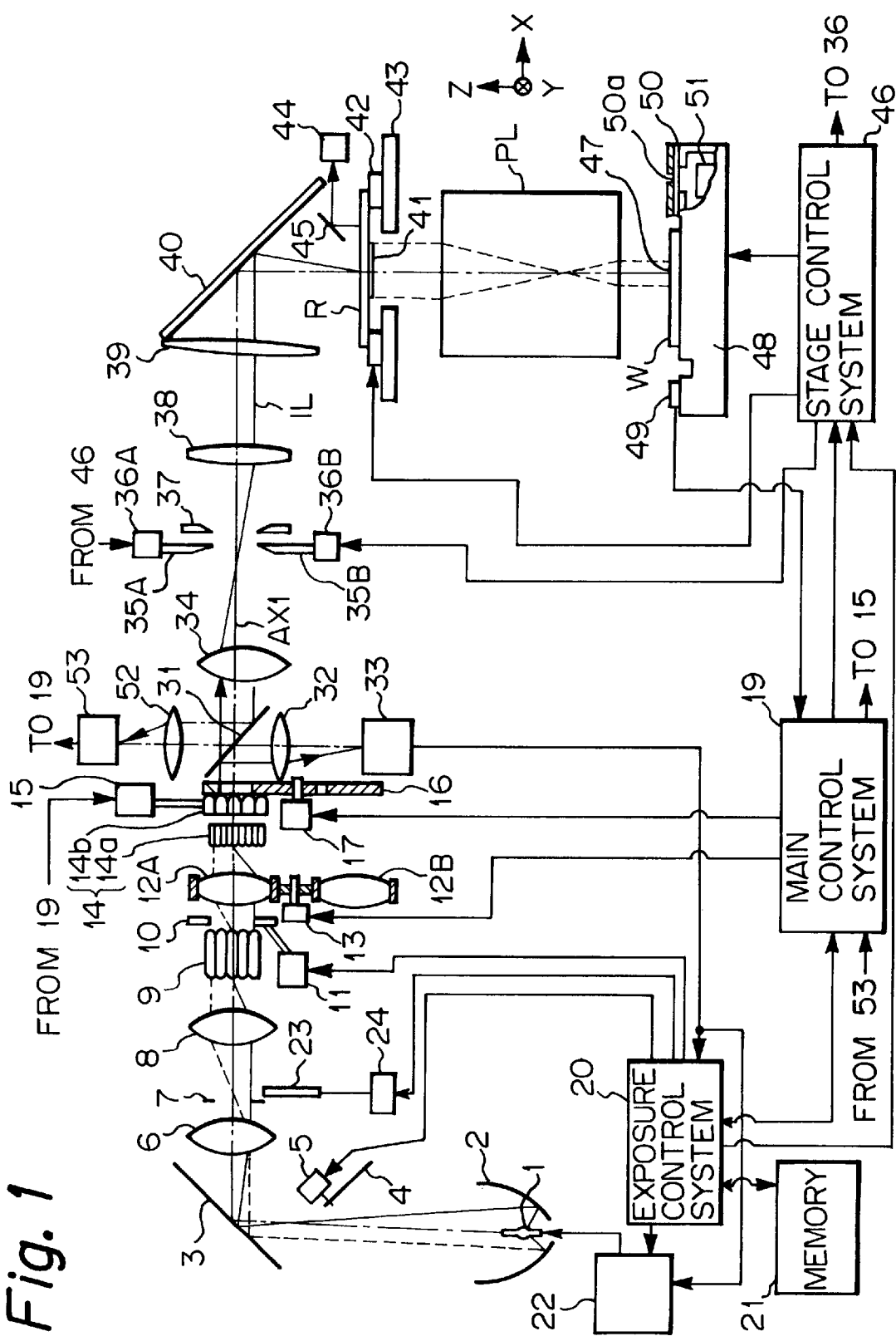
FIG. 1 is a schematic representation, partially broken away, showing a projection exposure apparatus of the scanning exposure type according to a first embodiment of the present invention.

FIG. 1 illustrates the projection exposure apparatus of the first embodiment, in which a mercury-vapor lamp 1 emits illumination light rays which are collected by an ellipsoidal mirror 2 to form an illumination beam converging on and passing through a point. A shutter 4 is disposed by this point of convergence. The shutter 4 is operable to open and close by means of a shutter control mechanism 5. When the shutter 4 is open, the illumination beam is allowed to pass through it, reflected by a mirror 3, and then substantially collimated by an input lens 6 to reach a field stop 7. Just behind the field stop 7 there is disposed a dimmer plate 23 which may be projected into and retracted from the region through which the illumination beam travels. The dimmer plate 23 serves to vary the quantity of light of the illumination beam passing through the field stop 7, either stepwise or continuously, over a predetermined variation range.

The dimmer plate 23 may comprise a plurality of reflective semitransparent mirrors arranged to be selectively positioned to an operable position and having tilt angles so selected that the transmittance established by the dimmer plate 23 may be set to one of predetermined transmittances. The dimmer plate 23 may be stepped by means of a dimmer plate drive unit 24 including a drive motor, so that the quantity of light of the illumination beam may be adjusted. In this embodiment, the control of the exposure on the wafer W is achieved by an exposure control system 20 which controls the operation of the dimmer plate drive unit 24 as well as the operation of the shutter control unit 5. Also, the exposure control system 20 controls a power supply system 22 for the mercury-vapor lamp 1 so as to control the electric power supplied to the mercury-vapor lamp 1.

The illumination beam, having passed through the aperture of the field stop 7 and been adjusted in its quantity of light by the dimmer plate 24, passes through a first relay lens 8 into a first fly-eye lens 9 of a two-stage fly-eye lens arrangement. The first fly-eye lens 9 forms a plurality of images of the light source which emit respective light beams to be mingled into a new illumination beam. This illumination beam is directed through a second-stage relay lens 12A into a second fly-eye lens 14. In this embodiment, there is disposed a variable stop 10 close to the exit surface of the first fly-eye lens 9, which exit surface provides an image forming plane in which the plurality of images of the light source are formed. The aperture of the variable stop 10 may be adjusted by means of a variable stop drive unit 11 to any desired size.

The operation of the variable stop drive unit 11 is also controlled by the exposure control system 20. In this embodiment, the quantity of light of the illumination beam travelling from the first fly-eye lens 9 to the second fly-eye lens 14 may be continuously adjusted by varying the size of the aperture of the variable stop 10.

Figure 2A:
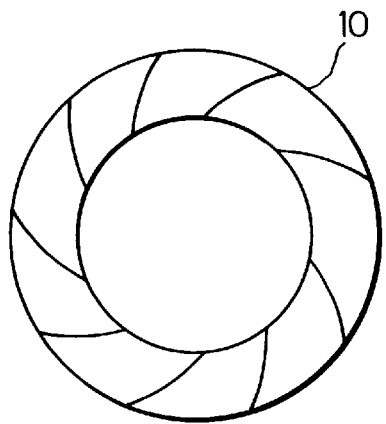
FIGS. 2(a) and 2(b) show an example of a variable stop which may be used in the projection exposure apparatus according to the first embodiment.
Figure 2B:
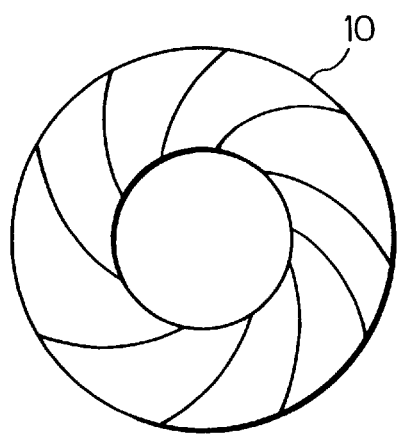

FIG. 2(a) illustrates an example of the variable stop 10. As shown, the variable stop 10 of FIG. 2(a) comprises an iris diaphragm having a control lever (not shown). The diameter of the generally circular aperture of the iris diaphragm can be continuously adjusted, as shown in FIG. 2(b), by the actuation of the control lever.

Referring again to FIG. 1, there has been developed in recent years a technique for enhancing focal depth for a given pattern by reducing the numerical aperture of the illumination optical system, and thus reducing the coherence factor (or σ-value), i.e., the ratio of the numerical aperture of the illumination optical system to that of the projection optical system. Reduction in the a-value results in a reduction in the illuminance on the reticle established by the illumination beam. This embodiment includes means for preventing such reduction in the illuminance on the reticle, which comprises an adjustment mechanism for adjusting the extent of the illumination area on the entrance surface of the second fly-eye lens 14.

The adjustment mechanism comprises a first second-stage relay lens 12A, a second second-stage relay lens 12B having a greater focal power than the first second-stage relay lens 12A and a changer mechanism 13 for selectively positioning one of the second-stage relay lenses 12A and 12B at an operative position. The operation of the changer mechanism 13 is controlled by the main control system 19 which serves to generally control the operations of the entire projection exposure apparatus of this embodiment. When the illumination is to be performed with an ordinary σ-value, the change mechanism 13 positions the first second-stage relay lens 12A at the operative position between the first and second fly-eye lenses 9 and 14, with the result that almost the entire entrance surface of the second fly-eye lens 14 is illuminated by the illumination light. On the other hand, when the illumination is to be performed with a reduced σ-value (i.e., with a reduced numerical number of the illumination optical system), the changer mechanism 13 has the second second-stage relay lens 12B at the operative position between the first and second fly-eye lenses 9 and 14, with the result that only the central portion of the entrance surface of the second fly-eye lens 14 is illuminated by the illumination beam. Thus, when the reduced σ-value is selected, the illuminance of the illumination beam in the illuminated area on the second fly-eye lens 14 is increased, so that the illuminances on the reticle and on the wafer established by the illumination beam may be kept constant irrespective of the σ-value selected.

As shown and described, the adjustment mechanism used in this embodiment is of a lens changing type. Alternatively, the adjustment mechanism may comprise a zoom-lens system disposed between the first and second fly-eye lenses 9 and 14 and associated with a magnification changer unit for operating the zoom lens system to change its magnification. By using such zoom-lens system, the extent of the illumination field on the entrance surface of the second fly-eye lens 14 may be continuously varied. This provides an advantage that high illuminances may be maintained on the reticle and on the wafer while the σ-value is continuously varied.

The second fly-eye lens 14 in this embodiment comprises a pair of lens bundles 14a and 14b each including a plurality of tiny lens elements gathered into one piece of mosaic structure and each having one end surface formed to be a plane surface. The lens bundles 14a and 14b are disposed close to each other with their plane surfaces facing each other. Thus, the second fly-eye lens 14 is referred to as the "mosaic fly-eye lens" hereinafter.

Figure 3A:
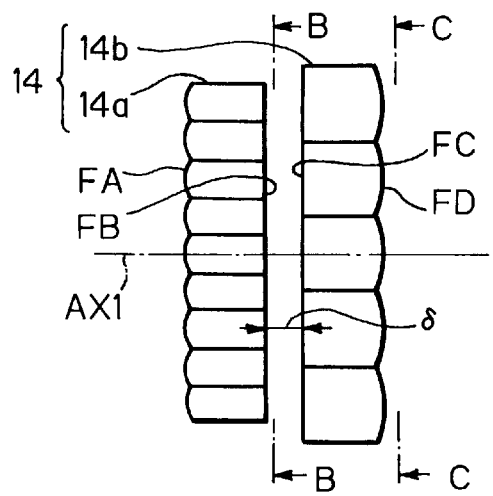
FIG. 3(a) is an enlarged side elevation of a mosaic fly-eye lens (second fly-eye lens) of FIG. 1.

FIG. 3(a) is a side elevation of the mosaic fly-eye lens 14. As shown in this figure, the mosaic fly-eye lens 14 comprises the pair of lens bundles 14a and 14b disposed along the optical axis AX1 of the illumination optical system, with their plane surfaces FB and FC facing each other and establishing a spacing 6 between them. The first lens bundle 14a, which is disposed closer to the light source than the second lens bundle 14b, comprises the lens elements each having one end surface that forms a part of the entrance surface FA so shaped as to provide a focal power. The second lens bundle 14b, which is disposed closer to the reticle than the first lens bundle 14a, comprises the lens elements each having one end surface that forms a part of the exit surface FD so shaped as to provide a focal power.

The focal power of each lens element is so selected that any collimated light beam entering the first lens bundle 14a from the light source side is converged on the exit surface FD of the second lens bundle 14b while any collimated light beam entering the second lens bundle 14b from the reticle side is converged on the entrance surface FA of the first lens bundle 14a. That is, the exit surface FD of the second lens bundle 14b defines a focal plane of the mosaic fly-eye lens 14, so that numerous images of the light source are formed on the exit surface FD. As understood, the pair of lens bundles 14a and 14b cooperate with each other, and they are capable of serving as a single fly-eye lens only when used together. Although FIGS. 3(a)–3(c) show the lens bundles 14a and 14b of the mosaic fly-eye lens 14 each including a particular number of lens elements, they do it by way of example only, and the number of the lens elements in each lens bundle may be selected depending on the required evenness in the illuminance distribution.

Figure 3B:
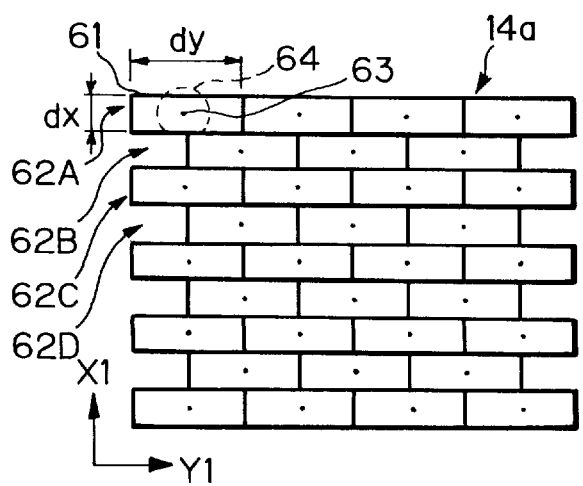
FIG. 3(b) is a front elevation of the mosaic fly-eye lens as viewed from a plane indicated by line B—B of FIG. 3(a)
Figure 3C:
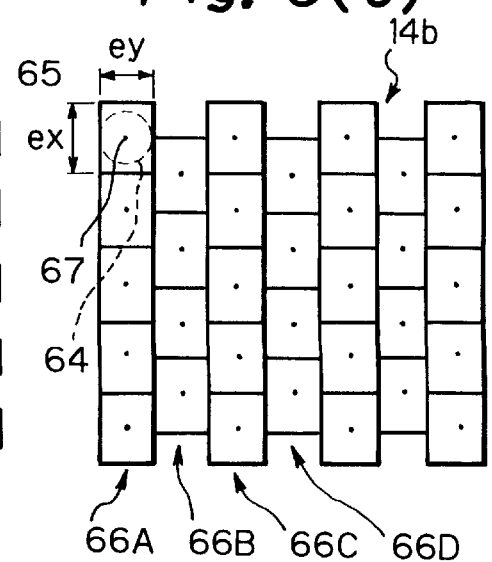
FIG. 3(c) is a front elevation of the mosaic fly-eye lens as viewed from a plane indicated by line C—C of FIG. 3(a)

FIG. 3(b) is a front elevation of the first lens bundle 14a as viewed from a plane indicated by line B—B of FIG. 3(a), and FIG. 3(c) is a front elevation of the second lens bundle 14b as viewed from a plane indicated by line C—C of FIG. 3(a). In these figures, the X1- and Y1-directions are indicated. The X1-direction corresponds to the scanning direction on the reticle in which the projection exposure apparatus of this embodiment scans the reticle during the scanning exposure operation, and the Y1-direction corresponds to the non-scanning direction on the reticle which is perpendicular to the scanning direction.

As shown in FIG. 3(b), the first lens bundle 14a comprises the lens elements 61, each of which has a cross section of an elongate rectangular shape with a size dx (in the X1-direction) by dy (in the Y1-direction), where dy>dx. The lens elements 61 are arranged in parallel lines extending in the Y1-direction without any spaces left between the adjacent lens elements. The group of the lens elements forming a first line is designated by 62A, the lens element group forming a second line by 62B, the lens element group forming a third line by 62C, and so on. The Y1-direction positions of the lens elements in odd lines, such as the first line 62A, the third line 62C, and so on, are in phase with each other, while those of the lens elements in even lines, such as the second line 62B, the fourth line 62D, and so on, are also in phase with each other. Further, the Y1-direction positions of the lens elements in odd lines and those of the lens elements in even lines are shifted in phase by one half of dy, the size of each lens element in the Y1-direction.

In this embodiment, the highest illumination efficiency is achieved when i) the entrance surface FA (FIG. 3(a)) of the first lens bundle 14a is positioned in a plane optically conjugate to the plane of the pattern bearing surface of the reticle and ii) the cross section of each lens element 61 of the first lens bundle 14a is similar to the shape of the slit-like illumination area on the reticle. To satisfy the latter requirement, the ratio between the height (the size in the X1-direction) dx and the width (the size in the Y1-direction) dy of the cross section of each lens element 61 is chosen to be the same as the ratio between the width (the size in the scanning direction) and the length (the size in the non-scanning direction) of the slit-like illumination area on the reticle. As the result, the cross section of each lens element 61 is of an elongate rectangular shape extending in the Y1-direction (i.e., the direction corresponding to the non-scanning direction on the reticle). For example, the ratio dx:dy=1:3 may be chosen.

As shown in FIG. 3(c), the second lens bundle 14b comprises the lens elements 65, each of which has a cross section of a rectangular, nearly perfect square shape having a size ex (in the X1-direction) by ey (in the Y1-direction), where ex=2*dx, and ey=dy/2. The lens elements 65 are arranged in parallel lines extending in the X1-direction without any spaces left between the adjacent lens elements. The group of the lens elements forming a first line is designated by 66A, the lens element group forming a second line by 66B, the lens element group forming a third line by 66C, and so on. The X1-direction positions of the lens elements in odd lines, such as the first line 62A, the third line 62C, and so on, are in phase with each other, while those of the lens elements in even lines, such as the second line 62B, the fourth line 62D, and so on, are also in phase with each other. Further, the X1-direction positions of the lens elements in odd lines and those of the lens elements in even lines are shifted in phase by one half of ex, the size of each lens element in the X1-direction. As an example, when the ration dx:dy=1:3 is chosen for the cross section of each lens element 61 of the first lens bundle 14a, the cross section of each lens element 65 of the second lens bundle 14b will have the ratio ex:ey=2:1.5=4:3, resulting in a cross section of a nearly perfect square shape.

The first and second lens bundles 14a and 14b, having thus described arrangements, are aligned with each other such that one of the lens elements 61 of the first bundle 14a has its center aligned with corresponding one of the lens elements 65 of the second lens bundle 14a with respect to both the X1- and Y1-directions. By this alignment, the centers 67 of all the lens elements 61 of the first lens bundle 14a are aligned with the corresponding centers 67 of the lens elements 65 of the second lens bundle 14b with respect to both the X1- and Y1-directions.

The operation of and the effects obtained from the mosaic fly-eye lens 14 comprised of two separate lens bundles 14a and 14b will be described below. The mosaic fly-eye lens 14 used in this embodiment is a second-stage fly-eye lens. On each of the exit surfaces of the individual lens elements 65 of this second-stage fly-eye lens, there is formed an image of a group of many light source images formed on that portion of the exit surface of the first-stage fly-eye lens 9 (FIG. 1) which appears within the aperture of the variable stop 10. That is, the image formed on each of the exit surfaces of the individual lens elements 65 comprises a lot of tiny light source images uniformly distributed within an area of a circular shape, for example.

Therefore, the light source images formed on the exit surface of the mosaic fly-eye lens 14 are tiny light source images distributed within a circular area 64 which, if it is illustrated by its projection onto the end surface of the first lens bundle 14a, is centered to the center 63 of each lens element 61 as shown in FIG. 3(b). The circular area 64 is so shaped, because its shape has to be similar to the shape of the aperture of the variable stop shown in FIGS. 2(a) and 2(b). It is noted that since the lens element 61 of the first lens bundle 14a used in this embodiment has a cross section of an elongate rectangular shape, a large aperture of the variable stop 10 results in the (projected) circular area 64 not confined in the end surface of each lens element 61. Therefore, if a single fly-eye lens composed of only one lens bundle which comprises a plurality of lens elements having the same cross section as the lens element 61 were used in place of the mosaic fly-eye lens 14, some of the light source images would not be formed, because the positions on which they should fall could not be on the end surface area of each lens element. This would result in a reduced illumination efficiency.

In contrast, the mosaic fly-eye lens 14 used in this embodiment includes a second lens bundle 14b disposed just behind the first lens bundle 14a, the second lens bundle 14b comprises a plurality of lens elements 65 having a cross section of a nearly perfect square shape as shown in FIG. 3(c), and the light source images formed are distributed within a circular area 64 centered to the center 67 of each lens element 65. Because the cross section of the lens element 65 is nearly perfectly square, the entire region of the circular area 64 is almost confined in the cross section of the lens element 65 even if the aperture of the variable stop 10 (FIGS. 2(a) and 2(b)) is set to be large. Thus, a number of the light source images to be formed but not actually formed due to the eclipse is reduced, resulting in an improvement in the illumination efficiency. A large number of light source images formed on the exit surface of the mosaic fly-eye lens 14 in this manner emit a corresponding large number of light beams, which are mingled together and used for illumination, so that high uniformity is achieved in the illumination distribution on the reticle as well as on the wafer.

Referring again to FIG. 1, the second lens bundle 14b of the mosaic fly-eye lens 14, i.e., the lens bundle disposed closer to the reticle than the other, is provided with an adjustment unit 15 for shifting the lens bundle 14b in directions perpendicular to the optical axis AX1 as well as for tilting (or swinging) it within a predetermined range. In this embodiment, the adjustment unit 15 is used to adjust the shift and/or the tilt (or swing) of the lens bundle 14b so as to compensate for any errors in the telecentricity of the illumination optical system. For example, upon a replacement of the mercury-vapor lamp 1 or a reselection of illumination conditions (such as a change between an ordinary illumination method and a modified illumination method), the operation of the adjustment unit 15 is controlled by the main control system 19 so as to automatically correct the telecentricity.

As shown in FIG. 1, there is provided near the exit surface of the mosaic fly-eye lens 14 an illumination-system-aperture-stop disk 16 having a plurality of illumination system apertures of different types.

Figure 4:
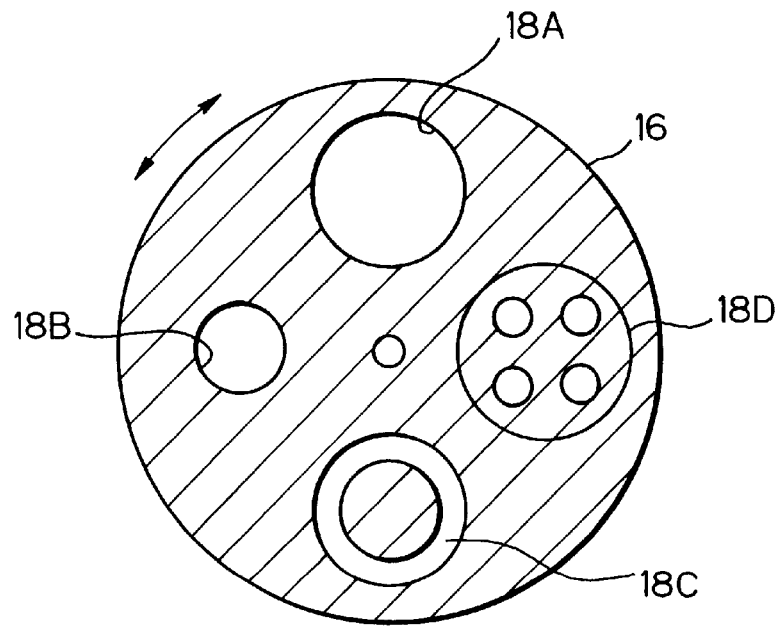
FIG. 4 shows an illumination-system-aperture-stop disk having a plurality of illumination-system-aperture-stops arranged thereon.

FIG. 4 shows the illumination-system-aperture-stop disk 16, which has four aperture stops arranged at positions angularly spaced from each other with equal angular intervals. They are an aperture stop 18A comprising an ordinary circular opening, an aperture stop 18B comprising a smaller circular opening for providing a reduced coherence factor or σ-value, an aperture stop 18C comprising a ring-shaped opening for use in the annular illumination method, and an aperture stop 18D comprising a plurality of small openings arranged on an circle centered to the nominal position of this aperture stop for use in the modified illumination method. The illumination-system-aperture-stop disk 16 may be rotated to select any one of the four aperture stops to be used.

Referring again to FIG. 1, the main control system 19 controls the angular position of the illumination-system-aperture-stop disk 16 by means of an illumination-system-aperture-stop drive unit 17 including a drive motor. The mosaic fly-eye lens 14 emits an illumination beam IL, which passes the selected one of the aperture stops of the illumination-system-aperture-stop disk 16 into a beam splitter 31 having a transmittance of about 98%. The illumination beam, having passed through the beam splitter 31, passes through a first relay lens 34 to reach a movable blind (or variable field stop) including two movable blades 35A and 35B. This movable blind is indicated in the following by the designation "movable blind 35A, 35B". The movable blind 35A, 35B is positioned to lie in a Fourier transform plane of the exit surface of the mosaic fly-eye lens 14. That is, the movable blind 35A, 35B is positioned in a plane optically conjugate to the plane of the pattern bearing surface of the reticle R described below. There is disposed behind and close to the movable blind 35A, 35B a fixed blind 37 having an aperture of a fixed geometry.

The fixed blind 37 comprises a mechanical field stop having a rectangular aperture which may be defined by, for example, four knife edges surrounding the rectangular aperture. The rectangular aperture serves to define the geometry of the slit-like illumination area on the reticle. That is, the illumination beam IL is trimmed by the movable blind 35A, 35B and/or the fixed blind 37, then passes through a second relay lens 38 and a condenser lens 39, is reflected by a mirror 40, and illuminates the slit-like illumination area 41 on the reticle R with a uniform illumination distribution.

However, because the fixed blind 37 is positioned in a plane which is slightly displaced or defocused from a plane optically conjugate to the plane of the pattern bearing surface of the reticle R, the illuminance distribution in the periphery of the slit-like illumination area 41 on the reticle R is not uniform, but the illuminance in the periphery gradually decreases toward the edge with a certain gradient. In addition, the movable blind 35A, 35B serves to prevent the slit-like illumination area 41 from entering those areas on the reticle R which are not to be illuminated, which would otherwise occur during the start and the end of the scanning exposure operation. For this purpose, the movable blades 35A and 35B are supported by means of slide units 36A and 36B, respectively, for opening/closing movement. The slide units 36A and 36B compose a movable blind drive unit whose operation is controlled by the stage control system 46.

An image of that portion of the pattern on the reticle R which is then confined in the illumination area 41 is projected onto the surface of the wafer W and in a slit-like exposure field 47 on the wafer W. This projection is performed through an exposure lens system PL having a magnification ratio β (the value of β may be ¼ or ⅕, for example). In order to specify positions and directions in the disclosed arrangement, we use here a three-dimensional rectangular coordinate system with X-, Y- and Z-axes. The Z-axis extends in parallel to the optical axis of the projection optical system PL. The X-axis extends in the direction in which the reticle R and the wafer W are scanned during the scanning exposure operation (this is the "scanning direction"). As the result, the Y-axis extends in the so-called "non-scanning direction", which is parallel to the plane determined by the surface of the reticle R or the wafer W and perpendicular to the scanning direction. In this embodiment, the reticle R is held on a reticle scanning stage 42 which, in turn, is supported on a reticle base 43 for translation in the X-direction. The wafer W is held on a wafer stage 48 which is movable in the X-direction for carrying out the scan of the wafer W as well as in the Y-direction for positioning the wafer W. The wafer stage 48 further includes a Z-stage incorporated therein for positioning the wafer W in the Z-direction.

The reticle scanning stage 42 and the wafer stage 48 compose a stage drive unit, whose operation is controlled by the stage control system 46. During the scanning exposure operation, the stage control system 46 operates the reticle scanning stage 42 to move the reticle R in the +X-direction (or in the −X-direction) relative to the illumination area 41 at a specified velocity $V_R$ for scanning, while in synchronism therewith operates the wafer stage 48 to move the wafer W in the −X-direction (or in the +X-direction) relative to the exposure field 47 at a corresponding velocity $V_W$ (=β*$V_R$) for scanning a specified one of the shot areas on the wafer W. During these movements of the reticle R and the wafer W, the pattern on the reticle R is serially transferred onto the shot area by exposure. In addition, during the scanning exposure operation, the stage control system 46 operates the slide units 36A and 36B to control the position of the movable blind 35A, 35B. This control is performed in the manner as described below in detail with reference to FIGS. 6(a) to 6(c).

Figure 6A:
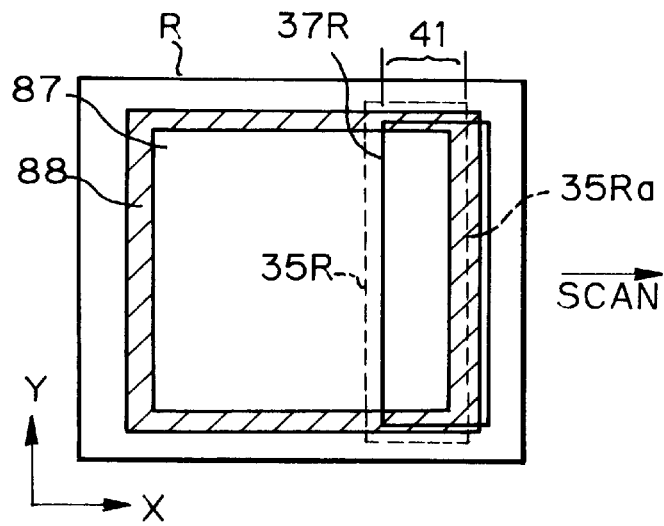
FIGS. 6(a)–6(c) are schematics illustrating the operation of a movable blind when a scanning exposure operation is performed in the projection exposure apparatus of FIG. 1.
Figure 6B:
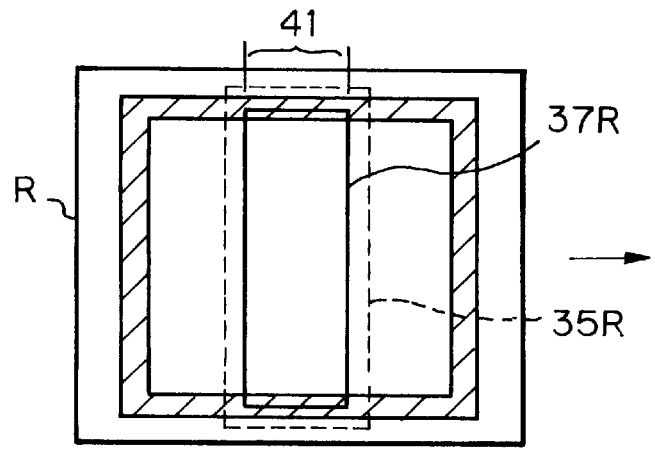
Figure 6C:
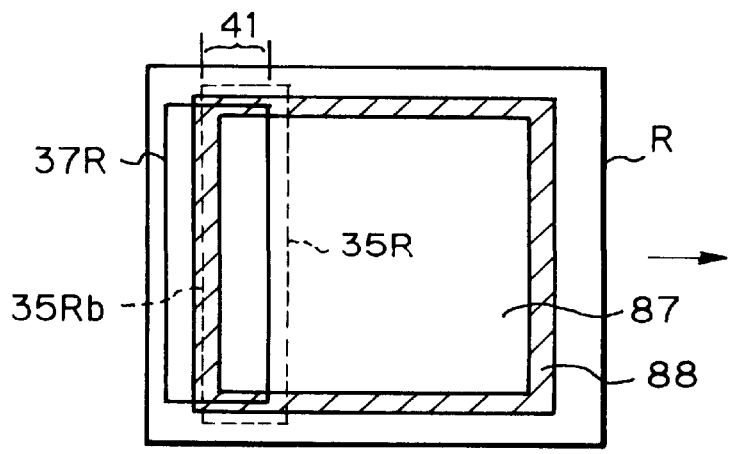

FIG. 6(a) shows the reticle R at the start of the scanning exposure operation. As shown, the reticle R has a shading band 88 formed thereon, which is of a rectangular ring shape and surrounds the central, pattern area 87 of the reticle R. In FIG. 6(a), the fixed-blind-imaging-area 37R (i.e., the area corresponding to the image of the aperture of the fixed blind 37 (FIG. 1) which would be formed on the reticle R if the movable blades were retracted) extends out of the outer boundary of the shading band 88. Therefore, in order to prevent undesirable exposure of the area not to be exposed, one movable blade 35B (FIG. 1) is moved such that the movable-blind-imaging-area 35R (i.e., the area corresponding to the image of the aperture of the movable blind 35A, 35B (FIG. 1) which would be formed on the reticle R if the fixed blind did not exist) may have its trailing edge 35Ra confined within the width of the shading band 88. Then, at the midway of the scanning exposure operation, when both of the leading and trailing edges of the fixed-blind-imaging-area 37R will lie in the pattern area 87 as shown in FIG. 6(b), the movable-blind-imaging-area 35R is set to include the entire fixed-blind-imaging-area 37R. Then, at the end of the scanning exposure operation, when a part of the fixed-blind-imaging-area 37R extends out of the outer boundary of the shading band 88 as shown in FIG. 6(c), the other movable blade 35A (FIG. 1) is moved such that the leading edge 35Rb of the movable-blind-imaging-area 35R may be confined within the width of the shading band 88. In this manner, the slit-like illumination area 41 on the reticle R is prevented from extending out of the outer boundary of the shading band 88, so that any undesirable exposure of the wafer W may be prevented.

FIG. 1 also shows an illuminance unevenness sensor 49 disposed on the wafer stage 48 and at a position near the wafer W. The illuminance unevenness sensor 49 comprises a photodetector having a photosensitive surface positioned at the level of the photosensitized surface of the wafer W, and produces a detection signal which is supplied to the main control system 19. There is also disposed on the wafer stage 48 a reference mark plate 50 used for the reticle alignment. The reference mark plate 50 has a reference mark 50a formed thereon, which comprises an aperture pattern. The reticle R has an alignment mark formed thereon, which is a mark corresponding to the reference mark 50a. When one reticle has been replaced with another, the reference mark plate 50 is moved into the effective exposure field of the projection optical system PL, and the reference mark 50a on the reference mark plate 50 is illuminated from the bottom side of the latter by an illumination light having the same wavelength band as the illumination beam IL. Using this illumination light, the images of the reference mark 50a and the alignment mark on the reticle R are observed through a mirror 45 disposed above the reticle R and by means of a reticle alignment microscope 44. Then, the observation is used to achieve the alignment of the reticle R with the reference mark plate 50.

Further, the reference mark plate 50 has another reference mark formed thereon, which is used to perform the focus calibration. A detection system for the focus calibration is disposed under this reference mark.

Figure 5A:
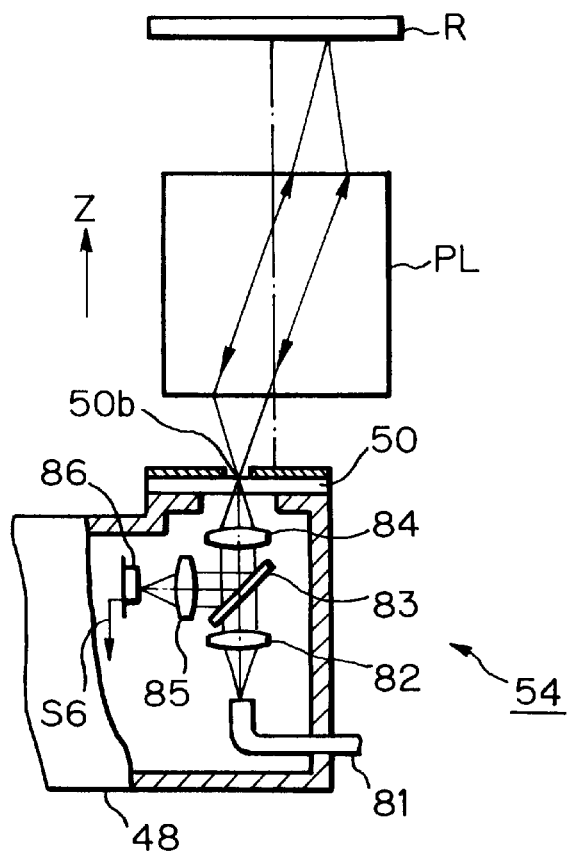
FIG. 5(a) shows relevant parts of a mechanism for making a focus calibration.

FIG. 5(a) shows the reference mark and the detection system for the focus calibration. As shown, the reference mark plate 50 has an opaque film attached on the top surface thereof, and the reference mark 50b comprises an aperture formed in the opaque film and having a cross shape, for example. The detection system 54 is disposed just under the reference mark 50b. The reference mark 50b is used to determine the image forming plane of the projection optical system PL in the manner described below. That is, in the detection system 54, illumination light rays having the same wavelength band as the illumination beam IL of FIG. 1 are directed through a bundle of optical fibers 81 into the inner space of the wafer stage 48 and emitted at the tip end of the optical fiber bundle 81 to pass through a collimator lens 82, a semitransparent mirror 83, and then a condenser lens 84, so as to illuminate the reference mark 50b from the bottom side of the reference mark plate 50. Some of the light rays pass through the reference mark 50b and form an image of the reference mark 50b on the pattern bearing surface of the reticle R by means of the projection optical system PL, and the reflected light rays from the pattern bearing surface return through the projection optical system PL to the reference mark 50b. Then, some or all of the return light rays pass through the reference mark 50b into the detection system 54, and then pass through the condenser lens 84, are reflected by the semitransparent mirror 83, and pass through another condenser lens 85 into a photodetector 86.

Figure 5B:
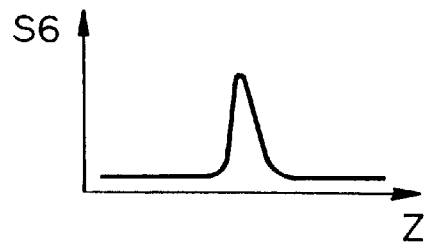
FIG. 5(b) shows a waveform of a detection signal obtained by the mechanism of FIG. 5(a)

The photodetector produces a detection signal (an electrical signal obtained by the photoelectric conversion) S6, which is supplied to the main control system 19 of FIG. 1. By driving the Z-stage incorporated in the wafer stage 48 so as to continuously change the Z-direction position (or the height) of the reference mark 50b, the level of the detection signal S6 varies as illustrated by the curve shown in FIG. 5(b). The curve has a peak, at which the Z-coordinate of the reference mark 50b is coincident with the image forming plane of the projection optical system PL. Thus, the position of the image forming plane of the projection optical system PL can be determined from the shape of the detection signal S6. Once this position is determined, exposure operations can be made under good conditions by bringing the photosensitized surface of the wafer W to the determined position. In this manner, the calibration of the position of the image forming plane of the projection optical system PL (i.e., the focus calibration) is achieved by using the reference mark 50b of the reference mark plate 50.

Referring again to FIG. 1, the beam splitter 31 having a transmittance of about 98% reflects a small portion of the received illumination beam, called the leakage light. The leakage light passes through the condenser lens 32 into a photosensitive surface of an integrator sensor 33 which comprises a photodetector. The photosensitive surface of the integrator sensor 33 is positioned in a plane optically conjugate to the plane of the pattern bearing surface of the reticle R as well as to the plane of the photosensitized surface of the wafer W. The integrator sensor 33 produces a detection signal (an electrical signal obtained by the photoelectric conversion), which is supplied to the exposure control system 20 and the power supply system 22.

When the aperture stop 18C for annular illumination method or the aperture stop 18D for modified illumination method is selected by rotating the illumination-system-aperture-stop disk 16 to bring that aperture stop to the position just behind the exit surface of the second fly-eye lens 14, the incident angles of the leakage light rays must be relatively large since the plane of the photosensitive surface of the integrator sensor 33 is conjugate to the plane of the wafer surface to be exposed. Therefore, a non-negligible error in the sensitivity of the integrator sensor 33 may occur due to the large incident angles. In order to reduce such sensitivity error, a diffuser plate may be provided at an appropriate position, such as just in front of the photosensitive surface of the integrator sensor 33 or in a plane conjugate to the plane of the wafer surface, so that the integrator sensor 33 may receive the light beam diffused by the diffuser plate.

The exposure control system 20 is connected with a memory 21 which stores information such as scale factors used to determine the exposure energy on the wafer W based on the output signal of the integrator sensor 33. In this embodiment, the output signal of the integrator sensor 33 is calibrated using, for example, a predetermined reference illuminometer, and the memory 21 further stores correction factors used to correct the output signal of the integrator sensor 33 based on the calibration results.

Because the photosensitive surface of the integrator sensor 33 is positioned in a plane conjugate to the plane of the pattern bearing surface of the reticle R, the detection signal from the integrator sensor 33 will not produce errors even when the illumination-system-aperture-stop disk 16 is rotated to replace an illumination-system-aperture-stop with another having a different shape. Alternatively, the photosensitive surface of the integrator sensor 33 may be positioned in an observation plane substantially conjugate to the Fourier transform plane of the pattern bearing surface of the reticle R with respect to the projection optical system PL (i.e., this Fourier transform plane is the pupil plane), so that the entire light rays passing through the observation plane may be received by the integrator sensor 33.

Moreover, in this embodiment, a condenser lens 52 and a wafer reflectance monitor 53 comprising a photodetector are disposed in the opposite side of the beam splitter 31 (whose transmittance is about 98%) to the integrator sensor 33. The wafer reflectance monitor has a photosensitive surface brought to a plane conjugate to the plane of the wafer surface by means of the condenser lens 52. A portion of the illumination beam passing through the reticle R and illuminated through the projection optical system PL onto the wafer W is reflected by the wafer W and return back through the projection optical system PL and the reticle R into the wafer reflectance monitor 53, which supplies a detection signal (an electrical signal obtained by the photoelectric conversion) to the main control system 19. The main control system 19 determines the quantity of light (power) of the illumination beam passing through the projection optical system PL, using the quantity of light of the illumination beam IL illuminated through the reticle R, and the quantity of light of the light rays reflected by the wafer surface which is calculated from the detection signal produced from the wafer reflectance monitor 53. Further, the main control system 19 derives the thermal energy as the product of thus determined quantity of light and the length of the exposure time, and uses the thermal energy to estimate the thermal expansion which would be caused in the projection optical system PL, so as to derive the possible variations in the image forming characteristics, such as distortions, of the projection optical system PL which would be caused by the estimated thermal expansion. Then, the main control system 19 corrects the image forming characteristics of the projection optical system PL through an image forming characteristics correction unit (not shown) operatively connected to the projection optical system PL, so as to restore the characteristics.

Figure 7:
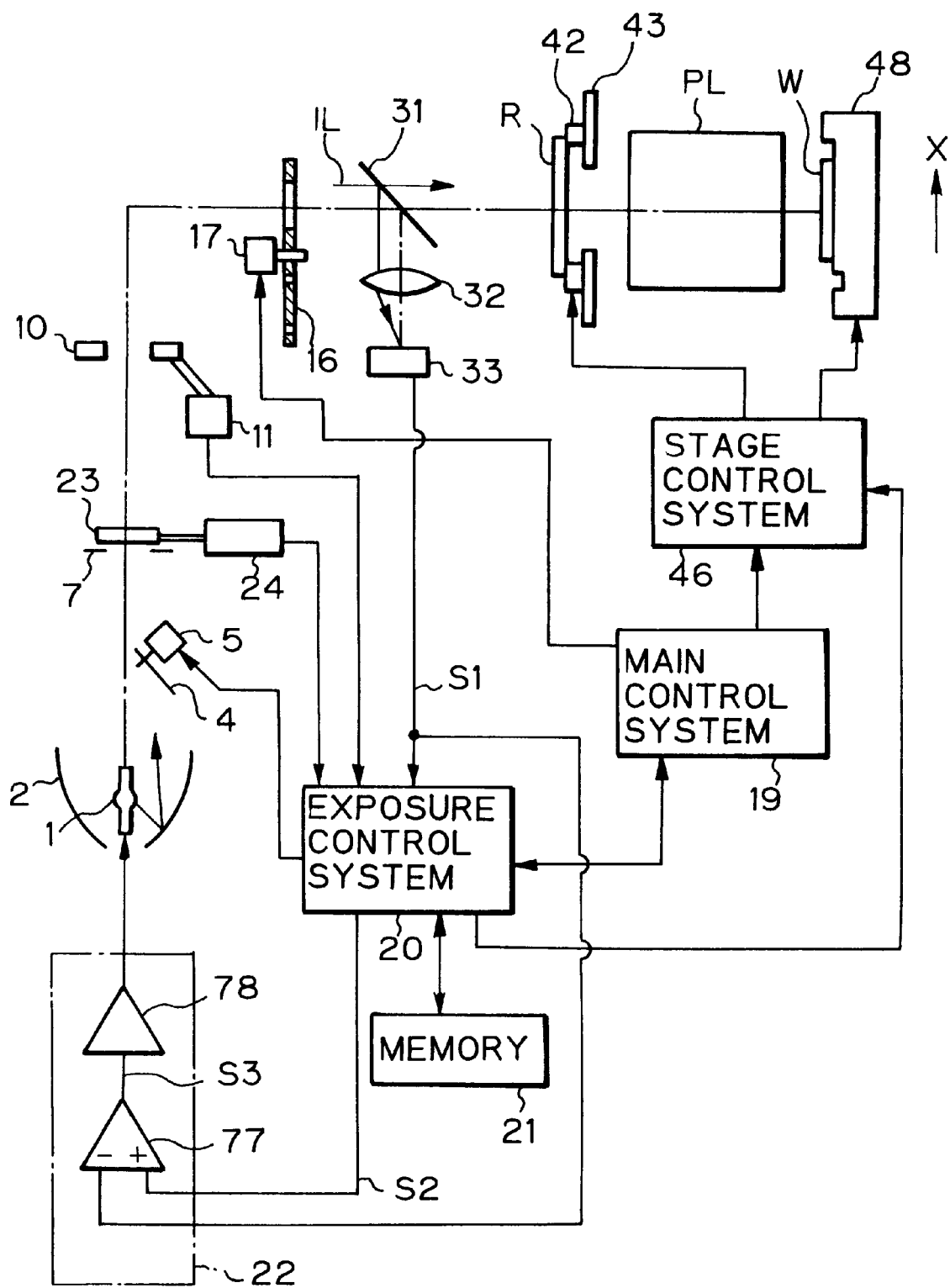
FIG. 7 is a block diagram showing an exposure control mechanism of FIG. 1.

Next, the exposure control mechanism which forms a part of the illuminance control mechanism in this embodiment will be described in detail. FIG. 7 shows the exposure control mechanism in this embodiment extracted from FIG. 1. As shown in FIG. 7, the illuminance detection signal S1 (i.e., the detection signal from the integrator sensor 33) is supplied to the exposure control system 20 and the power supply system 22 for the mercury-vapor lamp 1. The exposure control system 20 includes a digital-to-analog converter for sampling the illuminance detection signal S1 at a predetermined high sampling frequency. Also, the exposure control system 20 is supplied by the main control system 19 with information about the desired accumulated exposure to be applied to the wafer W. Further, as previously mentioned, the memory 21 stores the scale factors used to determine the actual exposure (i.e., the exposure energy per unit time) on the wafer W based on the value of the illuminance detection signal S1, so that the exposure control system 20 is capable of recognizing the exposure on the wafer W from the illuminance detection signal S1.

The exposure control system 20 establishes conditions for achieving the desired accumulated exposure prior to the start of the scanning exposure operation. As apparent from FIG. 7, the exposure per unit area (or the illuminance) e on the wafer W is expressed as:

$$e = k^* p^* q_1^* q_2 \qquad (1)$$

where:
p stands for the output power of the mercury-vapor lamp 1;
$q_1$ stands for the transmittance established by the dimmer plate 23;
$q_2$ stands for the transmittance established by the variable stop 10; and
k stands for a coefficient depending on the type of the illumination-system-aperture-stop used.

The accumulated exposure $\Sigma E$ on the wafer W can be expressed using the above equation (1) as:

$$\Sigma E = e^*(D/V_W) = k^* p^* q_1^* q_2^*(D/V_W) \qquad (2)$$

where:
D stands for the width of the slit-like exposure field 47 measured in the scanning direction; and
$V_W$ stands for the scanning velocity, i.e., the velocity of the wafer stage 48 in the X-direction when it is moved for the scanning exposure operation.

It is assumed here that the width D of the exposure field 47 in the scanning direction is fixed or constant. Then, the accumulated exposure $\Sigma E$ may be controlled to a specified, desired accumulated exposure (corresponding to the sensitivity of the photoresist on the wafer W) $\Sigma E_0$ by adjusting one of, or simultaneously adjusting some of the following: the output power p of the mercury-vapor lamp 1; the transmittance $q_1$ established by the dimmer plate 23; the transmittance $q_2$ established by the variable stop 10; and the velocity $V_W$ of the wafer stage 48 for scanning. Therefore, in the arrangement of FIG. 7, in order to cause the accumulated exposure $\Sigma E$ to converge to the specified, desired accumulated exposure $\Sigma E_0$, the exposure control system 20 supplies the power supply system 22 with the desired illuminance signal S2 corresponding to the desired output power of the mercury-vapor lamp 1, operates the dimmer plate drive unit 24 (FIG. 1) to select the transmittance $q_1$ to be established by the dimmer plate 23, operates the changer unit 13 to select the transmittance $q_2$ to be established by the variable stop 10, as well as operates the stage control system 46 to select the velocity $V_W$ of the wafer stage 48 for scanning. The velocity $V_R$ of the reticle stage 42 for scanning is dependent on the velocity $V_W$ of the wafer stage 48 and is automatically selected to $-V_W/\beta$, where $\beta$ is the projection magnification ratio of the projection optical system PL from the reticle R to the wafer W.

Also, during the scanning exposure operation, the exposure control system 20 derives the average value of a predetermined number of measured values of the illuminance detection signal S1 sampled at a high sampling rate, calculates the actual exposure on the wafer W from the average value, and corrects, if necessary, the value of the desired illuminance signal S2 such that a calculated exposure equal to the desired exposure may be obtained. This control mode, in which the output luminous power of the mercury-vapor lamp 1 is controlled based on the detection results of the integrator sensor 33 so as to keep the illuminance on the wafer W at a constant level, is referred to as the "constant-illuminance-control mode".

In this embodiment, the power supply system 22 comprises a differential amplifier 77 and a power amplifier 78. The differential amplifier 77 has a noninverting input to which the desired illuminance signal S2 is inputted and an inverting input to which the illuminance detection signal S1 from the integrator sensor 33 is inputted. The differential amplifier 77 has a selected gain such that it generates a light source drive signal S3 to make the illuminance detection signal S1 equal to the desired illuminance signal S2. The light source drive signal S3 is amplified by the power amplifier 78, which produces the electric power (or voltage) so that the mercury-vapor lamp 1 light up. The integrator sensor 33 produces an electrical signal which is obtained by the photoelectric conversion and corresponds to the output luminous power of the mercury-vapor lamp 1.

As described, in this embodiment, the exposure control is performed during the scanning exposure operation in constant-illuminance-control mode. In this mode, however, the actual (measured) illuminance often may deviate from the desired illuminance because of the low resolution in the power to be supplied from the power supply system 22 to the mercury-vapor lamp. More particularly, the mechanical dimmer system of FIG. 7 utilizes the dimmer plate 23 and the variable stop 10 for controlling the illuminance of the illumination beam from the mercury-vapor lamp 1, with the control range of the combined transmittance $q_1^* q_2$ being 100% to 20% and the resolution in the combined transmittance $q_1^* q_2$ being about ±5%. Thus, first, the exposure control system 20 selects the output power p of the mercury-vapor lamp 1 to an initial power level $p_0$ which is slightly smaller than its rated output power, and then uses the mechanical dimmer system to make the illuminance e on the wafer as expressed equation (1) above to a value as close to the value of the desired illuminance $e_0$ as possible. The value of the desired illuminance $e_0$ is selected such that when the scanning velocity $V_W$ of the wafer stage 48 is selected to a predetermined initial value $V_{W0}$ the accumulated exposure $\Sigma E$ calculated by equation (2) is equal to the desired accumulated exposure $\Sigma E_0$. Therefore, the following equation stands:

$$\Sigma E_0 = e_0^*(D/V_{W0}) \qquad (3)$$

The power supply system 22 thereafter powers the mercury-vapor lamp 1 under such an illuminance control as to keep the level of the illuminance detection signal S1 produced from the integrator sensor 33 at the level of the desired illuminance signal S2, with the control range of the illuminance control being 100–70% and the resolution in the illuminance control being about 0.1%. Thus, although the exposure control system 20 use the illuminance detection signal S1 from the integrator sensor 33 to calculate the actual illuminance e on the wafer W, and adjusts the desired illuminance signal S2 such that the calculated illuminance e is maintained to be equal to the desired illuminance $e_0$, the illuminance e actually measured has an error $\Delta e$ of about 0.1% from the desired illuminance $e_0$. This error $\Delta e$ is modified by adjusting the scanning velocities of the reticle scanning stage 42 and the wafer stage 48.

For this purpose, the exposure control system 20 modifies the set point for the velocity $V_{W0}$ in the stage control system 46 so as to change the scanning velocity of the wafer stage 48 from the initial value $V_{W0}$ by increasing it by $\Delta V_W$ to realize the equation:

$$\Sigma E_0 = (e_0 + \Delta e)^* D / (V_{W0} + \Delta V_W) \qquad (4)$$

Thus, the correction value $\Delta V_W$ is expressed as follows:

$$\Delta V_W = (e_0 + \Delta e)^* D / \Sigma E_0 - V_{W0} \qquad (5)$$

As apparent, the scanning velocity $V_R$ is corrected according to the above correction of the scanning velocity of the wafer stage 48.

In summary, according to this embodiment, if there is any residual error $\Delta e$ in the illuminance e even after the exposure control has been made in constant-illuminance-control mode, no further adjustment of the illuminance but the adjustment of the scanning velocities of the reticle scanning stage 42 and the wafer stage 48 is performed so that the accumulated exposure $\Sigma E$ is equaled to the desired accumulated exposure $\Sigma E_0$.

Figure 8:
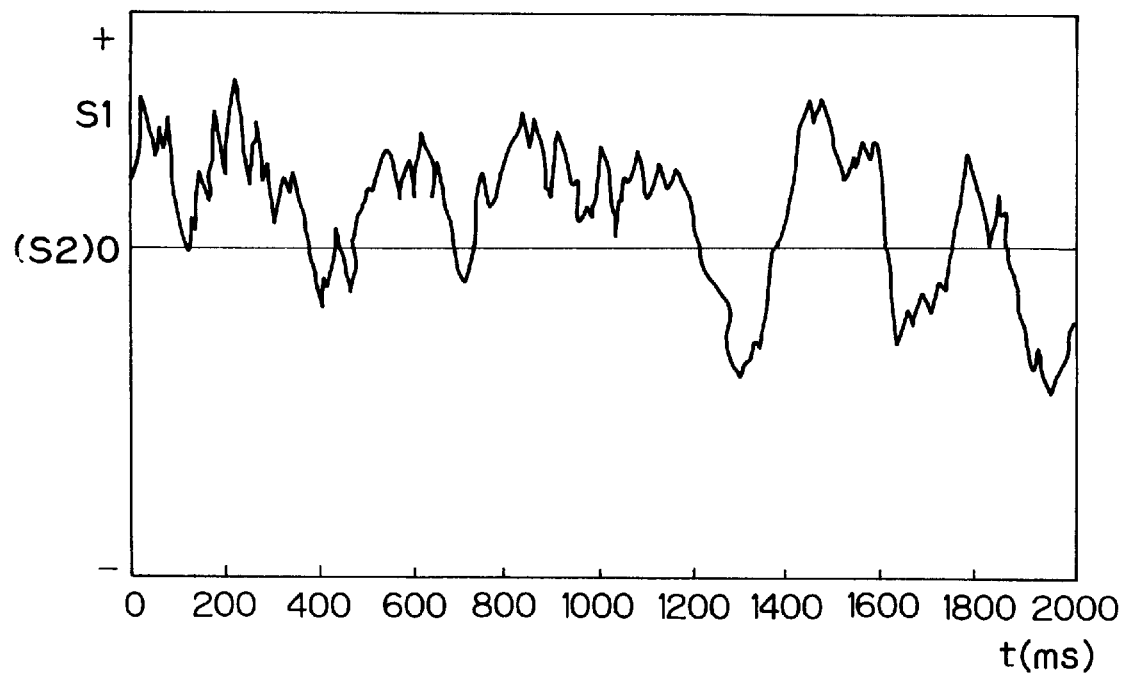
FIG. 8 shows an exemplified waveform of an illuminance detection signal S1 obtained through an integrator sensor when the power supplied to a light source is fixed at a constant level in the exposure control mechanism of FIG. 7.
Figure 9:
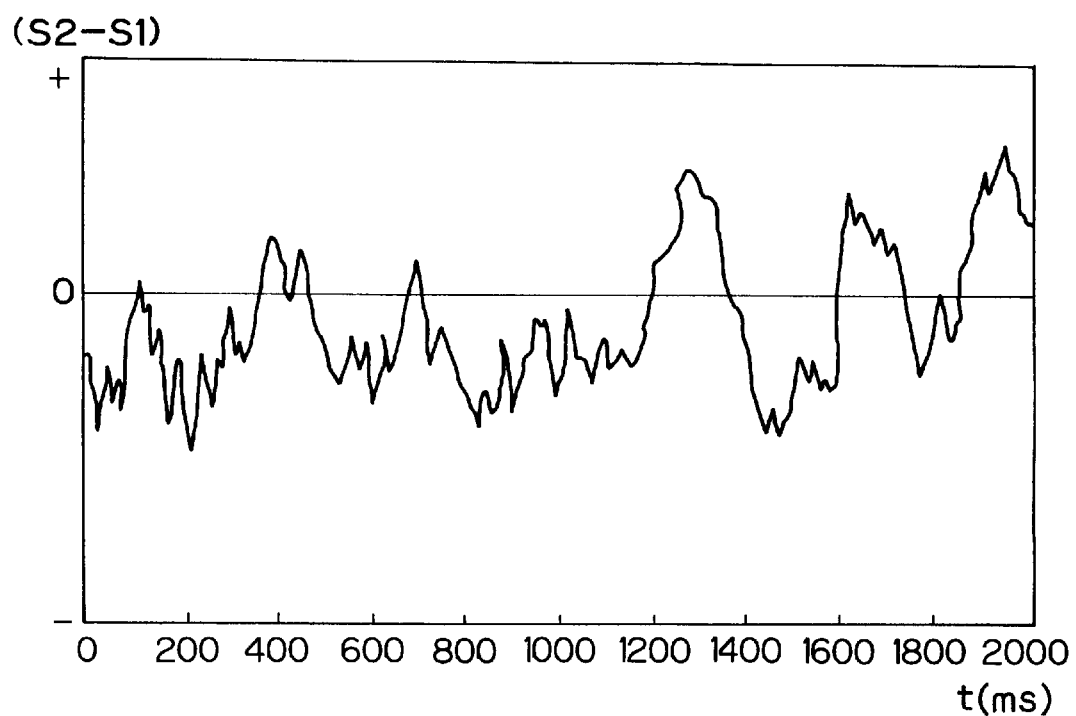
FIG. 9 shows an exemplified waveform of the difference (S2–S1) between a desired illuminance signal S2 and the illuminance detection signal S1, and thus of a desired value of a light source drive signal S3, when the illuminance detection signal S1 varies according to the waveform of FIG. 8.
Figure 10A:
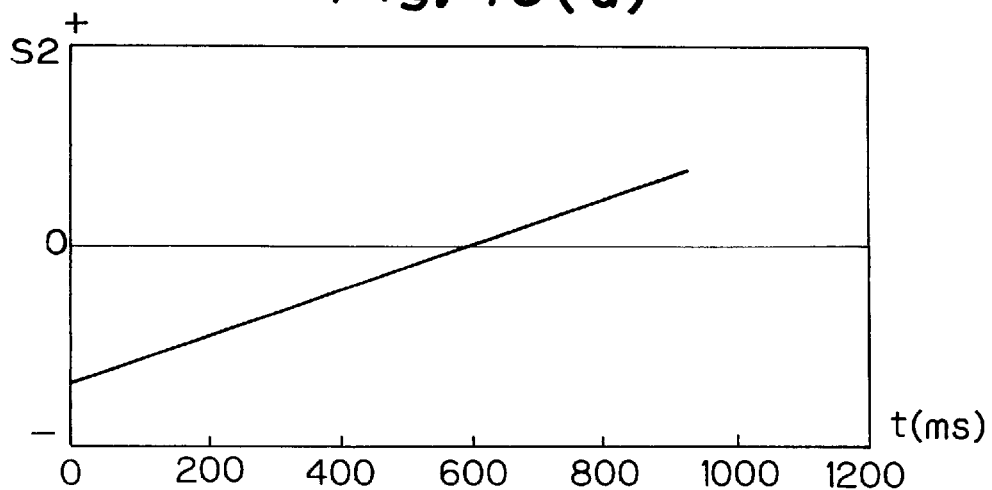
FIG. 10(a) shows an exemplified waveform of the desired illuminance signal S2 varying linearly with time t.
Figure 10B:
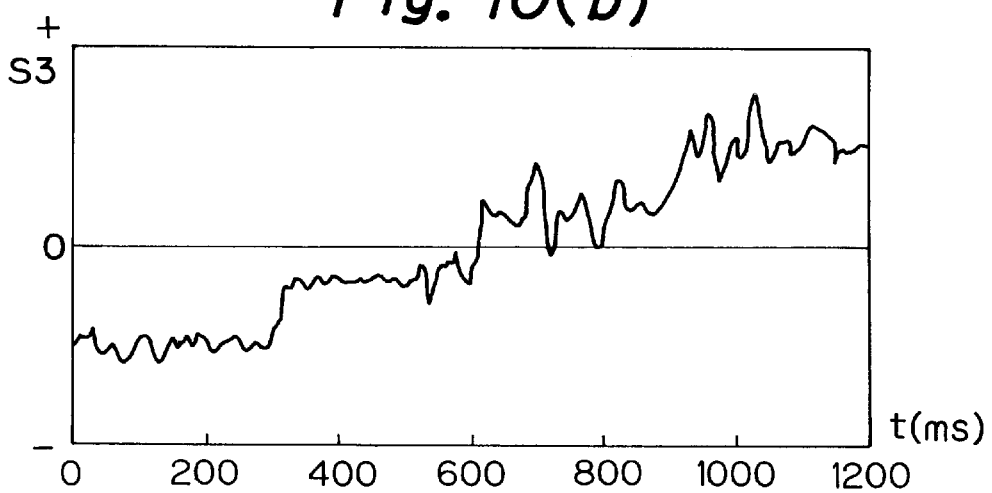
FIG. 10(b) shows an exemplified waveform of the desired value of the light source drive signal S3 when the desired illuminance signal S2 varies as shown in FIG. 10(a) for performing an exposure control in a constant-illuminance-control mode.
Figure 10C:
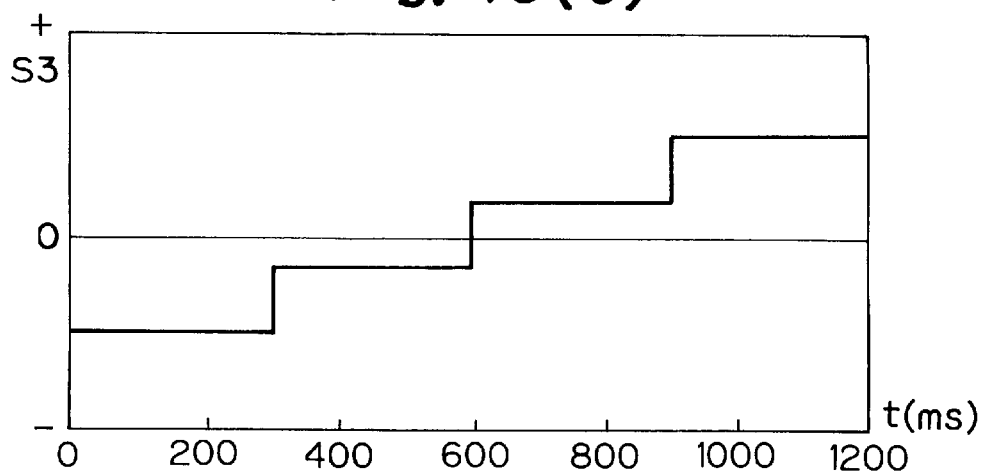
FIG. 10(c) shows an exemplified waveform of the actual light source drive signal S3 experienced during the same exposure control.

Referring next to FIGS. 8, 9, 10(*a*)–10(*c*) and 11(*a*)–11(*b*), an exemplified exposure control operation performed during the scanning exposure operation according to the present embodiment will be described.

First, in FIG. 1, the main control system 19 supplies the exposure control system 20 with information about the desired accumulated exposure on the wafer W, and in response thereto the exposure control system 20 selects the output power of the mercury-vapor lamp 1, the transmittance to be established by the dimmer plate 23, and other relevant factors. Then, the exposure control system 20 supplies the power supply system 22 with the desired illuminance signal S2 (see FIG. 7) indicating the output power which the mercury-vapor lamp 1 should be driven to generate. Then, the exposure control system 20 operates the shutter control unit 5 to open the shutter 4. In this point of time, however, the wafer W is not exposed since the movable blind 35A, 35B is closed.

Thereafter, the main control system 19 operates the stage control system 46 to start moving the reticle R and the wafer W, and when the velocities of the reticle R and the wafer W reach the desired velocities for scanning, the operation of the movable blind 35A, 35B is controlled to open, and the pattern of the reticle R is serially transferred onto the wafer W and within one of the shot areas on the wafer to be exposed.

FIG. 8 shows exemplified variations in the illuminance detection signal S1 (see FIG. 7) produced from the integrator sensor 33 when the mercury-vapor lamp 1 is driven with power at a constant level, i.e., the mercury-vapor lamp 1 is supplied with power at a predetermined constant level in the arrangement of FIG. 7, which constant level is chosen using the known relation between powers supplied to the mercury-vapor lamp 1 and illuminances of the illumination beam emitted from the mercury-vapor lamp 1 in response to the powers. In FIG. 8, change of the illuminance detection signal S1 are shown. In FIG. 8, a horizontal line designated by 0 (zero) indicates the level of the desired illuminance signal S2 (see FIG. 7) which corresponds to the illuminance expected to be established by supplying power at said constant level. In this operating condition, as shown, the illuminance detection signal S1 gradually drifts away from the desired value. This drift may be avoided by operating the differential amplifier 77 of FIG. 7.

For this purpose, the exposure control system 20 derives the average value of a number of signal values obtained by continuously sampling the illuminance detection signal S1 at a high sampling frequency, and periodically calculates the illuminance on the wafer W. If the calculated illuminance is deviated from the desired illuminance, the exposure control system 20 corrects the level of the desired illuminance signal S2. In this manner, the exposure operation is performed in constant-illuminance-control mode. FIG. 9 shows the difference (S2–S1) between the desired illuminance signal S2 and the illuminance detection signal S1 which appears across the inputs of the differential amplifier 77 in the power supply system 22 of FIG. 7 when the above operation is performed. The differential amplifier 77 generates the light source drive signal S3 serving to reduce the difference to zero, and the power amplifier 78 supplies the power to the mercury-vapor lamp 1 in accordance with the light source drive signal S3.

Unfortunately, the light source drive signal S3 has a relatively low resolution (such as about 0.1%), and the differential amplifier 77 and the power amplifier 78 have finite response speeds. Therefore, even when the desired illuminance signal S2 from the exposure control system 20 is increased as a linear function of time t, the signal representing the desired value of the light source drive signal S3 varies stepwise with fluctuations superimposed, as shown in FIG. 10(*b*). Note that FIGS. 10(*a*) and 10(*b*) shows the levels of the desired illuminance signal S2 and the light source drive signal S3 by representing them in terms of the deviations from reference values designated as zero levels. The reference value used in FIG. 10(*a*) is a predetermined reference value of the desired illuminance signal S2, and that used in FIG. 10(*b*) is the value of the light source drive signal S3 corresponding to the predetermined reference value of the desired illuminance signal.

Figure 11A:
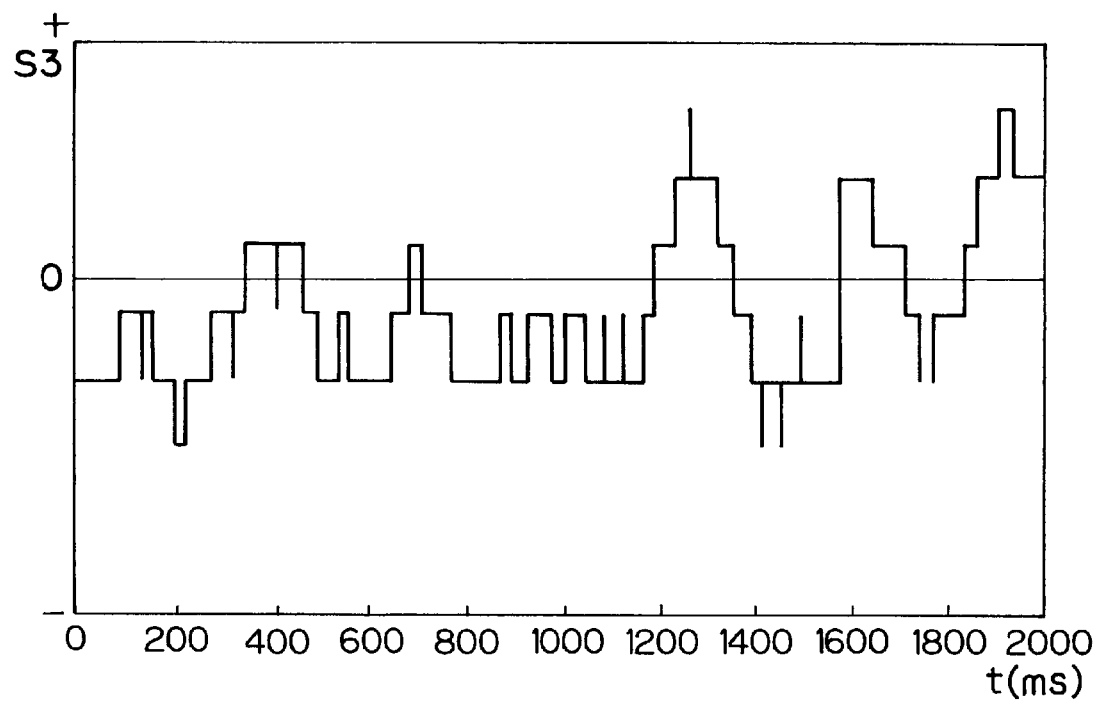
FIG. 11(a) shows an exemplified waveform of the light source drive signal S3 produced when the difference (S2–S1) varies as shown in FIG. 9.
Figure 11B:
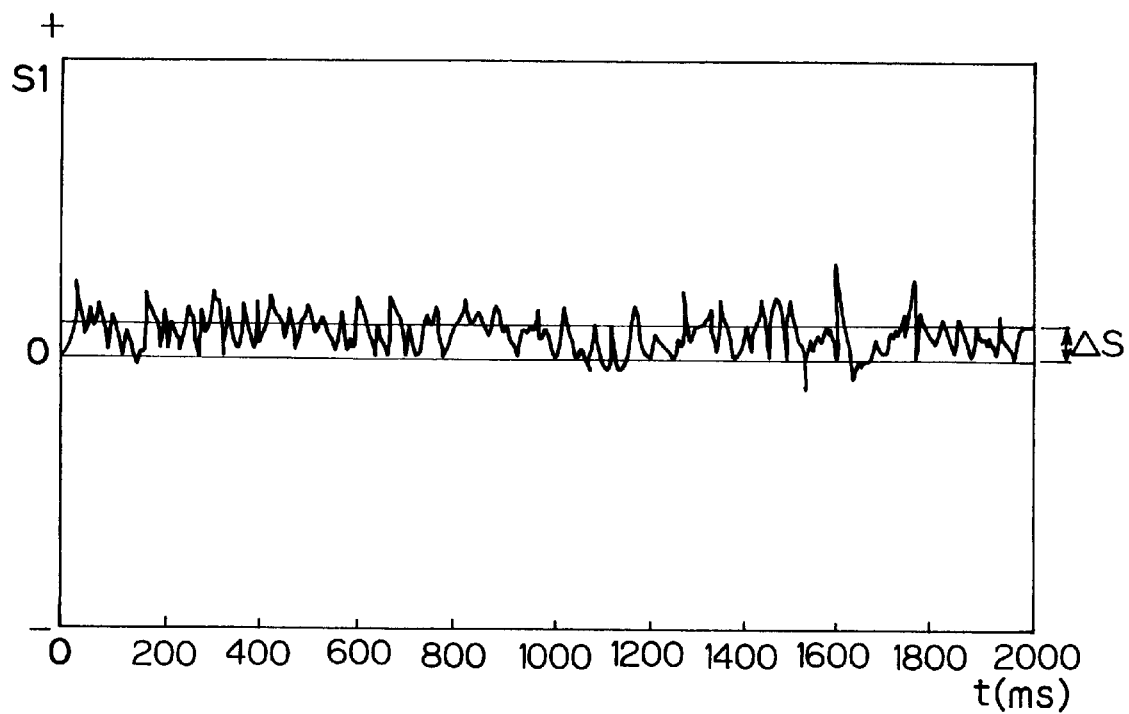
FIG. 11(b) shows an exemplified waveform of the illuminance detection signal S1 produced in response to the light source drive signal S3 of FIG. 11(a)

FIG. 10(*b*) shows the desired value of the light source drive signal S3, which produces stepwise variations due to the relatively low setting resolution in the light source drive signal S3 outputted from the differential amplifier 77 of FIG. 7. More particularly, the actual value of the light source drive signal S3 varies stepwise like a change of a digital command value as shown in FIG. 10(*c*). Therefore, the light source drive signal S3, which is outputted from the differential amplifier 77 of FIG. 7 in response to the difference (S2–S1) of FIG. 9, varies like a digital signal as shown in FIG. 11(*a*). As the result, in the illuminance detection signal S1 detected by the integrator sensor 33, those fluctuation components which are large in magnitude are reduced as shown in FIG. 11(*b*), but high frequency fluctuation components still remain because of the low response speed. Further, due to the low resolution in the light source drive signal S3, the illuminance detection signal S1 has an offset $\Delta S$ from the desired illuminance signal S2 (whose level is used as zero level of FIG. 11(*b*)). The offset $\Delta S$ causes an error $\Delta e$ in the illuminance on the wafer W. Therefore, in this embodiment, the velocity of the wafer stage 48 for scanning is controlled and varied by $\Delta V_W$ to satisfy equation (5) above. In this manner, the accumulated exposure at each point on the wafer W obtained after the scanning exposure operation can be made to fall into an acceptable range.

The error $\Delta e$ which may occur under this control method is about 0.1% of the desired value, so that the required correction in the scanning velocity is also about 0.1%, resulting in almost no change in the exposure time.

Therefore, no perceivable reduction in the throughput (i.e., the number of wafers processed per unit time) is caused by this control method.

In this method, a constant-illuminance-control mode is used to control the exposure, and any error Δe in the illuminance which remains after control in this mode will be removed by adjusting the velocities of the reticle stage and the wafer stage, so as to achieves the control of the accumulated exposure. In the case that the exposure light source is powered in constant-power-control mode, a modified method may be used in which any error Δe in the illuminance is detected and the velocities of these stages for scanning are adjusted according to the determined error Δe.

Further, the embodiment described above uses the mercury-vapor lamp as the exposure light source; however, the present invention is not limited to the use of the mercury-vapor lamp. In the case where an electric-discharge lamp (such as a xenon arc lamp) or an excimer laser is used as the exposure light source and where the setting resolution in the input power to such exposure light source is relatively low, the use of this embodiment advantageously ensures that the accumulated exposure on the wafer will fall into an acceptable range.

According to this embodiment, when the value of exposure energy which is determined by the exposure light source and the illuminance adjustment means tends to deviate from a predetermined desired value, the velocities of the mask stage and the substrate stage for scanning are adjusted according to the deviations, so that the accumulated exposure can be made to fall into an acceptable range. This provides an advantage that when the photosensitized substrate is exposed by using the scanning exposure technique, the accumulated exposure on the substrate can be made to fall into an acceptable range even if the setting resolution in the input power supplied to the exposure light source is relatively low.

Further, another advantage is provided that the amounts of adjustment in the velocities of the stages are very small, resulting in almost no change in the exposure time and thus no reduction in the throughput.

Next, an exposure apparatus according to a second embodiment of the present invention will be described with reference to the accompanying drawings. This embodiment shows another exemplified application of the present invention to a step-and-scan type of projection exposure apparatus. The exposure apparatus of the second embodiment has substantial similarities to that of the first embodiment described above, so that only the features of the second embodiment different from the first embodiment will be described in great detail.

Figure 12:
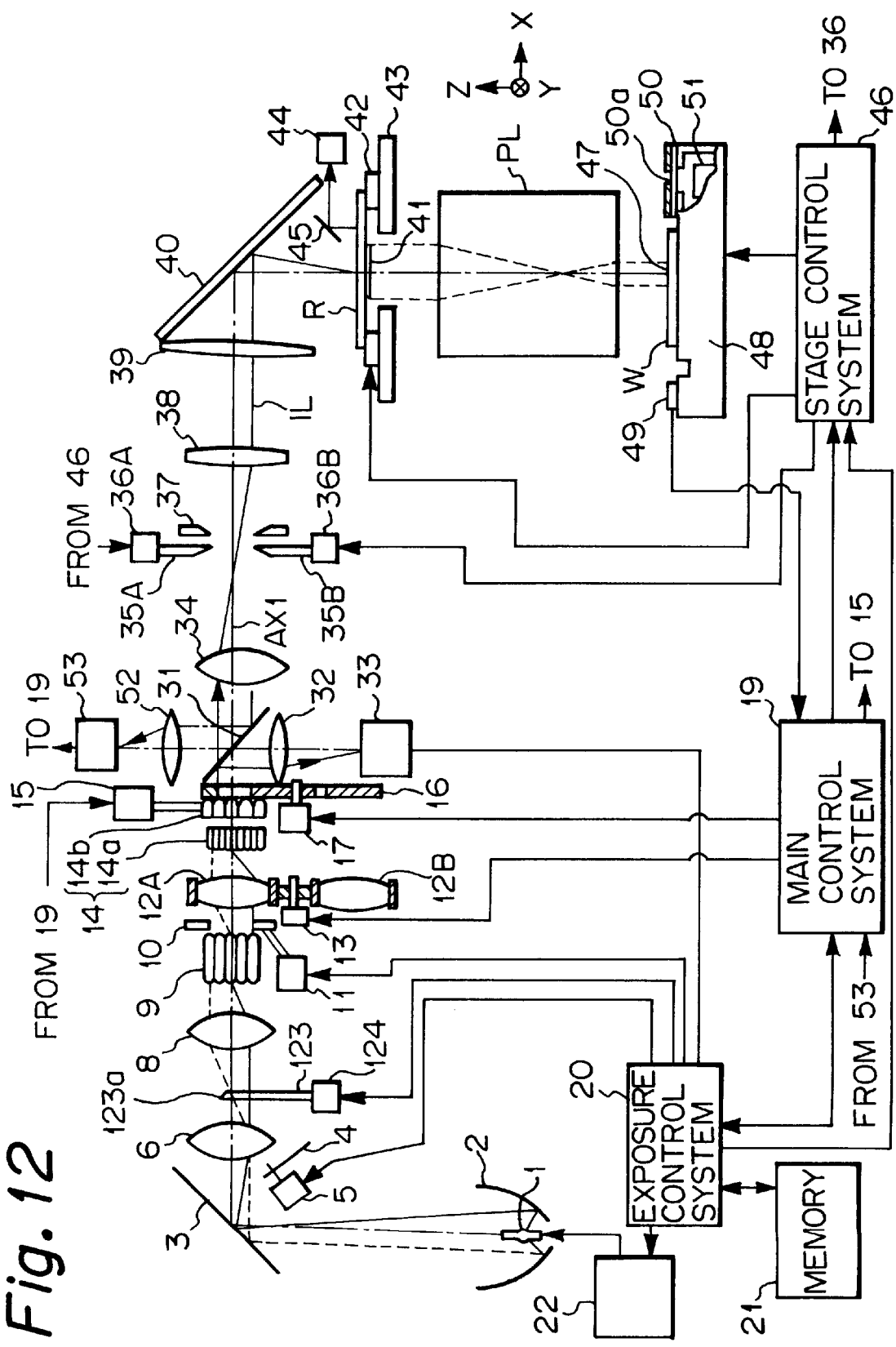
FIG. 12 is a schematic representation, partially broken away, showing a projection exposure apparatus of the scanning exposure type according to a second embodiment of the present invention.

FIG. 12 illustrates the projection exposure apparatus of the second embodiment, in which a mercury-vapor lamp 1 emits illumination light rays which are collected by an ellipsoidal mirror 2 to form an illumination beam and reflected by a mirror 3. The illumination beam reflected by the mirror 3 passes through a region where a shutter 4 is disposed which is operable to open and close by means of a shutter control mechanism 5. When the shutter 4 is open, the illumination beam is allowed to pass through it and substantially collimated by an input lens 6 to reach a position where a light adjustment rod 123 is disposed. The light adjustment rod 123 serves to adjust the quantity of light reaching the exposure field 47 on the wafer. The light adjustment rod 123 has a shading plate 123a formed at its tip end. The shading plate 123a is positioned within the region through which the light of the illumination beam travels, and is rotated by means of a rotation control unit 124 so as to control the quantity of light of the illumination beam passing through the region.

Figure 13A:
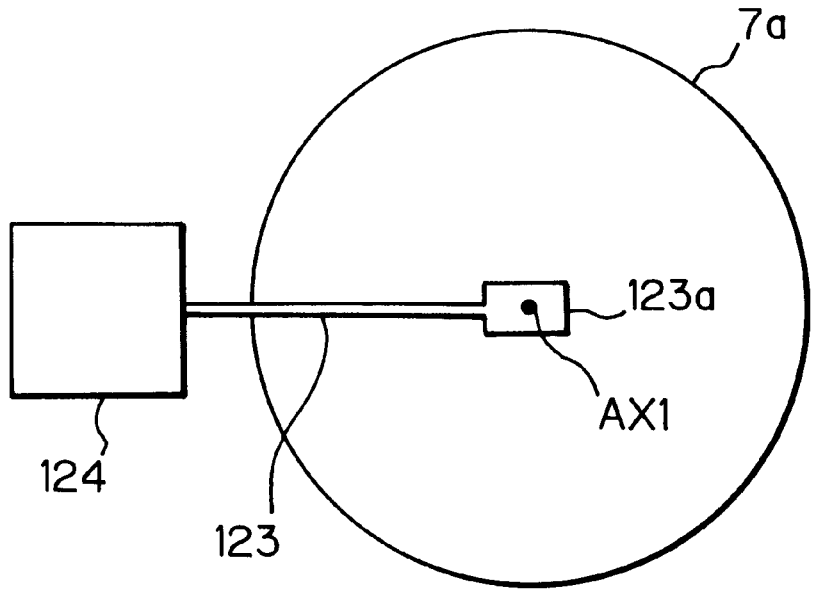
FIG. 13(a) is an enlarged elevation of a light adjustment rod and an associated rotation control unit of FIG. 12 as viewed in the direction of the optical axis.

FIG. 13(a) shows an enlarged view of the light adjustment rod 123 for adjusting quantity of light and the associated rotation control unit 124, as viewed in the direction of the optical axis AX1 of the illumination optical system, in which a circle 7a indicates the cross-section of the region through which the light of the illumination beam from the mercury-vapor lamp 1 travels. The shading plate 123a at the tip end of the light adjustment rod 123 has its center aligned with the optical axis AX1, and the light adjustment rod 123 is disposed to extend substantially perpendicular to the optical axis AX1. When the light adjustment rod 123 is rotated by the rotation control unit 124 into a position at which the shading plate 123a extends perpendicular to the travelling direction of the light of the illumination beam IL from the mercury-vapor lamp 1 as shown in FIG. 13(b), the portion of the light that is blocked by the plate 123a is maximum; and when the rod 123 is rotated into another position at which the shading plate 123a extends parallel to the travelling direction of the light of the illumination beam IL as shown in FIG. 13(c), the blocked portion of the light is minimum.

Figure 13B:
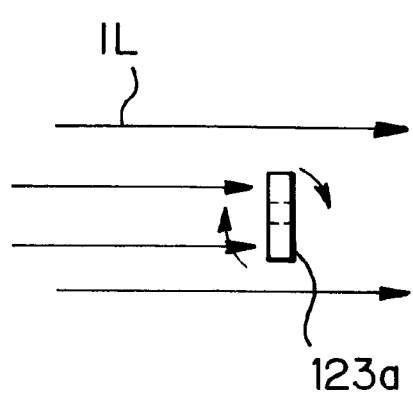
FIG. 13(b) is a side elevation showing the adjustment rod when its shading area is at maximum.
Figure 13C:
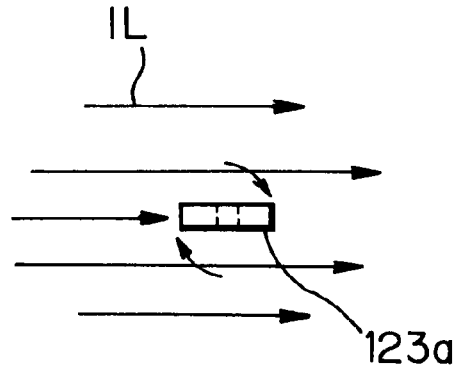
FIG. 13(c) is a side elevation showing the adjustment rod when its shading area is at minimum.

In one particular example, the shading plate 123a is designed to block about 3% of the area of the light travelling region 7a when it extends perpendicular to the light travelling direction as shown in FIG. 13(b), while about 1% of the area when it extends parallel to the light travelling direction as shown in FIG. 13(c). With this design, the shading plate 123a is formed as a member significantly light in weight, so that it may be rotated with a high response speed. In the initial condition, the shading plate 123a extends obliquely with respect to the light travelling direction so as to block about 2% of the area of the light travelling region 7a, that is, the shading plate 123a in its initial position lies near the midpoint between the positions of FIGS. 13(b) and 13(c). In constant-illuminance-control mode, the shading plate 123a is rotated under control so as to adjust the illuminance of the illumination beam. This adjustment enables the correction of the variations in the illuminance within the range of about ±1% of the normal illuminance.

Referring again to FIG. 12, this embodiment includes an exposure control system 20 which controls the operation of the rotation control unit 124 as well as the operation of the shutter control unit 5.

The illumination beam, having passed the light adjustment rod 123, then passes through a first relay lens 8, a first fly-eye lens 9, a second relay lens 12A, and then into a second fly-eye lens 14.

As with the first embodiment described above, this embodiment also includes a variable stop 10 comprising an iris diaphragm such as one shown in FIGS. 2(a) and 2(b).

Because the variable stop comprises an iris diaphragm, it may provide a wide dynamic range for the adjustment of the quantity of light of the illumination beam (for example, the dynamic range may span from the full (100%) transmittance to a transmittance of several percent). The second fly-eye lens 14 comprises a plurality of lens elements each having an individual exit surface on which the number of light source images which are formed on the exit surface of the first fly-eye lens 9 and appear in the aperture of the variable stop 10 disposed close to the exit surface. That is:
(The number of the light source images formed on the exit surface of the second fly-eye lens 14)=(The number of the lens element of the second fly-eye lens 14)×(The number of the light source images appearing in the aperture of the variable stop 10).

It is apparent from the above that the use of two fly-eye lens achieve higher evenness in the illuminance than the use of only one fly-eye lens. Thus, by the use of the first fly-eye lens 9 and the second fly-eye lens 14 together with the variable stop 10 disposed close to the exit surface of the first fly-eye lens 9, the quantity of light of the illumination beam (the exposure on the wafer W) may be continuously adjusted in a wide dynamic range and with reduced unevenness in the illuminance of the illumination beam. The variable stop 10 may be alternatively disposed at a position close to the entrance surface of the first fly-eye lens 9 or in any plane conjugate to the such position.

As with the first embodiment described above, this embodiment also includes an adjustment mechanism for adjusting the extent of the illumination area on the entrance surface of the second fly-eye lens 14, which serves as a means for preventing any reduction in the illuminance. It is noted that the optical member for reducing the numerical aperture of the illumination optical system may comprise an iris diaphragm like the variable stop 10.

In this embodiment, the integrator sensor 30 produces a detection signal (an electrical signal obtained by the photoelectric conversion) which is supplied only to the exposure control system 20.

The other features and arrangements in this exposure apparatus are the same as those in the exposure apparatus according to the first embodiment described above, and will not be described for simplicity. In FIG. 12, the same elements and components are designated by the same reference numerals as in FIG. 1.

Next, an example of exposure control operation for the illuminance control mechanism in this embodiment will be described. This embodiment uses the mercury-vapor lamp 1 as the exposure light source. Generally, electric-discharge lamps such as a mercury-vapor lamp tend to produce variations in the illuminance, including the illuminance fluctuations caused by noises on the power supply lines and the illuminance fluctuations called "arc fluctuations" having frequencies of, for example, about 30 Hz. These variations in the illuminance are relatively small in magnitude (about ±1% or smaller, for example), but have relatively high frequencies so that they have been difficult to remove. The exposure control mechanism in this embodiment incorporates the mechanism for detecting and correcting such variations in the illuminance.

In FIG. 12, the detection signal from the integrator sensor 33 is sampled at a high sampling frequency in the exposure control system 20 by means of a digital-to-analog converter. Also, the exposure control system 20 is supplied by the main control system 19 with information about the desired accumulated exposure to be applied to the wafer W (corresponding to the sensitivity of the photoresist on the wafer W). In addition, the exposure control system 20 is connected with a memory 21 which stores information such as scale factors used to determine the actual exposure (i.e., the exposure energy per unit time) on the wafer W based on the value of the detection signal. The exposure control system 20 determines the exposure on the wafer W based on the detection signal from the integrator sensor 33.

The exposure control system 20 establishes conditions for achieving the desired accumulated exposure prior to the start of the scanning exposure operation. With respect to FIG. 12, the ratio of the quantity of light passing the light adjustment rod 123 to that reaching the 123 is referred to as the "transmittance $q_{11}$ established by the light adjustment rod 123". For example, when the percentage of the blocked area by the light adjustment rod 123 to the entire light travelling region is about 1 to 3%, the range of this variable transmittance $q_{11}$ is 0.99 to 0.97. Then, the exposure $e_1$ on the wafer W is expressed as:

$$e_1 = k^* p^* q_{11}^* q_{12} \qquad (6)$$

where:

p stands for the output power of the mercury-vapor lamp 1;

$q_{11}$ stands for the transmittance established by the light adjustment rod 123;

$q_{12}$ stands for the transmittance established by the variable stop 10; and k stands for a coefficient depending on the type of the illumination-system-aperture-stop used.

The accumulated exposure $\Sigma E_1$ on the wafer W can be expressed, as with the first embodiment described above, using equation (6) as:

$$\Sigma E_1 = e_1^*(D/V_W) = k^* p^* q_{11}^* q_{12}^*(D/V_W) \qquad (7)$$

It is assumed here that the width D of the exposure field 47 measured in the scanning direction is fixed or constant. Then, the accumulated exposure $\Sigma E_2$ may be controlled to a specified, desired accumulated exposure (corresponding to the sensitivity of the photoresist) $\Sigma E_0$ by adjusting one of, or simultaneously adjusting some of the following: the output power p of the mercury-vapor lamp 1; the transmittance $q_{11}$ established by the light adjustment rod 123; the transmittance $q_{12}$ established by the variable stop 10; and the velocity $V_W$ of the wafer stage 48 for scanning. Therefore, in the arrangement of FIG. 12, in order to cause the accumulated exposure $\Sigma E_1$ to converge to the specified, desired accumulated exposure $\Sigma E_0$, the exposure control system 20 supplies the power supply system 22 with a desired illuminance signal corresponding to the desired output power of the mercury-vapor lamp 1, operates the rotation control unit 124 (FIG. 12) to select the transmittance $q_{11}$ to be established by the light adjustment rod 123 to the midpoint transmittance $q_{10}$ within the adjustment range, operates the changer unit 13 to select the transmittance $q_{12}$ to be established by the variable stop 10, as well as operates the stage control system 46 to select the velocity $V_W$ of the wafer stage 48 for scanning. The velocity $V_R$ of the reticle stage 42 for scanning is dependent on the velocity $V_W$ of the wafer stage 48 and is automatically selected to $-V_W/\beta$, where $\beta$ is the projection magnification ratio of the projection optical system PL from the reticle R to the wafer W.

During the scanning exposure operation, the mercury-vapor lamp 1 is continuously powered, with the input power being kept at a constant level initially selected. This control mode, in which the mercury-vapor lamp 1 is driven by the input power at a constant level without any feedback control, is referred to as the "constant power control mode" of the mercury-vapor lamp. Also, during the scanning exposure operation, the exposure control system 20 derives the average value of a predetermined number of measured values of the illuminance detection signal from the integrator sensor 33 which are sampled at a high sampling rate, calculates the actual exposure on the wafer W from the average value, and operates the rotation control unit 124 to vary, if necessary, the transmittance $q_{11}$ established by the light adjustment rod 123 in either direction from the midpoint transmittance $q_{10}$, such that a calculated exposure equal to the desired exposure may be obtained. Because of the light weight of the light adjustment rod 123, the adjustment of the transmittance $q_{11}$ is achieved with a high response speed. Therefore, even when power supply noises and/or arc fluctuations tend to cause such variations in illuminance which are small in magnitude and at high frequencies, such variations may be compensated for by controlling the light adjustment rod 123.

The transmittance $q_{12}$ may be controlled by adjusting the aperture of the variable stop 10. However, because the response speed in the control of the variable stop 10 is lower than that of the light adjustment rod 123, the use of the light adjustment rod 123 has an advantage that it can follow the variations in the illuminance with higher frequencies. On the other hand, the variable stop 10 provides a wider range of adjustment, so that the variable stop 10 may be used to correct the illuminance where the variations in the illuminance are vary large in magnitude and at relatively low frequencies.

As described, this embodiment has the light adjustment rod 123 disposed in front of the first relay lens 8. Alternatively, the light adjustment rod 123 may be disposed at any positions on the light path between on that side of the second fly-eye lens (the mosaic fly-eye lens) 14 toward the light source, since the blocking of a part of the light of the illumination beam at such positions would not cause any unevenness in the illuminance. Further, this embodiment achieves the adjustment of the quantity of light by rotating the light adjustment rod 123 as shown in FIG. 13. Alternatively, the adjustment of the quantity of light may be achieved by using a small shadow plate which may be projected into and retracted from the region in which the light of the illumination beam travels. In addition, a liquid crystal display may be used to control the quantity of light.

Further, this embodiment uses the mercury-vapor lamp as the exposure light source; however, the present invention is not limited to the use of the mercury-vapor lamp. Even in the case where an electric-discharge lamp (such as a xenon arc lamp) or a laser source (such as an excimer laser) is used as the exposure light source and where the illuminance of the illumination beam from such exposure light source produces variations, the use of this embodiment ensures that the illuminance will be controlled to be at a desired value with ease.

As described, this embodiment shows an exemplified application of the present invention to a scanning exposure apparatus. However, this embodiment is provided with many features and arrangements which may be used in one-shot exposure type of exposure apparatuses as well, including the use of the two fly-eye lenses together with the variable stop (iris diaphragm) 10 for exposure control, the change of input lens for a small σ-value, and others.

According to this embodiment, when the exposure energy measured by the exposure measuring means tends to deviate from the desired value, the light fine adjustment means is operated to adjust the quantity of light of the illumination beam. This provides an advantage that the accumulated exposure on the photosensitized substrate can be made to fall into an acceptable range with ease even if the illuminance of the illumination beam outputted from the exposure light source tends to produce such variations which are smaller than a predetermined proportion of the normal illuminance and of high frequencies.

Further, in the case where the fine adjustment means comprises a shading element which is rotated within or projected into and retracted from the region through which the light of the illumination beam travels and where the shading element is of such a size that may provide a shading area smaller than 10% of the cross-sectional area of the region through which the light of the illumination beam travels, the illuminance of the illumination beam may be advantageously controlled at a high speed over a control range of about 10% of the normal illuminance.

Moreover, according to this embodiment, the quantity of light of the illumination beam is adjusted by means of a light adjustment element which may be disposed on the exit surface or the entrance surface of a first optical integrator or in any plane conjugate to the plane of either surface, so that the quantity of light of the illumination beam (the exposure on the wafer W) may be advantageously adjusted on a continuous adjustment basis, in a wide dynamic range, and with reduced unevenness in the illuminance on the mask R and on the photosensitized substrate W.

Further, according to this embodiment, a second optical integrator 14 receiving the illumination beam from a first optical integrator 9 is used, and there are provided a first adjustment mechanism 16, 17 for adjusting the extent of that area on the exit surface of the second optical integrator through which the illumination beam passes (i.e., the N.A. of the illumination optical system), and a second adjustment mechanism 12A, 12B, 13 operable in relation to the first adjustment mechanism for adjusting the extent of the illumination field on the entrance surface of the second optical integrator, so that the illuminance of the illumination beam on the mask and that on the photosensitized substrate are advantageously maintained at substantially constant levels irrespective of the σ-value (i.e., the ratio between the N.A. of the illumination optical system and that of the projection optical system).

Next, an exposure apparatus according to a third embodiment of the present invention will be described with reference to the accompanying drawings. This embodiment shows a further exemplified application of the present invention to a step-and-scan type of projection exposure apparatus. The exposure apparatus of the third embodiment has substantial similarities to that of the first embodiment described above, so that only the features of the third embodiment different from the first embodiment will be described in great detail.

FIG. 14 illustrates the projection exposure apparatus of the third embodiment, in which a first mercury-vapor lamp 1A emits illumination light rays which are collected by an ellipsoidal mirror 2A to form an illumination beam IL1, which is incident on a beam splitter 3 having a reflectance of about 95% (hence a transmittance of about 5%). In parallel, a second mercury-vapor lamp 1B emits illumination light rays which are collected by another ellipsoidal mirror 2B to form another illumination beam IL2, which passes through an optical filter plate 225 for attenuation of illuminance and is incident on the beam splitter 3. The first and the second mercury-vapor lamps 1A and 1B are lighted by the input powers from first and second power supply systems 22A and 22B, respectively. The illumination beam IL1 is composed of the light with a spectrum made up of the same bright lines as the illumination beam IL2 (such as i-line and g-line). The illumination beam IL1, which is reflected by the beam splitter 3 and thereby has higher illuminance, and the illumination beam IL2, which is transmitted through the beam splitter 3 and thereby has lower illuminance, are coaxial with each other and combined into one illumination beam which is directed toward an input lens 6.

Between the beam splitter 3 and the input lens 6 there is disposed a shutter 4 which is operable to open and close by means of a shutter control mechanism 5. When the shutter 4 is open, the combined illumination beam is allowed to pass through it and substantially collimated by the input lens 6 to reach a field stop 7. Just behind the field stop 7 there is disposed a dimmer plate 23 which may be projected into and retracted from the region of the illumination beam path. The dimmer plate 23 serves to vary the quantity of light of the illumination beam passing through the field stop 7, over a predetermined variation range, on an either incremental or continuous variation basis.

In this embodiment, the photosensitive surface of the integrator sensor 33 is positioned in a plane optically conjugate to the plane of the pattern bearing surface of the reticle R as well as to the plane of the photosensitized surface of the wafer W. The integrator sensor 33 produces an electrical signal obtained by the photoelectric conversion and corresponding to the illuminance on the wafer W (this signal is referred to as the "illuminance detection signal" hereinafter), which is supplied to the exposure control system 20 and the second power supply system 22B.

The exposure control system 20 is connected with a memory 21 which stores information such as scale factors used to determine the exposure energy on the wafer W based on the illuminance detection signal from the integrator sensor 33. The exposure control system 20 operates the first power supply system 22A to power the first mercury-vapor lamp 1A at a constant power level, while supplies the second power supply system 22B with a desired illuminance signal indicating the desired illuminance. In response thereto, the second power supply system 22B powers the second mercury-vapor lamp 1B using a servo-control technique so as to keep the level of the illuminance detection signal produced from the integrator sensor 33 at the level of the desired illuminance signal. That is, in this embodiment, the first mercury-vapor lamp 1A is driven in constant-power-control mode, while the second mercury-vapor lamp 1B is driven in constant-illuminance-control mode.

The other features and arrangements in this exposure apparatus are the same as those in the exposure apparatus according to the first embodiment described above, and will not be described for simplicity. In FIG. 14, the same elements and components are designated by the same reference numerals as in FIG. 1.

Figure 15:
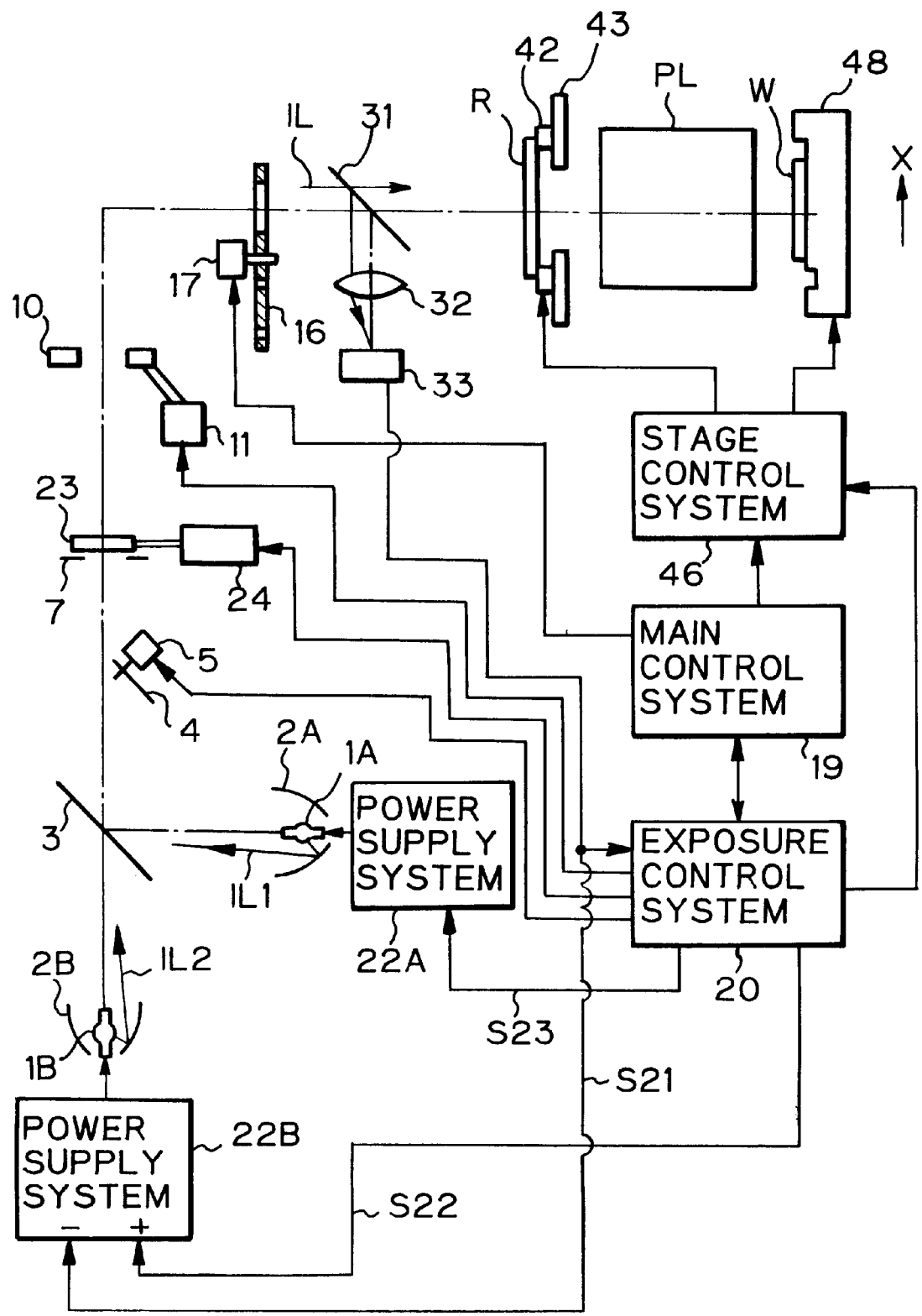
FIG. 15 is a block diagram showing an exposure control mechanism of FIG. 14.

Next, the exposure control mechanism forming a part of the illuminance control mechanism in this embodiment will be described. FIG. 15 shows the exposure control mechanism extracted from FIG. 14. In FIG. 15, the rated value (recommendable setting point) for the illuminance of the illumination beam IL1 just emitted from the first mercury-vapor lamp 1A is about 2000 mW/cm$^2$ ("the illuminance of the illumination beam" means the illuminance on the wafer W which would result if that illumination beam is directed to the wafer W without any additional attenuation), and that for the illuminance of the illumination beam IL1 after reflected by the beam splitter 3 with a reflectance of 95% is about 900 mW/cm$^2$ accordingly. On the other hand, the rated value for the illuminance of the illumination beam IL2 just emitted from the light source comprising the second mercury-vapor lamp 1B and the optical filter plate 225 is about 1000 mW/cm$^2$, and that for the illuminance of the illumination beam IL2 after transmitted through the beam splitter 3 with a reflectance of 95% (hence a transmittance of 5%) is about 50 mW/cm$^2$ accordingly. Therefore, the combined illumination beam produced by the beam splitter 3 is capable of providing an illuminance of 1950 mW/cm$^2$ on the wafer W.

The design ranges of the input powers to the mercury-vapor lamps 1A and 1B are 70–100% of the values of their rated powers, and the setting resolutions are, for example, about 0.3% of those input powers. In addition, the mercury-vapor lamps 1A and 1B tend to produce variations in the illuminance of about 0.5% including various fluctuations, such as the illuminance fluctuations caused by the noises on the power supply lines, the so-called arc fluctuations caused by the variations in the convection of the mercury vapor filled in the tube of the lamp. Thus, when the first mercury-vapor lamp 1A is powered with the input power at a constant level as with this embodiment, the proportion of the maximum possible error in the illuminance of the illumination beam from the first mercury-vapor lamp 1A to the illuminance of the combined illumination beam is about 0.78% (≈0.8%*1900/1950). This should equal the required control range for the control of the illuminance of the illumination beam from the second mercury-vapor lamp 1B).

The proportion of the illuminance of the illumination beam from the second mercury-vapor lamp 1B to that of the combined illumination beam is about 2.56% (≈100%*50/1950) and the design range of the input power is 70–100%, so that the control range for the control of the illuminance of the illumination beam of the second mercury-vapor lamp 1B is about 1.79% (≈2.56%*0.7). Thus, any error in the illuminance caused by the first mercury-vapor lamp 1A may be compensated for by controlling the illuminance provided by the second mercury-vapor lamp 1B with an allowance factor of more than 2.0.

The setting resolution in the input power to the second mercury-vapor lamp 1B will be represented by a value relative to the illuminance of the combined illumination beam. More particularly, the setting resolution is defined as the proportion of the maximum possible error which may occur in the illuminance of the illumination beam from the second mercury-vapor lamp 1B relative to the illuminance of the combined illumination beam when the input power to the second mercury-vapor lamp 1B is set to a predetermined value. This setting resolution is about 0.008% (≈0.3%*50/1950), which means that the setting resolution in the input power achievable by this embodiment is in effect as fine (or high) as about $\frac{1}{40}$ times the resolution obtainable when only one mercury-vapor lamp is used. Thus, according to this embodiment, the illuminance of the combined illumination beam can be controlled with a very high setting resolution, irrespective of the actual setting resolution in the input powers to the mercury-vapor lamps 1A and 1B.

The combined illumination beam passes through the dimmer plate 23, the variable stop 10 and one of the aperture stops in the illumination-system-aperture-stop disk 16, and is reflected by the beam splitter 31 into the integrator sensor 33 which produces an illuminance detection signal S21 supplied to the exposure control system 20 and the power supply system 22B for the second mercury-vapor lamp 1B. The exposure control system 20 includes a digital-to-analog converter for sampling the illuminance detection signal S21 at a predetermined high sampling frequency. Also, the exposure control system 20 is supplied by the main control system 19 with information about the desired accumulated exposure to be applied to the wafer W (corresponding to the sensitivity of the photoresist on the wafer W). Further, the memory 21 stores information such as scale factors used to determine the actual exposure (i.e., the exposure energy incident on unit area per unit time, or the illuminance) on the wafer W based on the value of the illuminance detection signal S21, so that the exposure control system 20 is capable of recognizing the illuminance on the wafer W based on the illuminance detection signal S21.

The exposure control system 20 establishes conditions for achieving the desired accumulated exposure prior to the start of the scanning exposure operation. As apparent from FIG.

15, the exposure per unit area (or the illuminance) $e_2$ on the wafer W is expressed as:

$$e_2 = k*(p_1+p_2)*q_1*q_2 \qquad (8)$$

where:
$p_1$ stands for the output power of the first mercury-vapor lamp 1A (after combined with $p_2$ by the beam splitter 3);
$p_2$ stands for the output power of the second mercury vapor lamp 1B (after combined with $p_1$ by the beam splitter 3);
$q_1$ stands for the transmittance established by the dimmer plate 23;
$q_2$ stands for the transmittance established by the variable stop 10; and
k stands for a coefficient depending on the type of the illumination-system-aperture-stop used.

The accumulated exposure $\Sigma E_2$ on the wafer W can be expressed, as with the first and second embodiments described above, using equation (8) as:

$$\Sigma E_2 = e_2*(D/V_W) = k*(p_1+p_2)*q_1*q_2*(D/V_W) \qquad (9)$$

It is assumed here that the width D of the exposure field 47 in the scanning direction is fixed (or constant). Then, the accumulated exposure $\Sigma E_2$ may be controlled to a specified, desired accumulated exposure (corresponding to the sensitivity of the photoresist on the wafer W) $\Sigma E_0$ by adjusting one of, or simultaneously adjusting some of the following: the output powers $p_1$ and $p_2$ of the mercury-vapor lamps 1A and 1B; the transmittance $q_1$ established by the dimmer plate 23; the transmittance $q_2$ established by the variable stop 10; and the velocity $V_W$ of the wafer stage 48 for scanning. Therefore, in the arrangement of FIG. 15, in order to cause the accumulated exposure $\Sigma E_2$ to converge to the specified, desired accumulated exposure $\Sigma E_0$, the exposure control system 20 operates the first power supply system 22A to select the input power to the first mercury-vapor lamp 1A to such a level with which the initial value of the illuminance of the illumination beam from the mercury-vapor lamp 1A is equal to 1900 mW/cm². The selected input power to the mercury-vapor lamp 1A remains fixed thereafter. Also, the exposure control system 20 supplies the second power supply system 22B with the desired illuminance signal S22 which makes the output power ($p_1+p_2$) of the combined illumination beam, for $q_1=q_2=1$, equal to 1950 mW/cm².

In addition, the exposure control system 20 operates the dimmer plate drive unit 24 (FIG. 14) to select the transmittance $q_1$ established by the dimmer plate 23, operates the changer unit 13 to select the transmittance $q_2$ established by the variable stop 10, and operates the stage control system 46 to select the velocity $V_W$ of the wafer stage 48 for scanning. The velocity $V_R$ of the reticle stage 42 for scanning is dependent on the velocity $V_W$ of the wafer stage 48 and is automatically selected to $-V_W/\beta$, where $\beta$ is the projection magnification ratio of the projection optical system PL from the reticle R to the wafer W.

After these initialization operations, the second power supply system 22B powers the second mercury-vapor lamp 1B using a feedback control technique so as to keep the level of the illuminance detection signal S21 at the level of the desired illuminance signal S22, so that the output power $p_2$ of the second mercury-vapor lamp 1B is maintained near the level of 50 mW/cm². Also, during the scanning exposure operation, the exposure control system 20 derives the average value of a predetermined number of measured values of the illuminance detection signal S21 sampled at a high sampling rate, calculates the actual exposure on the wafer W from the average value, and corrects, if necessary, the value of the desired illuminance signal S22 such that a calculated exposure equal to the desired exposure may be obtained. This control mode, in which the output power of the second mercury-vapor lamp 1B is controlled based on the detection results of the integrator sensor 33 so as to keep the illuminance on the wafer W at a constant level, is referred to as "constant-illuminance-control mode" in this embodiment as well.

As the result of this control, even when the illuminance of the illumination beam from the first mercury-vapor lamp 1A powered at a constant power level does vary by as much as about 0.8%, the illuminance of the illumination beam from the second mercury-vapor lamp 1B varies to follow it, so that the illuminance of the illumination beam on the wafer W may be continuously kept at a desired value.

Figure 16:
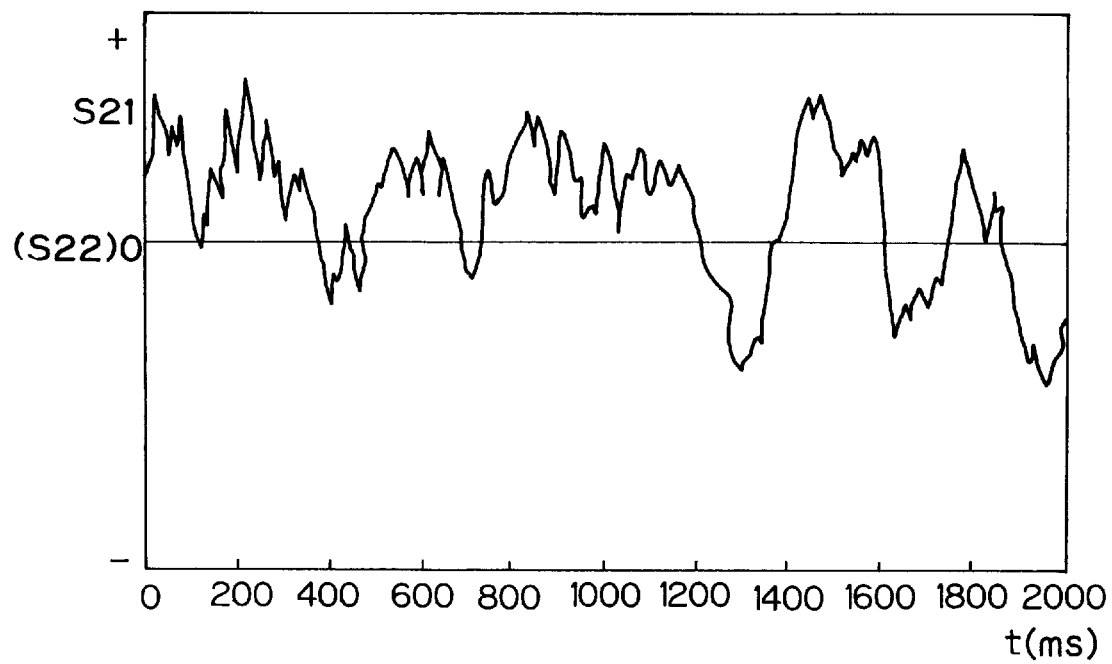
FIG. 16 shows an exemplified waveform of an illuminance detection signal S21 obtained through an integrator sensor when the power supplied to a light source is fixed at a constant level in the exposure control mechanism of FIG. 15.
Figure 17:
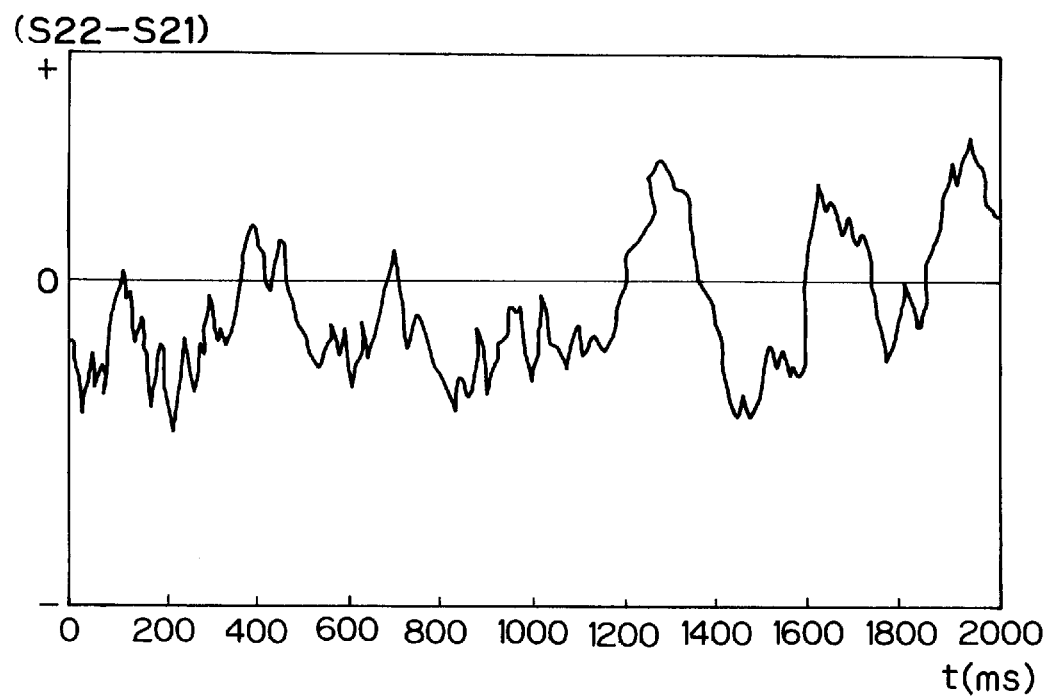
FIG. 17 shows an exemplified waveform of the difference (S22–S21) between a desired illuminance signal S22 and the illuminance detection signal S21 when the illuminance detection signal S21 varies according to the waveform of FIG. 16.

Referring next to FIGS. 16 and 17, constant-illuminance-control mode in this embodiment will be described in more detail.

FIG. 16 shows exemplified variations in the illuminance detection signal S21 (see FIG. 15) produced from the integrator sensor 33 when the second mercury-vapor lamp 1B is driven with power at a constant level, using the known relation between powers supplied to the second mercury-vapor lamp 1B and illuminances of the illumination beam emitted from the mercury-vapor lamp 1B in response to the powers. In FIG. 16, levels of the illuminance detection signal S21 are referenced to a horizontal line designated by 0 (zero), which indicates the level of the desired illuminance signal S22 (see FIG. 15) which corresponds to the illuminance expected to be established by supplying power at said constant level. Since no feedback control of the actual illuminance is made in this operating condition, as shown, the illuminance detection signal S21 gradually drifts away from the desired value. This drift may be avoided by operating the power supply system 22B of FIG. 15 in constant-illuminance-control mode.

By virtue of this, the difference (S22–S21) between the desired illuminance signal S22 and the illuminance detection signal S21 appearing across the inputs of the second power supply system 22B of FIG. 15 is obtained which varies as shown in FIG. 17. Further, the second power supply system 22B drives the mercury-vapor lamp 1B so as to reduce this difference to zero, and thereby the actual illuminance is maintained at the desired value.

As described above, according to the present embodiment, the input power to the mercury-vapor lamp 1B, which makes a smaller contribution to the illuminance of the combined illumination beam than the other mercury-vapor lamp 1A, is controlled in constant-illuminance-control mode. Therefore, the illuminance can be controlled with a much finer (higher) setting resolution than the actual setting resolution in the input powers to the mercury-vapor lamps 1A and 1B. Further, since the mercury-vapor lamp 1B has a lower output power than the mercury-vapor lamp 1A, the control of the illuminance can be made with a higher response speed. Therefore, the illuminance on the wafer can be maintained at a desired value with precision and with a high response speed, with the result that the accumulated exposure at each point on the wafer obtained after the scanning exposure operation can be made to fall into an acceptable range.

In this embodiment, only the mercury-vapor lamp 1B, which makes a smaller contribution to the illuminance of the combined illumination beam than the other, is driven in constant-illuminance-control mode. Alternatively, both the mercury-vapor lamps 1A and 1B may be individually controlled in constant-illuminance-control mode in order to make the illuminance detection signal from the integrator sensor 33 equal to the desired illuminance signal. In this case, a larger magnitude of variations in the illuminance may be corrected with precision and with a high response speed by, for example, correcting the low frequency components of the variations by controlling the mercury-vapor lamp 1A with the higher output power, while correcting the remaining fluctuations in the illuminance by controlling the mercury-vapor lamp 1B with the lower output power.

As shown in FIG. 14, since the beam splitter 3 is disposed in front of the first fly-eye lens 9, it is not required to achieve a precise alignment between the optical axes of the two illumination beams IL1 and IL2 for combining them by the beam splitter 3.

Further, this embodiment uses the mercury-vapor lamp as the exposure light source; however, the present invention is not limited to the use of the mercury-vapor lamp. In the case where an electric-discharge lamp (such as a xenon arc lamp) or an excimer laser is used as the exposure light source and where the setting resolution in the input power to such exposure light source is relatively low, the use of this embodiment advantageously ensures that the accumulated exposure on the wafer will fall into an acceptable range.

Moreover, this embodiment uses the arrangement in which two separately generated illumination beams are combined by means of the beam splitter 3. Alternatively, an arrangement may be used in which a single illumination beam is split into two beams so as to insert a control illumination beam. This arrangement may be used because any unevenness in the light intensity at a place on that side of the first fly-eye lens 9 toward the light source provides little adverse influence.

Figure 18:
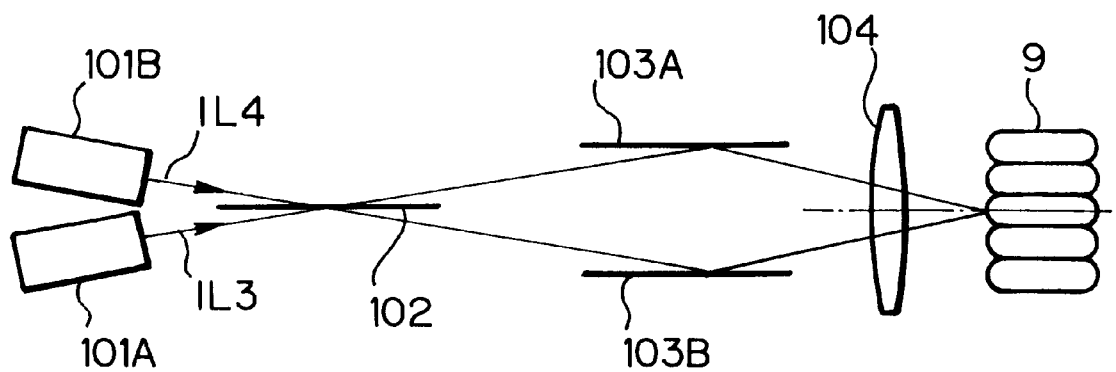
FIG. 18 shows a schematic representation showing a light source system used in one modification of the projection exposure apparatus of FIG. 14.

Referring next to FIG. 18, one modification of the embodiment just described above with reference to FIG. 14 will be described. Because the only differences of this modification from the embodiment of FIG. 14 reside in the arrangement of the light source system in front of the first fly-eye lens 9, only the light source system will be described.

FIG. 18 shows the light source system according to this modification, in which a first exposure light source 101A having a higher output power and a second exposure light source 101B having a lower output power are disposed on the opposite sides of a beam splitter 102 having a transmittance of about 50% and symmetrically with respect to the beam splitter 102. The exposure light sources 101A and 101B may comprise a combination of a mercury-vapor lamp and an electric-discharge lamp generating illumination beams having the same wavelength.

The first exposure light source 101A emits an illumination beam IL3 which is split by the beam splitter 102 into two beams, while the second exposure light source 101B emits an illumination beam IL4 which is also split by the beam splitter 102 into two beams. This results in two combined illumination beams each composed of two split beams from respective light sources. One of the combined illumination beams is reflected by a first mirror 103A and the other by a second mirror 103B. The reflected, two illumination beams are directed through an input lens 104 onto the entrance surface of the first fly-eye lens 9 symmetrically with respect to the optical axis of the illumination optical system.

Thus, the two exposure light sources 101A and 101B emit the respective illumination beams which are incident on the entrance surface of the first fly-eye lens 9 after combined. Also, in this modification, the first exposure light source 101A having a higher output power is powered with power at a constant level, and the second exposure light source 101B having a lower output power is powered in the constant illumination control mode so as to keep the illuminance of the finally combined illumination beam at a desired value. In this manner, the illuminance on the wafer may be maintained at a desired value with precision and at a high response speed, as with the embodiment of FIG. 14.

Further, this modification provides an advantage that there is little loss in the quantity of light because both of the light transmitted through the beam splitter 102 and the light reflected by the beam splitter 102 of each exposure illumination beam 101A, 101B are used.

This number of the exposure light sources used in this modification is tow. Alternatively, more than two exposure light sources may be used, in which one or more of them may be controlled in the power supplied to them.

Figure 19:
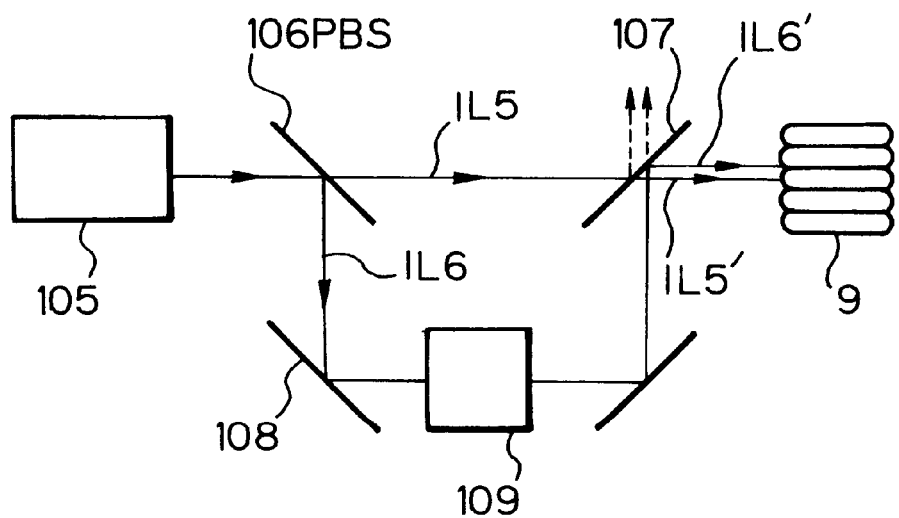
FIG. 19 shows a schematic representation showing a light source system used in another modification of the projection exposure apparatus of FIG. 14.

Referring next to FIG. 19, another modification of the embodiment of FIG. 14 will be described. Because the only differences of this modification from the embodiment of FIG. 14 reside in the arrangement of the light source system in front of the first fly-eye lens 9, only the light source system will be described.

FIG. 19 shows the light source system according to this modification, in which an exposure light source 105, which may comprise a mercury-vapor lamp, emits an illumination beam which is incident on a first beam splitter 106 having a transmittance of about 80% and split into two illumination beams IL5 and IL6 by the beam splitter 106. The illumination beam IL5, composed of the transmitted light through the beam splitter 106 and having a higher illuminance than the other beam IL6, is incident on a second beam splitter 107 having a transmittance of, again, about 80%. On the other hand, the illumination beam IL6, composed of the reflected light by the beam splitter 106 and having a smaller illuminance, is reflected by a mirror 108 to pass through the dimmer unit 109. The dimmer unit 109 may comprise, for example, a shading element which is moved or rotated in a region through which an illumination beam travels, so as to block a variable portion of the region to variably attenuating the illumination beam. The illumination beam IL6 is attenuated by the dimmer unit 109 and then reflected by a mirror into the second beam splitter 107. That portion of the light of the illumination beam IL5 forms an illumination beam 5', while that portion of the light of the illumination beam IL6 forms an illumination beam 6'. These illumination beams 5' and 6' are combined with their axes roughly aligned with each other, and the combined beam is incident on the first fly-eye lens 9.

In this modification, the total transmittance through the two beam splitters 106 and 107 is defined as the ratio of the illuminance of the illumination beam IL5' to that of the original illumination beam just emitted from the light source 105 and has a value of about 64% ($=0.8*0.8*100\%$). The total reflectance by the beam splitters is defined as the ration of the illuminance IL6' to that of the original illumination beam and has a value of about 4% ($=0.2*0.2*100\%$). Thus, the ration of the illuminance of the latter illumination beam IL6' to that of the former illumination beam IL5' has a value of about 6% ($=(4/64)*100\%$).

Also, in this modification, the attenuation established by the dimmer unit 109 is initially selected to a value of about 50% and the exposure light source 105 is powered in the constant power mode such that the illuminance of the combined illumination beam may initially have the desired value. Thereafter, the attenuation established by the dimmer unit 109 is controlled in constant-illuminance-control mode such that the illuminance of the combined illumination beam may be maintained at the desired value. In this manner, the illuminance on the wafer may be made to follow the desired value with precision and at a high response speed.

In the modification of FIG. 19, the illumination beam emitted from the exposure light source is split into two illumination beams, and one of the tow beams, having a lower illuminance, is controlled in its illuminance. Alternatively, both of the two illumination beams may be controlled in their illuminances in constant-illuminance-control mode by means of respective, separate dimmer units. Further, the illumination beam emitted from the exposure light source may be split into three or more illumination beams, and one or more of them may be attenuated in constant-illuminance-control mode.

According to the modification of FIG. 18, respective input powers to a plurality of exposure light sources are independently controlled, and at least one of the exposure light sources has its input power controlled such that the quantity of light (or illuminance) of the combined illumination beam may be maintained at a desired value, and the proportion of the controlled illuminance variation to the illuminance of the combined illumination beam would be smaller than those with the cases in which only an illumination beam from a single exposure light source is used. Thus, even when the input power to the exposure light source to be controlled has a relatively low setting resolution, the illuminance of the combined, final illumination beam may be controlled to a desired value with a high resolution, with the result that the accumulated exposure at each point on the wafer obtained after the scanning exposure operation can be made to fall into an acceptable range.

Further, this arrangement provides an advantage that the exposure light source to be controlled may have a smaller output power and a higher response speed for the output power when the input power is varied, than those for the case in which only an illumination beam from a single exposure light source is used.

In particular, in the case where two exposure light sources having different output powers are used and one of them, having a lower output power, is controlled in the quantity of light (or illuminance) of its illumination beam, the illuminance of the combined illumination beam may be advantageously maintained at a desired value with more precision and at a higher response speed.

Moreover, this arrangement provides a further advantage that by using an exposure measuring means for measuring the exposure energy (or illuminance) of the combined illumination beam on a continuous measurement basis, and by controlling the quantity of light of the illumination beam produced from at least one of the exposure light source such that the exposure energy to be measured by the exposure measuring means may be equal to its a desired energy value, the actual illuminance on the photosensitized substrate may be maintained at the desired illuminance value with precision.

According to the second modification of FIG. 19, an illumination beam emitted from a single exposure light source is split into a plurality of illumination beams, and at least one of the plurality of illumination beams has its quantity of light (or illuminance) attenuated in accordance with the quantity of light of the combined illumination light beam. By virtue of this arrangement, the control resolution in controlling the quantity of light of the controlled illumination beam may be high (or fine) even when the setting resolution in the input power to the exposure light source is low. Further, that illumination beam which is controlled for attenuation has only a small quantity of light so that light attenuation means used for this purpose may be of a light weight and capable of operation at a good response speed. Therefore, this arrangement provides an advantage that the illuminance of the illumination beam on the photosensitized substrate may be maintained at a desired value with precision and at a high response speed.

Next, an exposure apparatus according to a fourth embodiment of the present invention will be described with reference to the accompanying drawings. This embodiment shows a yet further exemplified application of the present invention to a step-and-scan type of projection exposure apparatus.

Figure 20:
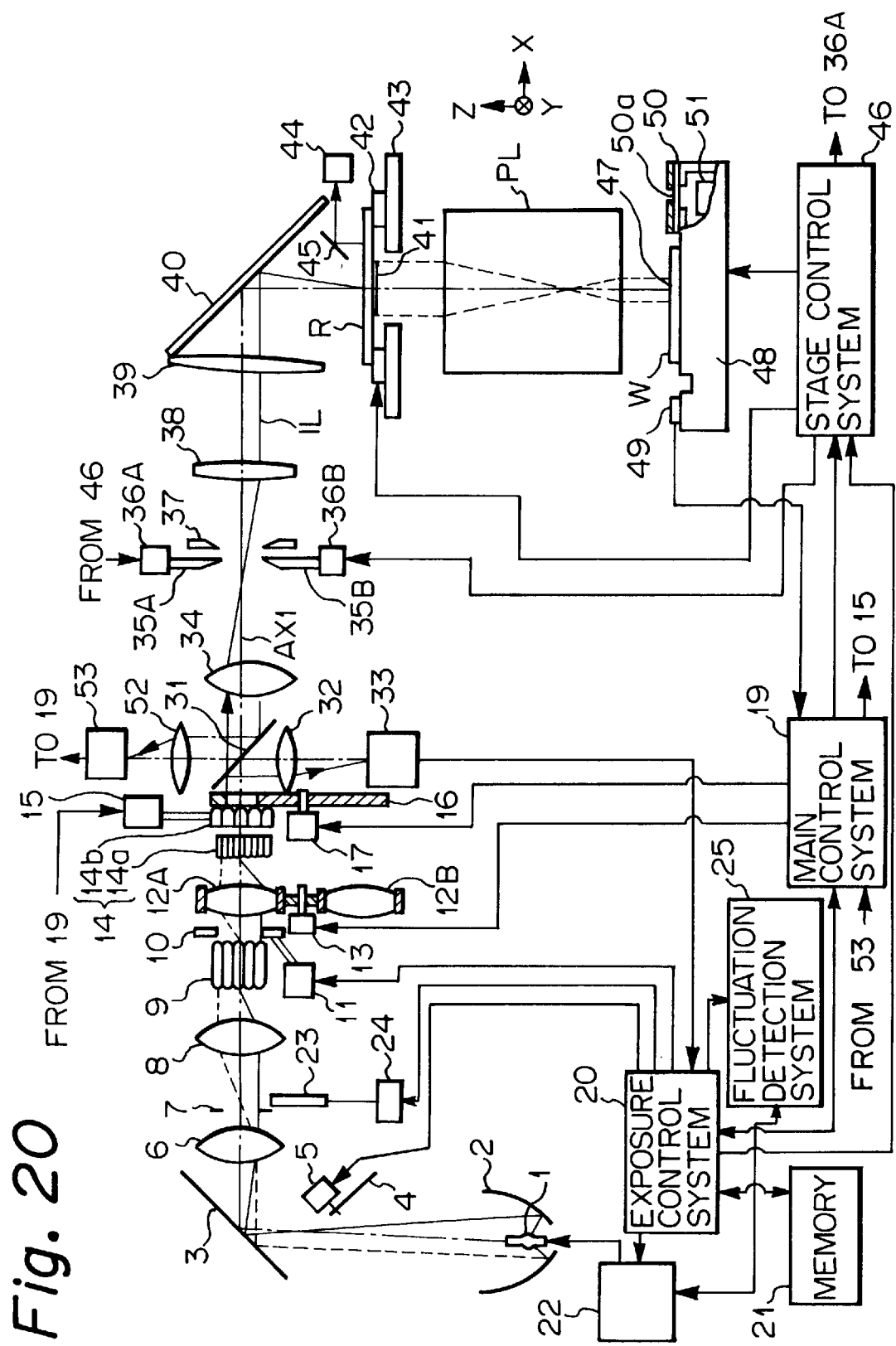
FIG. 20 is a schematic representation, partially broken away, showing a projection exposure apparatus of the scanning exposure type according to a fourth embodiment of the present invention.

FIG. 20 shows the projection exposure apparatus, which has the same arrangement as the projection exposure apparatus of FIG. 1 to which a fluctuation detection system 325 is added.

In this embodiment, the photosensitive surface of the integrator sensor 33 is positioned in a plane optically conjugate to the plane of the pattern bearing surface of the reticle R as well as to the plane of the photosensitized surface of the wafer W. The integrator sensor 33 produces a detection signal (an electrical signal obtained by the photo-electric conversion), which is supplied to the exposure control system 20. The detection signal is further passed from the exposure control system 20 to the power supply system 22 for the mercury-vapor lamp 1.

The other features and arrangements in this exposure apparatus are the same as those in the exposure apparatus according to the first embodiment described above, and will not be described for simplicity. In the following, the exposure control mechanism forming a part of the illuminance control mechanism in this embodiment will be described with reference to FIG. 20. In this embodiment, the mercury-vapor lamp 1 is used as the exposure light source. As described above, electric-discharge lamps such as a mercury-vapor lamp tend to produce the fluctuations in the illuminance having relatively low frequencies such as about 30 Hz, called the "arc fluctuations". Because the arc fluctuations may cause some unevenness in the accumulated exposure on the wafer W, the exposure control mechanism in this embodiment includes the mechanism for detecting and correcting the arc fluctuations.

Figure 21:
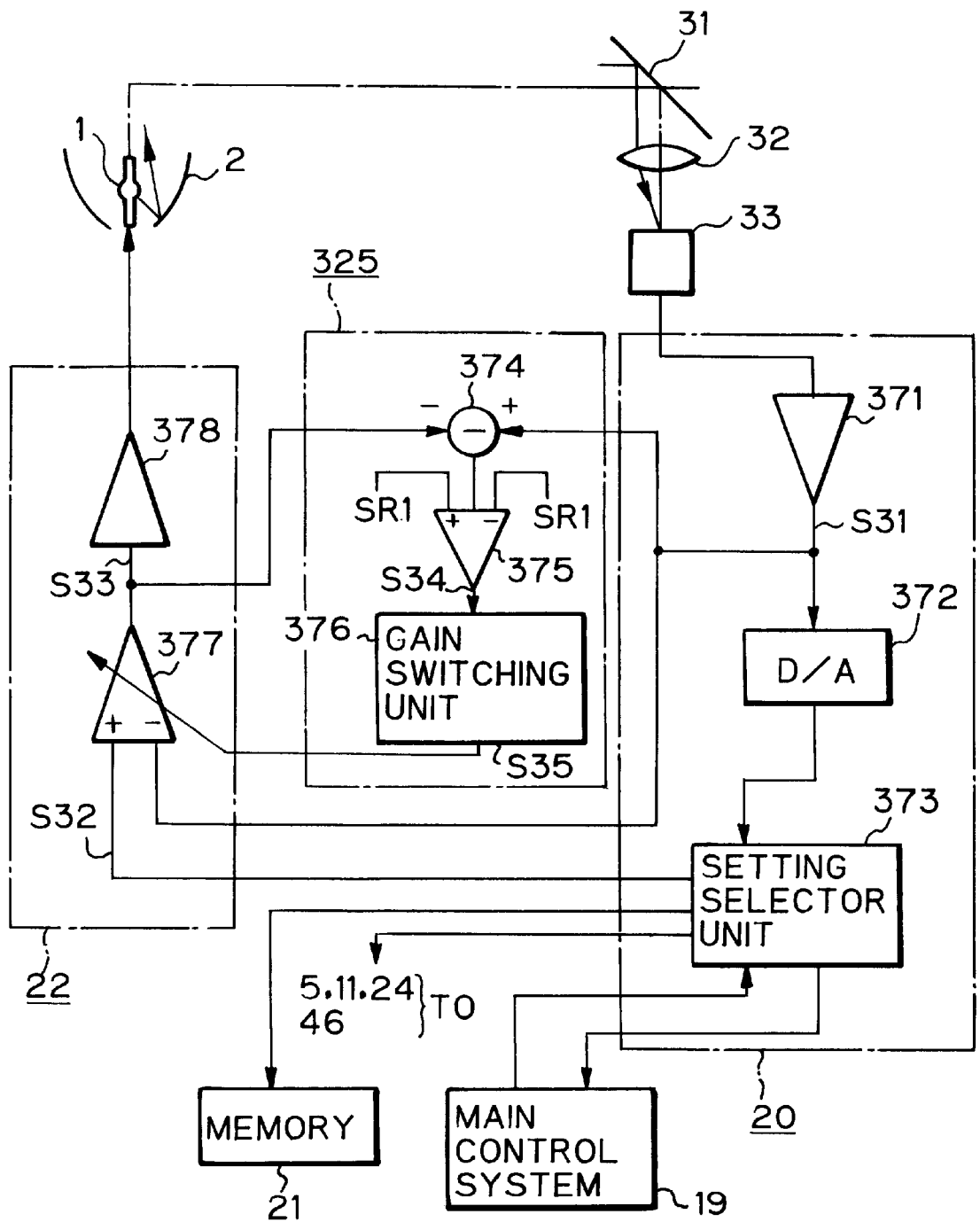
FIG. 21 is a block diagram showing an exposure control mechanism of FIG. 20.

FIG. 21 shows the relevant portion of the exposure control mechanism used in this embodiment. In FIG. 21, the exposure control system 20 comprises a preamplifier 371, a digital-to-analog converter (D/A) 372 and a setting selector unit 373. The detection signal from the integrator sensor 33 is processed through the preamplifier 71 to be an illuminance detection signal S31 which corresponds to the illuminance of the illumination beam. The illuminance detection signal S31 is sampled through the digital-to-analog converter 372 into the setting selector unit 373 at a predetermined high sampling frequency. The setting selector unit 373 is supplied by the main control system 19 with information about the desired accumulated exposure to be applied to the wafer W. The setting selector unit 373 is connected with a memory 21 which stores information such as scale factors used to determine the actual exposure (i.e., the exposure energy per unit time) on the wafer W based on the value of the detection signal S31, so that the setting selector unit 373 is capable of recognizing the exposure on the wafer W based on the illuminance detection signal S31.

The setting selector unit 73 establishes the conditions for achieving the desired accumulated exposure prior to the start of the scanning exposure operation. Thus, in the arrangement of FIG. 20, the exposure e and the accumulated exposure $\Sigma E$ on the wafer W are expressed by equations (1)

and (2) as with the exposure apparatus according to the first embodiment described above.

In this embodiment, in order to cause the accumulated exposure ΣE to converge to the specified, desired accumulated exposure $\Sigma E_0$, the setting selector unit 373 supplies the power supply system 22 with the desired illuminance signal S32 corresponding to the desired output power of the mercury-vapor lamp 1, operates the dimmer plate drive unit 24 (FIG. 20) to select the transmittance $q_1$ to be established by the dimmer plate 23, operates the changer unit 13 to select the transmittance $q_2$ to be established by the variable stop 10, as well as operates the stage control system 46 to select the velocity $V_W$ of the wafer stage 48 for scanning. The velocity $V_R$ of the reticle stage 42 for scanning is dependent on the velocity $V_W$ of the wafer stage 48 and is automatically selected to $-V_W/\beta$, where $\beta$ is the projection magnification ratio of the projection optical system PL from the reticle R to the wafer W.

Also, during the scanning exposure operation, the setting selector unit 373 derives the average value of a predetermined number of measured values of the illuminance detection signal S31 sampled at a high sampling rate, calculates the actual exposure on the wafer W from the average value, and corrects, if necessary, the value of the desired illuminance signal S32 such that a calculated exposure equal to the desired exposure may be obtained. This control mode, in which the output power of the mercury-vapor lamp 1 is controlled based on the detection results of the integrator sensor 33 so as to keep the illuminance on the wafer W at a constant level, is referred to as the "constant-illuminance-control mode". There is another control mode in which the power supplied to the mercury-vapor lamp 1 is kept at a fixed level, called the "constant power control mode". However, constant-power-control mode is scarcely used for the actual scanning exposure operation.

In the arrangement of FIG. 21, the power supply system 22 comprises a variable gain amplifier 377 and a power amplifier 378. The variable gain amplifier 377 has a noninverting input coupled to the desired illuminance signal S32 and an inverting input coupled to the illuminance detection signal S31 from the preamplifier 371. The variable gain amplifier 377 generates the light source drive signal S33 with a first gain or a second gain, such that the illuminance detection signal S31 will be equal to the desired illuminance signal S32. The first gain is higher than the second gain, and is normally selected. When it is detected, as described below, that arc fluctuations have started appearing, the gain of the variable gain amplifier 377 is switched from the first to the second, the larger gain. This increase in the gain tends to produce the hunting phenomenon in which the light source drive signal S33 oscillates at a high frequency. This embodiment positively generates the hunting so as to suppress the effect of the arc fluctuations. The light source drive signal S33 from the variable gain amplifier 377 is amplified by the power amplifier 378, and the power (voltage) outputted from the power amplifier 378 powers the mercury-vapor lamp 1. Further, the integrator sensor 33 produces an electrical signal which is obtained by the photoelectric conversion and corresponds to the output luminous power of the mercury-vapor lamp 1.

The fluctuation detection system 325 comprises a subtractor 374, a window comparator 375 and a gain switching unit 376. The light source drive signal S33 from the power supply system 22 is supplied to a negative (subtractive) input of the subtractor 374 and the illuminance detection signal 31 from the preamplifier 371 is supplied to a positive (additive) input of the subtractor 374. The subtractor outputs a differential signal (S31–S33) to the window comparator 375, which generates an arc fluctuation detection signal S34. The arc fluctuation detection signal S34 assumes a low level or "0" level when the level of the differential signal (S31–S33) is within a range between a predetermined negative value −SR1 and a predetermined positive value +SR1, and a high level or "1" level when the differential signal (S31–S33) is out of the range. The arc fluctuation detection signal S34 is supplied to the gain switching unit 376 which produces a gain select signal S35. The gain select signal S35 is set to a high level "1" when the level of the arc fluctuation detection signal S34 has changed from low level "0" to high level "1", and maintained at the level for a predetermined time interval thereafter. The gain select signal S35 is supplied to a gain setting terminal of the variable gain amplifier 344 in the power supply system 22.

The gain of the variable gain amplifier 377 is set to the lower first gain when the gain select signal S35 goes a low level "0", while to the higher second gain when the gain select signal S35 goes a high level "1". In other words, according to this embodiment, when the absolute value of the difference between the light source drive signal S33 and the illuminance detection signal S31 has exceeded a predetermined value SR1, it is determined that arc fluctuations have started appearing, and the arc fluctuation detection signal 34 is set to a high level "1", and the gain of the variable gain amplifier 377 is set to the higher second gain and maintained at the level for the predetermined time interval thereafter.

Figure 22:
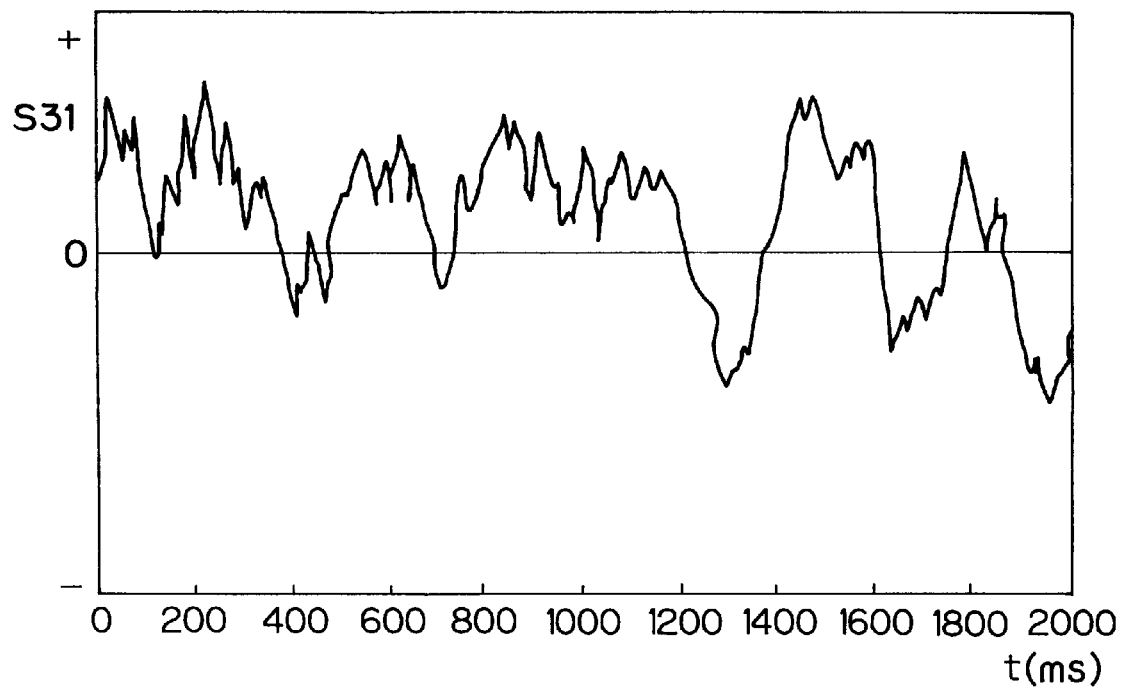
FIG. 22 shows an exemplified waveform of an illuminance detection signal S31 obtained through an integrator sensor when the power supplied to a light source is fixed at a constant level in the exposure control mechanism of FIG. 21.
Figure 23:
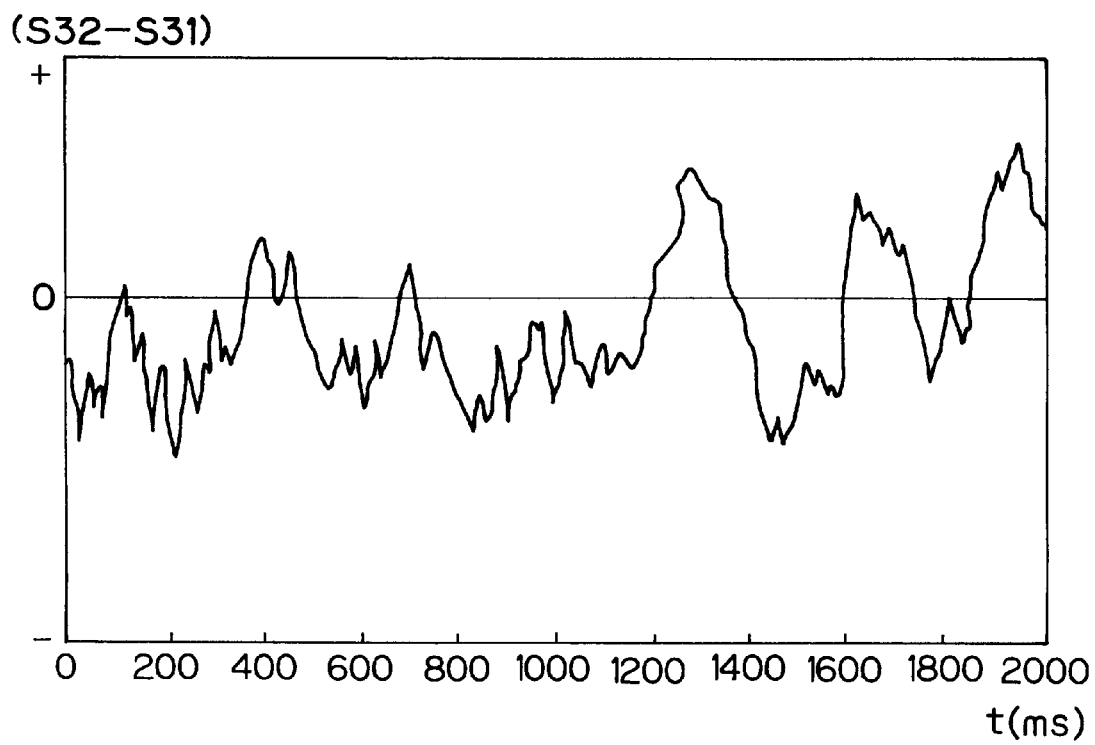
FIG. 23 shows an exemplified waveform of the difference (S32−S31) between a desired illuminance signal S32 and the illuminance detection signal S31 when the illuminance detection signal S21 varies according to the waveform of FIG. 22.
Figure 24A:
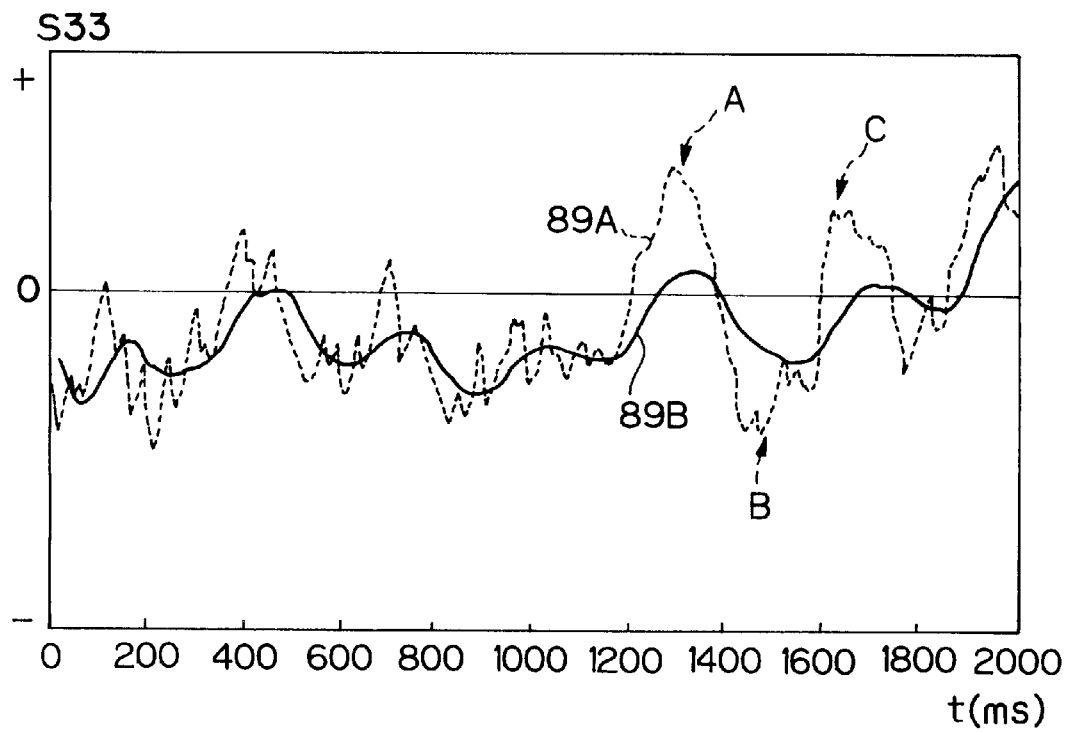
FIG. 24(a) shows the relationship between exemplified waveforms of the difference (S32−S31) and the light source drive signal S33 when a fluctuation detection system is inoperative.
Figure 24B:
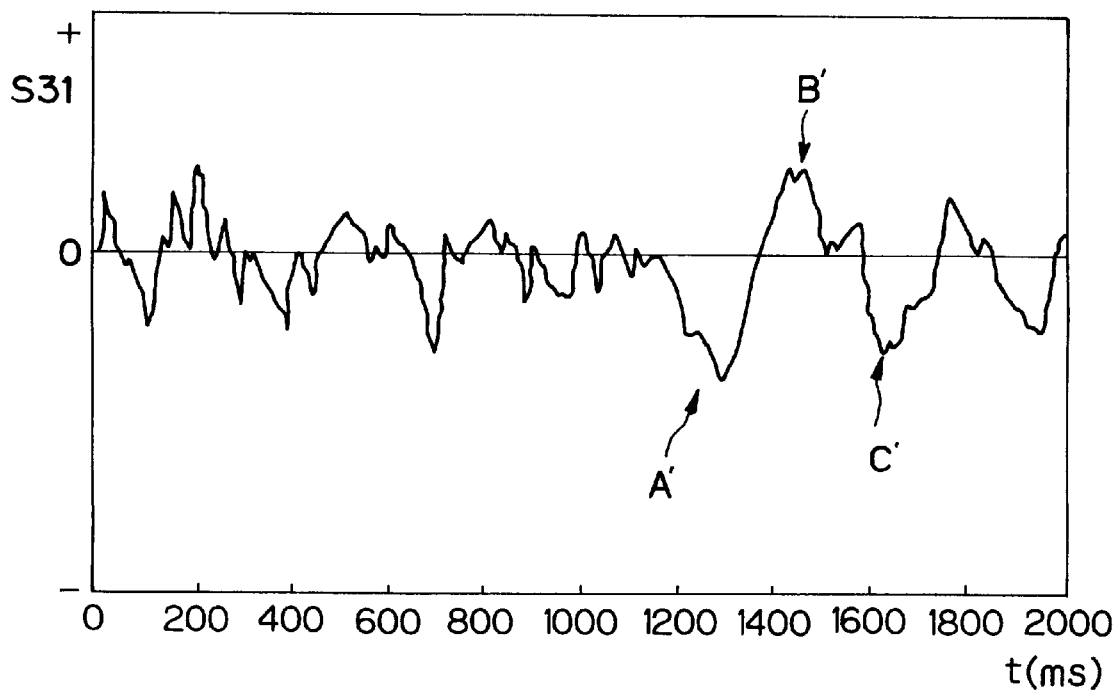
FIG. 24(b) shows an exemplified waveform of the illuminance detection signal S31 experienced when the fluctuation detection system is inoperable and a variable gain amplifier forming a part of a servo-system is driven.

Referring next to FIGS. 22, 23, 24(*a*)–24(*b*) and 25(*a*)–25(*b*), an exemplified exposure control operation performed during the scanning exposure operation according to the present embodiment will be described.

First, in FIG. 20, the main control system 19 supplies the exposure control system 20 with information about the desired accumulated exposure on the wafer W, and in response thereto the exposure control system 20 selects the output luminous power of the mercury-vapor lamp 1, the transmittance to be established by the dimmer plate 23, and other relevant factors. Then, the exposure control system 20 supplies the power supply system 22 with the desired illuminance signal S32 (see FIG. 21) indicating the output luminous power which the mercury-vapor lamp 1 should be driven to generate. Then, the exposure control system 20 operates the shutter control unit 5 to open the shutter 4. In this point of time, however, the wafer W is not exposed since the movable blind 35A, 35B is closed.

Thereafter, the main control system 19 operates the stage control system 46 to start moving the reticle R and the wafer W, and when the velocities of the reticle R and the wafer W reach the desired velocities for scanning, the operation of the movable blind 35A, 35B is controlled to open, and the pattern of the reticle R is serially transferred onto the wafer W and within one of the shot areas on the wafer W to be exposed.

FIG. 22 shows exemplified variations in the illuminance detection signal S31 (see FIG. 21) obtained by amplifying the detection signal produced from the integrator sensor 33 when the mercury-vapor lamp 1 is driven with power at a constant level, i.e., when the variable gain amplifier 377 of FIG. 21 is made inoperative. In FIG. 22, levels of the illuminance detection signal S31 are referenced to a horizontal line designated by 0 (zero), which indicates the level of the desired illuminance signal S32 (see FIG. 21). In this operating condition, as shown, the illuminance detection signal S31 gradually drifts away from the desired value. This drift may be avoided by operating the variable gain amplifier 377.

For this purpose, the exposure control system 20 derives the average value of a number of signal values obtained by continuously sampling the illuminance detection signal S31 at a high sampling frequency, and periodically calculates the illuminance on the wafer W. If the calculated illuminance is deviated from the desired illuminance, the exposure control system 20 corrects the level of the desired illuminance signal S32. In this manner, the exposure operation is performed in constant-illuminance-control mode. In the initial condition, the fluctuation detection system 325 is set inoperative and the gain select signal S35 is set to low level "0". FIG. 23 shows the difference (S32–S31) between the desired illuminance signal S32 and the illuminance detection signal S31 which appears across the inputs of the variable gain amplifier 377 in the power supply system 22 of FIG. 21 when the above operation is performed. The variable gain amplifier 377 generates the light source drive signal S33 with the lower, first gain, in an attempt to reduce the difference to zero. In other words, the output luminous power of the mercury-vapor lamp 1 is controlled in an attempt to reduce the difference to zero. Therefore, the difference (S32–S31) shown in FIG. 23 is also considered as the desired value for the light source drive signal S33.

During the time interval in which the lower gain is used, so-called hunting, or oscillation of the output signal at a high frequency, does not occur, but the phase and the amplitude of the light source drive signal S33 can not precisely follow those of the difference (S32–S31), as shown in FIG. 24(a), due to the delay in the response speed of the variable gain amplifier 377. In FIG. 24(a), a broken line curve 89A represents the desired value for the light source drive signal S33 (the same curve of FIG. 23) and a solid curve 89B represents the actual variation in the light source drive signal S33.

FIG. 24(a) also shows occurrences of arc fluctuations of the mercury-vapor lamp 1 at points A, B and C on the curve 89A, where the difference (S32–S31) is widely deviated from zero level. When the variable gain amplifier 377 is set to have the lower gain, the light source drive signal S33 can not precisely follow the difference (S32–S31) as shown by the solid curve 89B. Arc fluctuations may provide noise components larger than other noises depending on the environment in the space for the arc discharge (such as the state of the convection). Although arc fluctuations provide noise components of relatively low frequencies, the absolute values of the variations in the illuminance caused by arc fluctuations may be relatively large. Further, when arc fluctuations start appearing, the relationship between the power supplied to the mercury-vapor lamp 1 (or the light source drive signal S33) and the illuminance measured by means of the integrator sensor 33 changes, so that the response speed of the servo-system may be lowered. Further, in the case where the variable gain amplifier 344 has its response characteristics optimized with respect to the noises other than the arc fluctuation noises, the ability of the variable gain amplifier 377 to follow the arc fluctuations is deteriorated. Thus, when the variable gain amplifier 377 is operated with the lower gain, no drift of the direct-current component in the resulting illuminance detection signal S31 occurs, but the illuminance detection signal S31 is widely deviated from the desired illuminance signal S32 (=0) at points A', B' and C' which are coincident with the points A, B and C in FIG. 24(a) where arc fluctuations occur.

In an exposure apparatus of the scanning exposure type, as described above, the wafer W is moved with respect to the slit-like exposure field 47 for scanning, during which any fluctuations in illuminance having high frequencies may be averaged to cancel out each other, so that they will not result in any unevenness in the accumulated exposure. In contrast, when arc fluctuations occur, and thereby the deviation of the actual illuminance from the desired illuminance (residual error) varies with low frequencies, the accumulated exposures at some points on the wafer W may not fall into an acceptable range even when the scanning exposure operation is performed.

In order to avoid this, in this embodiment, the fluctuation detection system 325 is operated during the scanning exposure operation, so that the gain select signal S35 is set to high level "1" so as to switch the gain of the variable gain amplifier 377 in the power supply system 22 to the higher second gain. By virtue of this operation of the fluctuation detection system 325, at the points A, B and C in FIG. 24(a) when arc fluctuations occur, the difference between the levels of the light source drive signal S33 and the illuminance detection signal S31 increases, so that the arc fluctuation detection signal S34 is set to high level "1", and thereby the gain select signal S35 is set to high level "1" and maintained at the level for the predetermined time interval thereafter, then, the gain of the variable gain amplifier 377 increases, and the variable gain amplifier 377 starts providing a weak oscillation. The gain is optimized with respect to the characteristics of the arc fluctuation of the mercury-vapor lamp.

Figure 25A:
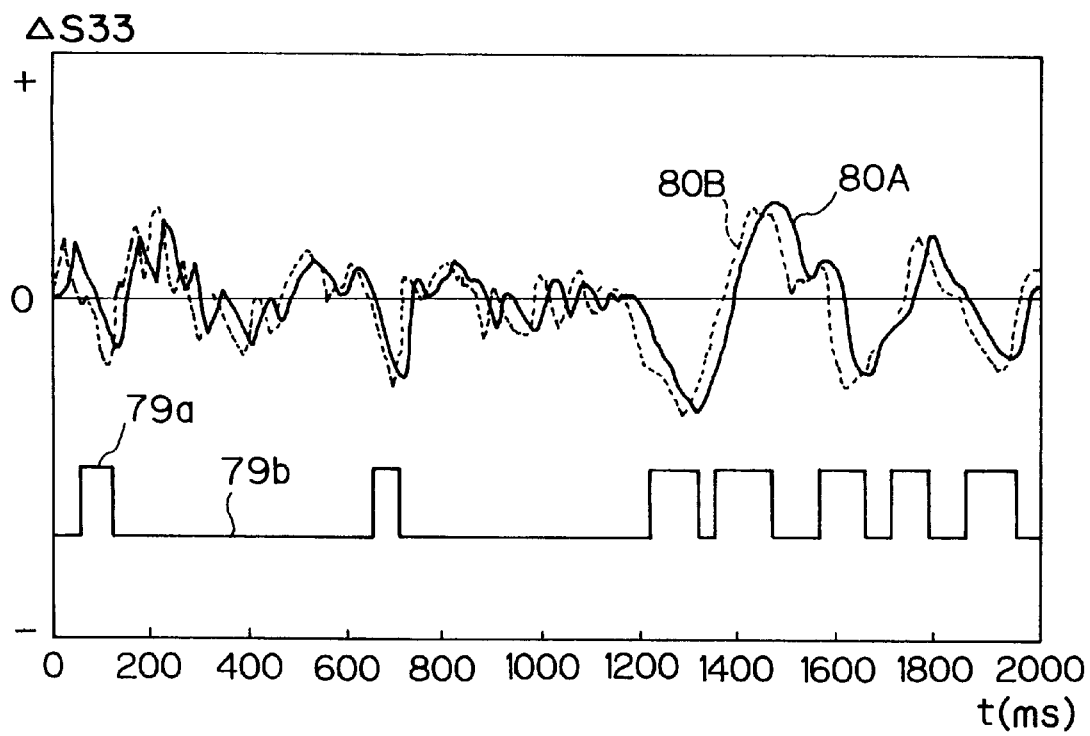
FIG. 25(a) shows a chart showing switching timing of gain of the variable gain amplifier when the fluctuation detection system is operable.

The FIG. 25(a) also shows a rectangular wave train representing how the gain select signal S35 (FIG. 21) changes when the fluctuation detection system 324 responds to the illumination detection signal S31 of FIG. 22. In this rectangular wave train, at portions of a large value 79a, it is recognized that arc fluctuations have started appearing, the gain select signal S35 is set to high level "1", the gain of the variable gain amplifier 377 is increased, while at portions of a small value 79b, it is recognized that an normal condition is established, the gain select signal S35 is set to low level "0", and the gain of the variable gain amplifier 377 is reduced.

Figure 25B:
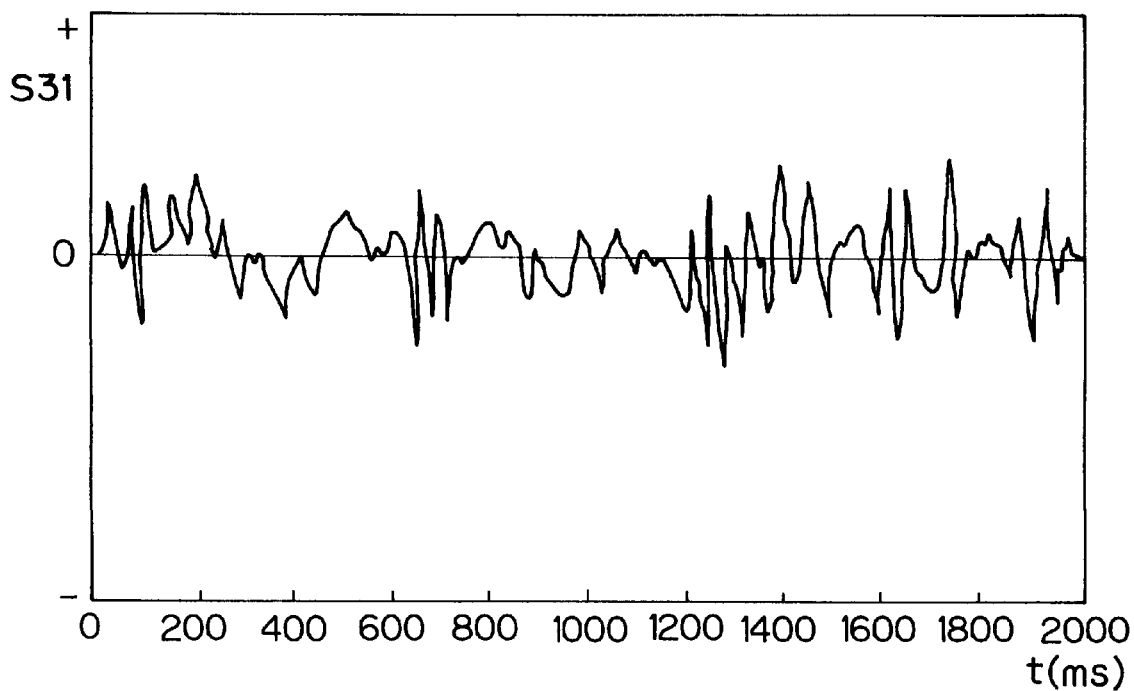
FIG. 25(b) shows an exemplified waveform of the illuminance detection signal S31 experienced when the fluctuation detection system is operable and the variable gain amplifier is driven.

As the result, where an occurrence of arc fluctuations is recognized, the illuminance detection signal S31, which is obtained by amplifying the signal outputted from the integrator sensor 33, varies with a weak oscillation, as shown in FIG. 25(b). However, because any variations in the illuminance having high frequencies are averaged and canceled out in the scanning exposure operation, any unevenness in the accumulated exposure on the wafer W is reduced by virtue of the above, and the accumulated exposure will fall into an acceptable range.

In this manner, according to this embodiment, the gain of the variable gain amplifier 377 is increased when arc fluctuations start appearing, and thereby variations having high frequencies are induced in the illuminance, with the result that reduced unevenness in the accumulated exposure may be achieved by the scanning exposure operation.

In this embodiment, the detection of arc fluctuation is made by comparing the light source drive signal S33 and the illuminance detection signal S31. Alternatively, this detection may be made by smoothing the illuminance detection signal S31 under a certain condition so as to generate a signal S31' corresponding to the signal represented by a solid line 80A in FIG. 25(a). Then, the signal S31' is examined for such a drift in the signal S31' that continues over a predetermined time interval in the positive (+) direction or the negative (−) direction with a gradient whose absolute value exceeds a predetermined value. If such a drift in the signal S31' is found, it can be recognized as an occurrence of arc fluctuations. The gradient in the signal S31' may be determined from the differentiated signal of the signal S31'. In this case, the variation ΔS33 of the corresponding light source drive signal S33 follows as shown by the broken line curve 80B.

Alternatively, an occurrence of arc fluctuations may be determined by extracting any low frequency components of the illuminance detection signal S31 by means of a low-pass filter circuit and detecting when the amplitude of the low frequency components exceeds a predetermined threshold.

In addition, an occurrence of arc fluctuations may be predicted by examining the temperature change of the discharge tube of the mercury-vapor lamp 1, and the gain of the variable gain amplifier 277 based on the prediction. Further, as another method for accounting for the arc fluctuation, other than the method utilizing the control of gain of the variable gain amplifier 377, a method that a predetermined offset is added to the desired illuminance signal S32 may be used.

Further, this embodiment uses a mercury-vapor lamp as the exposure light source; however, the present invention is not limited to the use of a mercury-vapor lamp, but may be applied to the cases where an electric-discharge lamp such as a xenon arc lamp is used as the exposure light source. Moreover, the present invention may be applied to the cases where a laser source such as an excimer laser is used as the exposure light source and a certain phenomenon occurs which varies the relationships between the power supplied to such exposure light source and the actual illuminance.

According to this embodiment, when fluctuations in the illuminance are detected, variations (which may be sinusoidal, for example) are temporally induced in the output power of the exposure light source. In this manner, even when fluctuations appear in the illuminance due to arc fluctuations where a discharge lamp is used as the exposure light source, the average value of the illuminance may be maintained substantially at the level of the desired illuminance. Therefore, by averaging the illuminance through the scanning exposure operation, any unevenness in the accumulated exposure on the photosensitized substrate may be advantageously reduced, and thereby the accumulated exposure can be made to fall into an acceptable range with ease.

Where the illuminance fluctuation detection means comprises photodetector means for detecting the quantity of light of the illumination beam and comparator means for detecting the difference between the output signal of the photodetector means and a signal corresponding to the power supplied to the exposure light source, any illuminance fluctuations such as arc fluctuations may be detected with precision by monitoring that difference.

Where the illuminance fluctuation detection means comprises photodetector means for detecting the quantity of light of the illumination beam and low-pass filter means for extracting any low frequency components of the output signal of the photodetector means, any illuminance fluctuations such as arc fluctuations may be detected with precision by monitoring the output of the filter means.

Where the illuminance control means includes variable gain means for amplifying any variations in the output signal of the exposure measuring means with a certain gain so as to control the output power of the exposure light source and where the gain of the variable gain means is controlled in accordance with the illuminance fluctuations detected by the illuminance fluctuation detection means, a weak oscillation may be induced in the output power of the exposure light source by increasing that gain when illuminance fluctuations occur.

This embodiment is particularly effective where the exposure light source comprises an electric-discharge lamp and the fluctuations in the illuminance of the illumination beam comprise arc fluctuations cased by the fluctuations in the discharge of the electric-discharge lamp. Further, in the case where the exposure light source comprises any other light source such as a laser source and where it tends to produce some fluctuations in the illuminance, this embodiment also provides reduced unevenness in the accumulated exposure resulting from the scanning exposure operation.

Next, an exposure apparatus according to a fifth embodiment of the present invention will be described with reference to the accompanying drawings. This embodiment shows a still further exemplified application of the present invention to a step-and-scan type of projection exposure apparatus.

The projection exposure apparatus of this embodiment has an arrangement similar to that of the projection exposure apparatus of the first embodiment described above with reference to FIG. 1. Therefore, the following description will be referenced to FIG. 1 as well.

In this embodiment, the exposure control system 20 produces a drive signal corresponding to a desired illuminance on the wafer, which signal is supplied to the power supply system 22. The power supply system 22 drives the mercury-vapor lamp 1 so as to cause the detection signal from the integrator sensor 33 to have a value corresponding to the desired illuminance. In this manner, the exposure operation is carried out in constant-illuminance-control mode.

In this embodiment, as with the first embodiment, the photosensitive surface of the integrator sensor 33 is positioned in a plane conjugate to the plane of the pattern bearing surface of the reticle R, so that the detection signal from the integrator sensor 33 will produce no error even when the illumination-system-aperture-stop disk 16 is rotated to replace one illumination-system-aperture-stop with another having a different shape. Alternatively, the photosensitive surface of the integrator sensor 33 may be positioned in an observation plane substantially conjugate to the Fourier transform plane of the pattern bearing surface of the reticle R with respect to the projection optical system PL (i.e., this Fourier transform plane is the pupil plane), so that the entire light rays passing through the observation plane may be received by the integrator sensor 33. In addition, such arrangement may be used in which a lemon skin is positioned in a plane conjugate to the plane of the pattern bearing surface of the reticle R and the output light rays from the lemon skin is relayed to an integrator sensor. This arrangement may advantageously alleviates the problem of heat generation.

This embodiment includes an illuminance unevenness sensor 49, whose arrangement and operation will be described below with reference to FIGS. 26(*a*) and 26(*b*).

Figure 26A:
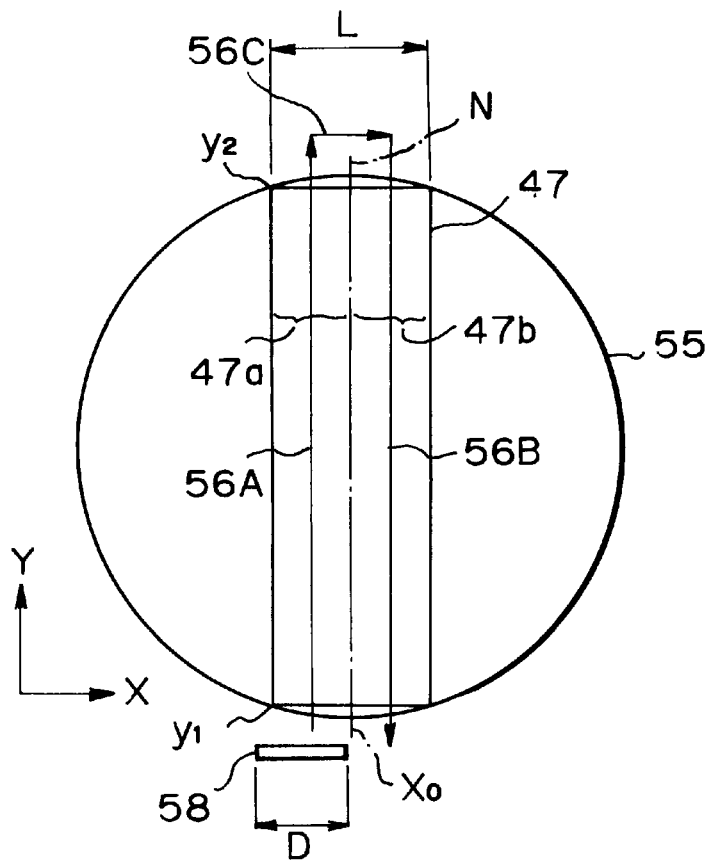
FIG. 26(a) is a schematic representation illustrating a method of measuring illuminance using an illuminance unevenness sensor in the projection exposure apparatus of FIG. 1.
Figure 26B:
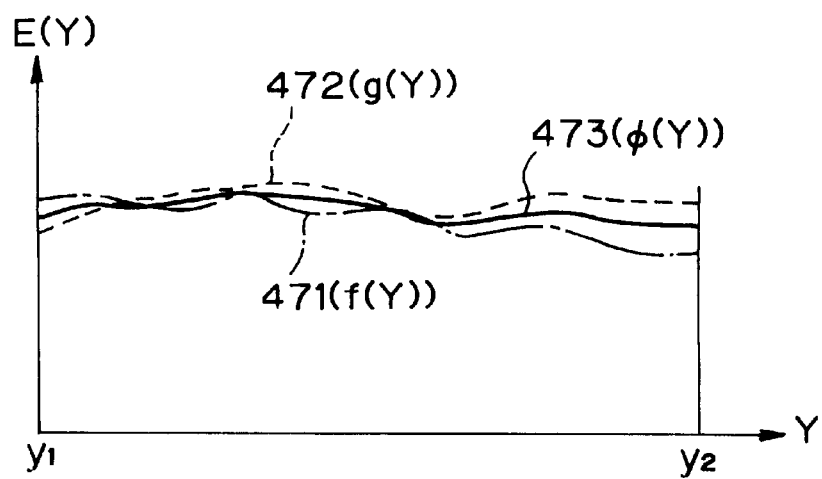
FIG. 26(b) shows exemplified illumination distributions obtained by the measuring method of FIG. 26(a)

FIG. 26(*a*) show a chart for illustrating the operation of the illuminance unevenness sensor 49. As shown, the illuminance unevenness sensor 49 has a photosensitive area 58 defined to be of a slit-like, elongate rectangular shape extending in the scanning direction (the X-direction). The photosensitive area 58 has a length (size in the scanning direction) D defined to satisfy the following relationship with the width (size in the scanning direction) L of the exposure field 47. Note that the exposure field 47 is of a slit-like, elongate rectangular shape extending in the non-scanning direction (the Y-direction) and substantially inscribed in a circle 55 defining the effective exposure field of the projection optical system PL. The relationship is:

$$\alpha < D < L \qquad (10)$$

where:

α stands for the width of the vignetting periphery along the leading and trailing edges of the exposure field 47.

The width α of the vignetting periphery depends on the amount of defocusing of the fixed blind 37 on FIG. 1. It is assumed here that α=L/10, as an example.

Figure 27:
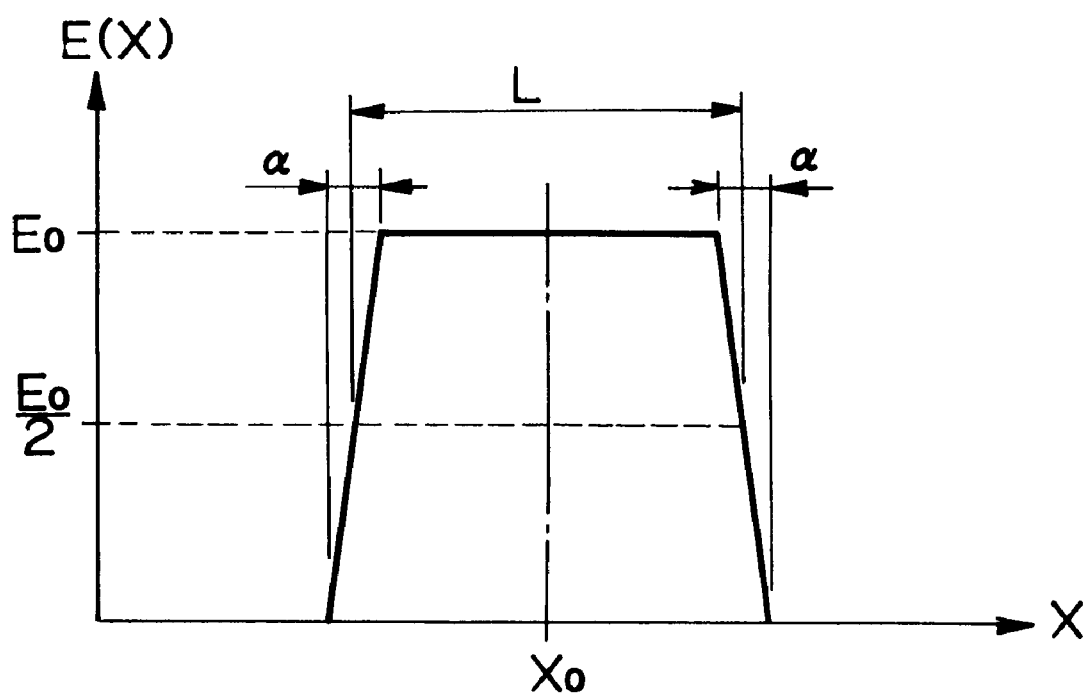
FIG. 27 is a schematic representation illustrating illumination distributions inside exposure fields of FIGS. 26(a) and 26(b) in the scanning direction.
Figure 28A:
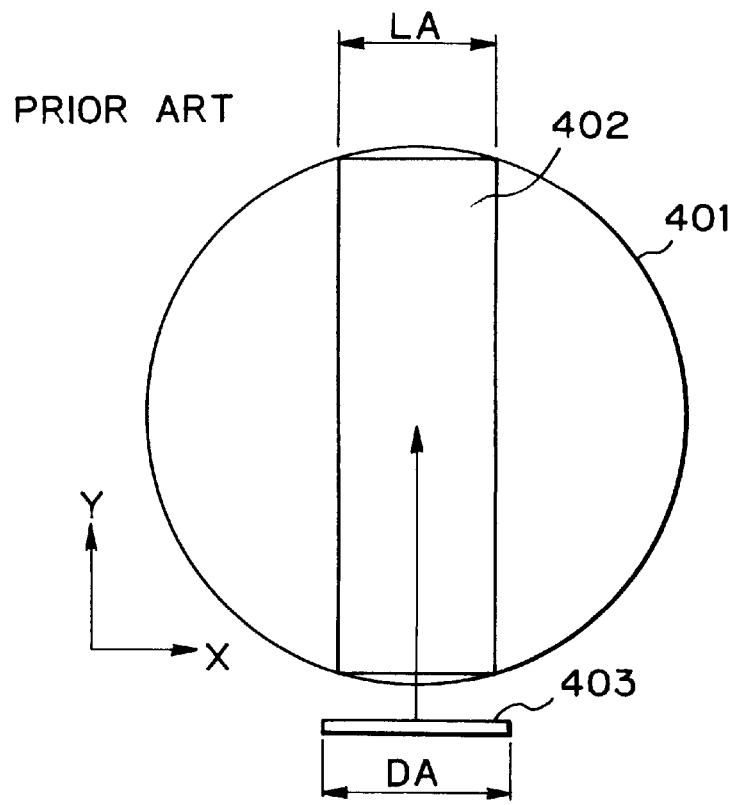
FIG. 28(a) is a schematic representation illustrating an exemplified measuring method using a conventional illuminance unevenness sensor with a long, slit-like photosensitive area of a slit-like, and FIG. 28(b) is a schematic representation illustrating an exemplified measuring method using a conventional illuminance unevenness sensor with a pinhole-like photosensitive area.
Figure 28B:
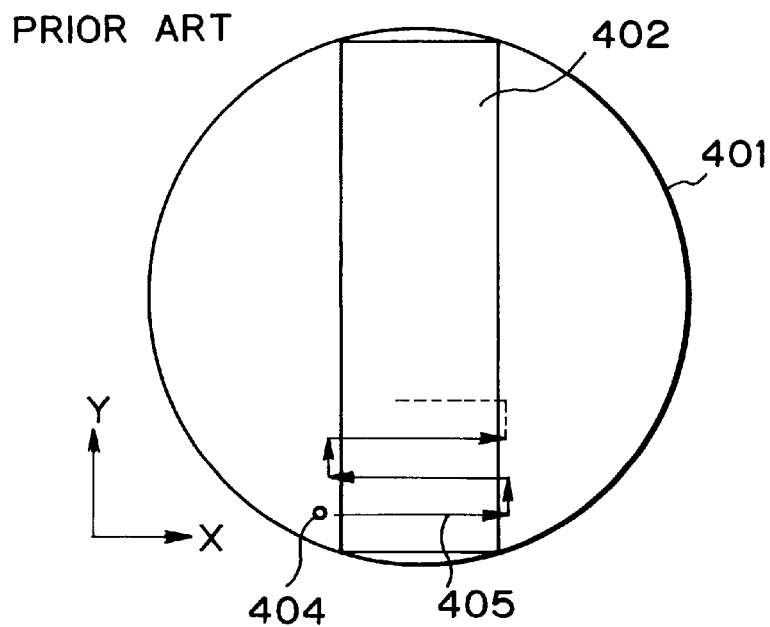

FIG. 27 shows the illuminance distribution E(X) inside the slit-like exposure field 47 of FIG. 26 along a line extending in the scanning direction (the X-direction). As shown in FIG. 27, the illuminance distribution E(X) is substantially of a trapezoid shape. The distance between the two points at which the illuminance E(X) is equal to one half of the maximum illuminance $E_0$ is the width L of the exposure field 47 in the scanning direction. The slant portions of the illuminance distribution curve, corresponding to the leading and trailing edges of the exposure field 47, each represents the vignetting periphery along the corresponding edge. The width of each slant portion is represented by α, as described above. The width of the exposure field 47 including the vignetting periphery equals (L+α), accordingly.

This embodiment provides a method of measuring unevenness in the illuminance, in which the exposure field 47 is divided into a plurality of sub-fields arranged side by side in the scanning direction, and the slit-like photosensitive area of the sensor is scanned in the non-scanning direction to measure the illuminance inside each sub-field, wherein the measurement is performed without any overlapping between the scanned areas. Therefore, the width D of the photosensitive area of the sensor is defined to fall in the range expressed by equation (10) above, as well as to allow the measurement of the illuminance of the sub-fields with substantially the same condition.

In this embodiment, the exposure field 47 is divided into two sub-fields, unevenness in the illuminance in each sub-field is measured, and the illumination unevenness in the exposure field 47 is determined based on the measurements. The width D of the photosensitive area 58 is defined to be slightly larger than (L+α)/2, accounting for the width α of the vignetting periphery of the exposure field 47.

Referring again to FIG. 26(*a*), the two sub-fields are defined by dividing the exposure field 47 by a dividing line N passing through a midpoint (having the X-coordinate of $x_0$) of the exposure field 47 in the scanning direction (the X-direction) are referred to as the exposure sub-fields and designated by 47*a* and 47*b*. First, measurement of the illumination unevenness is performed on the exposure sub-field 47*a*. First, the wafer stage 48 is moved for positioning the photosensitive area 58 of the sensor such that the right-hand edge of the photosensitive area 58 is coincident with the dividing line N. This ensures that the photosensitive area 58 will never extend into the other exposure sub-field 47*b*. Then, the wafer stage 48 is moved in the non-scanning direction, such that the photosensitive area 58 of the sensor scans the exposure sub-field 47*a*, in the non-scanning direction, along an arrow 56A in FIG. 26(*a*), from the position $y_1$ which is on the −Y-direction most edge (bottom edge in the figure) of the exposure sub-field 47*a*. During this scan, the output signal of the illuminance unevenness sensor 49 is sampled at positions distant from each other in the Y-direction with constant interval, so as to obtain the illuminance measurements. Alternatively, this sampling may be made at a constant time interval.

When the photosensitive are 58 of the sensor reaches the position $y_2$ which is on the +Y-direction most edge (top edge in the figure) of the exposure sub-field 47*a* and thus the scan of the exposure sub-field 47*a* has been completed, then the photosensitive area 58 is in the scanning direction along an arrow 56C into a starting position for the scan of the other exposure sub-field 47*b*, and the scan of the exposure sub-field 47*b* for the illuminance measurement is started. Again, as with the exposure sub-field 47*a*, the wafer stage 48 is moved for positioning the photosensitive area 58 such that the left-hand edge of the photosensitive area 58 is coincident with the dividing line N. This ensures that the photosensitive area 58 will never extend into the other exposure sub-field 47*a*. Then, the photosensitive area 58 is scanned in the non-scanning direction along an arrow 56B shown in the figure so as to make illumination measurements at a predetermined pitch in the Y-direction. The measurements produced from the illuminance unevenness sensor 49 are supplied to the main control system 19 and used to determine the illuminance unevenness. The illuminance unevenness sensor generates heat after illuminated for a long time, and may produce a drift in its sensitivity. Accordingly, it is recommendable that the sensor should be cooled and/or the scans of the exposure sub-fields 47*a* and 47*b* by the photosensitive area 58 should be made in the same direction, so as to reduce the influence of the heat.

FIG. 26(*b*) shows a chart representing the illuminance distribution measured by means of the illuminance unevenness sensor 49, in which the abscissa indicates positions in the Y-direction and the ordinate indicates illuminances E(Y). In FIG. 26(*b*), an output curve 471 shown by a dot-and-dash line represents the illuminance distribution in the non-scanning direction (the Y-direction) measured in the exposure sub-field 47*a*, and an output curve 472 shown by a broken line represents the illuminance distribution in the non-scanning direction measured in the exposure sub-field 47*b*. The illuminances E(Y) of the output curves 471 and 472 are functions of the position Y in the non-scanning direction, and thus they are designated as f(Y) and g(Y), respectively. An output curve 473 shown by a solid line represents the average value of output lines 471 and 472, and is designated as an illuminance function φ(Y) which is calculated by the equation: φ(Y)=(f(Y)+g(Y))/2. The illuminance unevenness of the entire exposure field 47 in the non-scanning direction. The required calculations for the above operation are performed by the main control system 19, which uses the calculation results to operate the exposure control system 20 so as to control the output power of the mercury-vapor lamp 1, the degree of opening of the dimmer plate 23 and the degree of opening of the variable stop 10.

The difference (f(Y)−g(Y)) between the illuminances of the two output curves 471, 472 is primarily due to the difference between the shapes of the edges of the fixed blind 37. As seen from the measurement results shown in FIG. 26(*b*), there is a relation f(Y)<g(Y) over the entire positional range in the non-scanning direction except for a small portion near the position $y_1$. This indicates that it is necessary to correct the shape of the upper edge (as seen in FIG. 1) of the fixed blind 37. If there are any portions between the positions $y_1$ and $y_2$ where illuminance is significantly reduced, they are indicative of the conditions of the corresponding portions of the fixed blind 37, and thus, any necessary correction of the edge(s) may be made based on such information. In the past, since the illuminance distribution of the exposure field 47 is measured through a single pass scan of measurement, it can not be determined whether a portion with an abnormal illuminance level (such as an abnormally reduced illuminance level) is due to a defect in the upper edge or one in the lower edge of the fixed blind. In contrast, according to this embodiment, the exposure field 47 is divided into sub-fields arranged side by side in the scanning direction and the illuminance is measured with respect to each of the sub-fields. By virtue of this, if a portion with an abnormal illuminance level is found, it can be determined what portion of the fixed blind 37 has a defective shape of edge causing that portion to have the abnormal illuminance level.

As described above, according to the exposure apparatus of this embodiment, the illuminance distribution may be detected by scanning the exposure field 47 in the non-scanning direction a plurality of times by the illuminance unevenness sensor 49 having the slit-like photosensitive area 58 whose length is shorter than the width of the exposure field 47 in the non-scanning direction, so that the effect of the sensitivity unevenness of the photoelectric conversion device is reduced, and a faster process speed is obtained than any conventional illuminance unevenness sensor with a pinhole-like photosensitive area is used. Further, this embodiment provides an advantage that it requires no large space on the wafer stage, which was required by a conventional illumination unevenness sensor having a slit-like photosensitive area which is longer than the width of the exposure field in the scanning direction. In addition to the higher process speed and the no requirement of a large space on the wafer stage, this embodiment is has a further advantage that the conditions of the edges of the fixed blind 37 defining the width of the exposure field by be detected. Thus, it facilitates a quick settlement of the problem of the illuminance unevenness.

According to the exposure apparatus of this embodiment, the photosensitive area of the photodetector means is smaller than that of a conventional photodetector spanning the entire width of the exposure field in the scanning direction, so that the space for the photodetector means may be reduced, and the effect of the sensitivity unevenness is also reduced. Further, it provides an advantage that the measurement time may be reduced in comparison with a conventional technique using a photodetector with a pinhole-like photosensitive area.

When the slit-like photosensitive area of the photodetector means has a length which is greater than the width of the vignetting periphery of the exposure area, the conditions of the vignetting periphery may be grasped with precision, so that the conditions of the field stop which limits the illumination area may be detected, for example.

Various modifications of the above-described embodiments of the invention will be apparent to those skilled in the art, and it is to be understood that such modifications can be made without departing from the scope of the present invention, if they are within the spirit and the tenor of the accompanying claims.

What is claimed is:

1. An exposure apparatus which illuminates a mask with an illumination beam from a light source through a condensing optical system and exposes a photosensitive substrate with the illumination beam through the mask, comprising:

a first optical integrator disposed between said light source and said condensing optical system;

a second optical integrator disposed between said first optical integrator and said condensing optical system;

a first adjustment device disposed between said light source and said condensing optical system to adjust at least one of the extent and the shape of a region through which said illumination beam passes at an exit side of said second optical integrator;

a second adjustment device disposed between said light source and said second optical integrator to adjust the extent of an illumination field on an entrance surface of said second optical integrator; and said second optical integrator comprising a first group of lens elements defining the entrance side of said second optical integrator and a second group of lens elements defining the exit side of said second optical integrator, each of said first group of lens elements and each of said second group of lens elements having different cross-sectional shapes from one another.

2. An apparatus according to claim 1, further comprising a field stop disposed between said second optical integrator and said condensing optical system to define an illumination area on said mask illuminated with said illumination beam, wherein each cross-sectional shape of said first group of lens elements is substantially similar to the shape of said illumination area.

3. An apparatus according to claim 2, further comprising:

a stage system by which said mask is moved in synchronization with said photosensitized substrate so that said photosensitized substrate is exposed with said illumination beam, said field stop defining said illumination area which has a slit-like shape.

4. An apparatus according to claim 1, wherein a size of each of said second group of lens elements is determined to substantially include a plurality of images of said light source formed by said first optical integrator.

5. An apparatus according to claim 1, wherein said first adjustment mechanism has a plurality of field stops which have a size and a shape at least one of which is different from one another and one field stop selected from said plurality of field stops is disposed to be close to an exit surface of said second optical integrator.

6. An apparatus according to claim 1, wherein said second adjustment mechanism has a plurality of lens elements having different powers and one lens element selected from said plurality of lens elements is disposed between said first optical integrator and said second optical integrator.

7. An apparatus according to claim 1, further comprising a drive system which is connected to said second optical integrator so that said first and second lens elements groups are moved relative to one another.

8. An apparatus according to claim 1, further comprising a third adjustment mechanism which is disposed between said light source and said second optical integrator so that a quantity of light of said illumination beam which enters said second optical integrator is adjusted.

9. An apparatus according to claim 8, wherein said third adjustment mechanism includes a field stop which is disposed between said first optical integrator and said second optical integrator.

* * * * *

UNITED STATES PATENT AND TRADEMARK OFFICE
CERTIFICATE OF CORRECTION

PATENT NO. : 6,002,467
DATED : December 14, 1999
INVENTOR(S) : Kenji Nishi

It is certified that error appears in the above-identified patent and that said Letters Patent is hereby corrected as shown below:

<u>Title page,</u>
Amend title page as follows:
-- Item [75]:
Change "Inventors: Kenji Nishi; Takuzo Kashima, both of Kanagawa-ken; Toshihiko Tsuji, Chiba-Ken, all of Japan" to -- Inventor: Kenji Nishi of Kanagawa-ken, Japan --.

Signed and Sealed this

Fourth Day of June, 2002

*Attest:*

JAMES E. ROGAN
*Attesting Officer*   *Director of the United States Patent and Trademark Office*